US009929376B2

(12) United States Patent
Mizutani et al.

(10) Patent No.: US 9,929,376 B2
(45) Date of Patent: Mar. 27, 2018

(54) LAMINATE, KIT FOR MANUFACTURING ORGANIC SEMICONDUCTOR, AND RESIST COMPOSITION FOR MANUFACTURING ORGANIC SEMICONDUCTOR

(71) Applicant: FUJIFILM Corporation, Tokyo (JP)

(72) Inventors: Kazuyoshi Mizutani, Shizuoka (JP); Yu Iwai, Shizuoka (JP); Ichiro Koyama, Shizuoka (JP); Yoshitaka Kamochi, Shizuoka (JP)

(73) Assignee: FUJIFILM Corporation, Tokyo (JP)

(*) Notice: Subject to any disclaimer, the term of this patent is extended or adjusted under 35 U.S.C. 154(b) by 24 days.

(21) Appl. No.: 15/139,989

(22) Filed: Apr. 27, 2016

(65) Prior Publication Data

US 2016/0240816 A1 Aug. 18, 2016

Related U.S. Application Data

(63) Continuation of application No. PCT/JP2014/078698, filed on Oct. 29, 2014.

(30) Foreign Application Priority Data

Oct. 31, 2013 (JP) ................................ 2013-227037

(51) Int. Cl.

| | |
|---|---|
| ***H01L 51/52*** | (2006.01) |
| ***G03F 7/038*** | (2006.01) |
| ***G03F 7/039*** | (2006.01) |
| ***G03F 7/11*** | (2006.01) |
| ***B32B 27/08*** | (2006.01) |
| ***H01L 51/42*** | (2006.01) |
| ***H01L 51/44*** | (2006.01) |
| ***G03F 7/004*** | (2006.01) |
| ***G03F 7/32*** | (2006.01) |

(52) U.S. Cl.

CPC .......... *H01L 51/5253* (2013.01); *B32B 27/08* (2013.01); *G03F 7/0045* (2013.01); *G03F 7/038* (2013.01); *G03F 7/039* (2013.01); *G03F 7/0382* (2013.01); *G03F 7/0392* (2013.01); *G03F 7/0397* (2013.01); *G03F 7/11* (2013.01); *G03F 7/325* (2013.01); *H01L 51/4253* (2013.01); *H01L 51/448* (2013.01); *B32B 2307/4026* (2013.01); *B32B 2307/54* (2013.01); *B32B 2457/00* (2013.01); *B32B 2457/14* (2013.01); *Y02E 10/549* (2013.01); *Y02P 70/521* (2015.11)

(58) Field of Classification Search

None

See application file for complete search history.

(56) References Cited

U.S. PATENT DOCUMENTS

| | | | |
|---|---|---|---|
| 7,195,858 | B2 | 3/2007 | Arao et al. |
| 2004/0219451 | A1 | 11/2004 | Arao et al. |
| 2008/0286687 | A1 | 11/2008 | Endo et al. |
| 2011/0300484 | A1 | 12/2011 | Yamato et al. |
| 2012/0214100 | A1 | 8/2012 | Kobayashi et al. |
| 2013/0034706 | A1 | 2/2013 | Yamaguchi |
| 2013/0071789 | A1 | 3/2013 | Iwashita et al. |
| 2015/0221881 | A1 | 8/2015 | Iwai et al. |

FOREIGN PATENT DOCUMENTS

| | | | |
|---|---|---|---|
| JP | 2004-240213 | A | 8/2004 |
| JP | 2006-041317 | A | 2/2006 |
| JP | 2011-197587 | A | 10/2011 |
| JP | 2011-254091 | A | 12/2011 |
| JP | 2012-505926 | A | 3/2012 |
| JP | 2013-047783 | A | 3/2013 |
| JP | 2013-145255 | A | 7/2013 |
| KR | 10-2008-0107661 | A | 12/2008 |
| KR | 10-2011-0074774 | A | 7/2011 |
| WO | 2010/046240 | A1 | 4/2010 |
| WO | 2014/061708 | A1 | 4/2014 |

OTHER PUBLICATIONS

Office Action dated Mar. 3, 2017, issued by the Korean Intellectual Property Office in corresponding Korean Application No. 10-2016-7010908.

International Search Report of PCT/JP2014/078698 dated Jan. 27, 2015.

Written Opinion of PCT/JP2014/078698 dated Jan. 27, 2015.

International Preliminary Report on Patentability dated May 12, 2016 from the International Bureau issued in counterpart International Application No. PCT/JP2014/078698.

Extended European Search Report dated Oct. 21, 2016 from the European Patent Office in counterpart European Application No. 14857368.6.

Office Action dated Dec. 27, 2016, from the Japanese Patent Office in counterpart Japanese Application No. 2013-227037.

Office Action dated Sep. 29, 2017 from the Korean Intellectual Property Office in counterpart Korean Application No. 10-2016-7010908.

Office Action dated Jan. 16, 2018 in Taiwan Application No. 103136994.

*Primary Examiner* — Michelle Mandala

(74) *Attorney, Agent, or Firm* — Sughrue Mion, PLLC

(57) ABSTRACT

Provided are a laminate which is capable of forming an excellent organic semiconductor pattern, a kit for manufacturing an organic semiconductor, which is used to manufacture such a laminate, and a resist composition for manufacturing an organic semiconductor, which is used for the kit for manufacturing an organic semiconductor.

The laminate includes an organic semiconductor film, a protective film on the organic semiconductor film, and a resist film on the protective film, in which the resist film is formed of a photosensitive resin composition that contains a photoacid generator (A) which generates an organic acid of which a pKa of the generated acid is −1 or less and a resin (B) which reacts with an acid generated by the photoacid generator so that the rate of dissolution in a developer containing an organic solvent is decreased.

9 Claims, No Drawings

LAMINATE, KIT FOR MANUFACTURING ORGANIC SEMICONDUCTOR, AND RESIST COMPOSITION FOR MANUFACTURING ORGANIC SEMICONDUCTOR

CROSS-REFERENCE TO RELATED APPLICATIONS

This application is a Continuation of PCT International Application No. PCT/JP2014/078698 filed on Oct. 29, 2014, which claims priority under 35 U.S.C. § 119(a) to Japanese Patent Application No. 2013-227037 filed on Oct. 31, 2013. Each of the above application(s) is hereby expressly incorporated by reference, in its entirety, into the present application.

BACKGROUND OF THE INVENTION

1. Field of the Invention

The present invention relates to a laminate, a kit for manufacturing an organic semiconductor, and a resist composition for manufacturing an organic semiconductor. Specifically, the present invention relates to a laminate including an organic semiconductor film, a protective film, and a resist film in manufacture of an organic semiconductor, a kit for manufacturing an organic semiconductor which is used to manufacture such a laminate, and a resist composition for manufacturing an organic semiconductor which is used for the kit for manufacturing an organic semiconductor.

2. Description of the Related Art

In recent years, electronic devices using an organic semiconductor have been widely used. An organic semiconductor has an advantage that it can be manufactured by a simpler process than that of a device using an inorganic semiconductor such as silicon of the related art. In addition, it is considered that material characteristics can be easily changed by changing the molecular structure, the variations of materials are abundant, and functions or elements which have not been obtained by an inorganic semiconductor can be realized. For example, an organic semiconductor can be applied to electronic devices such as an organic solar cell, an organic electroluminescence device, an organic light detector, an organic field effect transistor, an organic electroluminescence light emitting device, a gas sensor, an organic rectifier device, an organic inverter, and an information recording device.

Patterning of an organic semiconductor has been performed using printing technology, but there is a limit to fine processing when the patterning is performed using printing technology. Further, the organic semiconductor tends to be easily damaged.

JP2006-41317A discloses a method of patterning an organic semiconductor layer including: a process of forming an organic semiconductor layer; a process of laminating-and forming a protective layer that protects the organic semiconductor layer from a mask layer on the organic semiconductor layer; a process of laminating and forming the mask layer having a predetermined pattern on the protective layer; and a process of patterning the protective layer and the organic semiconductor layer to have the same shape by performing etching that makes the mask layer into a mask, in which the material of the organic semiconductor layer is different from that of the mask layer, and the protective layer is formed by an organic polymer compound having hydrophilicity or an insulating inorganic compound.

SUMMARY OF THE INVENTION

Here, JP2006-41317A has been examined by the present inventors, and it was found that the mask layer still remains as the protective film after the patterning is finished according to this method.

The present invention has been made to solve the above-described problem and an object thereof is to provide a laminate which is capable of forming an excellent organic semiconductor pattern, a kit for manufacturing an organic semiconductor which is used to manufacture such a laminate, and a resist composition for manufacturing an organic semiconductor which is used for the kit for manufacturing an organic semiconductor.

As a result of intensive research, the present inventors found that patterning can be performed without damaging an organic semiconductor by forming a protective film and a resist film formed of a photosensitive resin composition on one surface of an organic semiconductor film in this order and performing dry etching after the resist film is patterned, thereby completing the present invention.

Specifically, the above-described problem has been solved by the following means <1> or preferably by <2> to <25>.

<1> A laminate comprising: an organic semiconductor film; a protective film on the organic semiconductor film; and a resist film on the protective film, in which the resist film is formed of a photosensitive resin composition that contains a photoacid generator (A) which generates an organic acid of which a pKa of the generated acid is −1 or less and a resin (B) which reacts with an acid generated by the photoacid generator so that the rate of dissolution in a developer containing an organic solvent is decreased.

<2> The laminate according to <1>, in which the photoacid generator (A) includes at least one selected from sulfonic acid, trialkyl sulfonyl methide acid, and dialkyl sulfonylimide acid.

<3> The laminate according to <1> or <2>, in which the photoacid generator (A) includes a compound having an oxime sulfonate group and/or an imide sulfonate group.

<4> The laminate according to <1> or <2>, in which the photoacid generator (A) includes a compound having a sulfonium cation and/or an iodonium cation.

<5> The laminate according to <1> to <2>, in which the photoacid generator (A) includes a diazodisulfone compound and/or a disulfone compound.

<6> The laminate according to any one of <1> to <5>, in which the protective film includes a water-soluble resin.

<7> The laminate according to any one of <1> to <6>, in which the polarity of the photosensitive resin composition is changed due to a generated acid that is generated by the photoacid generator (A) so that the rate of dissolution in a developer containing an organic solvent is decreased.

<8> The laminate according to any one of <1> to <7>, in which a cross-linking reaction occurs in the resin (B) of the photosensitive resin composition due to a generated acid that is generated by the photoacid generator (A) so that the rate of dissolution in the developer containing an organic solvent is decreased.

<9> The laminate according to any one of <1> to <8>, in which the photosensitive resin composition includes a sensitizing dye which spectrally sensitizes the photoacid generator (A).

<10> A kit for manufacturing an organic semiconductor comprising: a resist composition for manufacturing an organic semiconductor which includes a photoacid generator (A) that generates an organic acid of which a pKa of the generated acid is −1 or less and a resin (B) that reacts with an acid generated by the photoacid generator so that the rate of dissolution in a developer containing an organic solvent is decreased; and a composition for forming a protective film which includes a water-soluble resin.

<11> The kit for manufacturing an organic semiconductor according to <10>, in which the photoacid generator (A) includes at least one selected from sulfonic acid, trialkyl sulfonyl methide acid, and dialkyl sulfonylimide acid.

<12> The kit for manufacturing an organic semiconductor according to <10> or <11>, in which the photoacid generator (A) includes a compound having an oxime sulfonate group and/or an imide sulfonate group.

<13> The kit for manufacturing an organic semiconductor according to <10> or <11>, in which the photoacid generator (A) includes a compound having a sulfonium cation and/or an iodonium cation.

<14> The kit for manufacturing an organic semiconductor according to <10> or <11>, in which the photoacid generator (A) includes a diazodisulfone compound and/or a disulfone compound.

<15> The kit for manufacturing an organic semiconductor according to any one of <10> to <14>, in which the polarity of the resist composition for manufacturing an organic semiconductor is changed due to an acid generated by the photoacid generator (A) so that the rate of dissolution in a developer containing an organic solvent is decreased.

<16> The kit for manufacturing an organic semiconductor according to any one of <10> to <15>, in which a cross-linking reaction occurs in the resin (B) of the photosensitive resin composition due to an acid generated by the photoacid generator (A) so that the rate of dissolution in the developer containing an organic solvent is decreased.

<17> The kit for manufacturing an organic semiconductor according to any one of <10> to <16>, further comprising a sensitizing dye which spectrally sensitizes the photoacid generator (A).

<18> A resist composition for manufacturing an organic semiconductor comprising: a photoacid generator (A) that generates an organic acid of which a pKa of the generated acid is −1 or less; and a resin (B) that reacts with an acid generated by the photoacid generator so that the rate of dissolution in a developer containing an organic solvent is decreased.

<19> The resist composition for manufacturing an organic semiconductor according to <18>, in which the photoacid generator (A) includes at least one selected from sulfonic acid, trialkyl sulfonyl methide acid, and dialkyl sulfonylimide acid.

<20> The resist composition for manufacturing an organic semiconductor according to <18> or <19>, in which the photoacid generator (A) includes a compound having an oxime sulfonate group and/or an imide sulfonate group.

<21> The resist composition for manufacturing an organic semiconductor according to <18> or <19>, in which the photoacid generator (A) includes a compound having a sulfonium cation and/or an iodonium cation.

<22> The resist composition for manufacturing an organic semiconductor according to <18> or <19>, in which the photoacid generator (A) includes a diazodisulfone compound and/or a disulfone compound.

<23> The resist composition for manufacturing an organic semiconductor according to any one of <18> to <22>, in which the polarity of the resist composition for manufacturing an organic semiconductor is changed due to an acid generated by the photoacid generator (A) so that the rate of dissolution in a developer containing an organic solvent is decreased.

<24> The resist composition for manufacturing an organic semiconductor according to any one of <18> to <23>, in which a cross-linking reaction occurs in the resin (B) of the photosensitive resin composition due to an acid generated by the photoacid generator (A) so that the rate of dissolution in the developer containing an organic solvent is decreased.

<25> The resist composition for manufacturing an organic semiconductor according to any one of <18> to <24>, further comprising a sensitizing dye which spectrally sensitizes the photoacid generator (A).

According to the present invention, it is possible to provide a laminate which is capable of forming an excellent organic semiconductor pattern, a kit for manufacturing an organic semiconductor which is used to manufacture such a laminate, and a resist composition for manufacturing an organic semiconductor which is used for the kit for manufacturing an organic semiconductor.

DESCRIPTION OF THE PREFERRED EMBODIMENTS

The constituent elements in the present invention described below will be described based on representative embodiments of the present invention, but the present invention is not limited to such embodiments.

In regard to notation of a group (atomic group) in the present specification, in a case where it is not noted whether a group includes a substituent or not, it means that a group with a substituent and a group without a substituent are both included. For example, when an "alkyl group" is noted, an alkyl group without a substituent (unsubstituted alkyl group) as well as an alkyl group with a substituent (substituted alkyl group) are included.

In addition, "active rays" in the present specification mean, for example, a line spectrum of a mercury lamp, far-ultraviolet rays represented by an excimer laser, extreme ultraviolet rays (EUV light), X-rays, and electron beams. In addition, the light in the present invention indicates active rays or radiation. Further, "exposure to light" in the present specification, unless otherwise specified, includes not only exposure to a mercury lamp, far-ultraviolet rays represented by excimer laser, X-rays, or EUV light but also drawings using particle beams such as electron beams or ion beams.

The numerical ranges expressed using "to" in the present specification indicate the ranges including the numerical values described before and after "to" as the lower limits and the upper limits.

Moreover, in the present specification, "(meth)acrylate" indicates both or one of acrylate and methacrylate, "(meth) acryl" indicates both or one of acryl and methacryl, and "(meth)acryloyl" indicates both or one of acryloyl and methacryloyl.

"Processes" in the present specification include not only independent processes but also processes whose intended actions are achieved even in a case where the processes cannot be precisely distinguished from other processes.

The concentration of the solid content in the present specification indicates a weight percentage of a weight of other components from which a solvent is removed to the total weight of a composition. The solid concentration indicates the concentration at 25° C. unless otherwise noted.

In the present specification, the weight average molecular weight is defined as a value obtained by GPC measurement in terms of polystyrene. In the present specification, a weight average molecular weight (Mw) and a number average molecular weight (Mn) can be acquired, for example, using an HLC-8220 (manufactured by TOSOH CORPORATION), and a TSKgel Super AWM-H (6.0 mm ID×15.0 cm manufactured by TOSOH CORPORATION) as a column. The measurement is carried out using 10 mmoL/L lithium bromide NMP (N-methylpyrrolidinone) solution as an eluent unless otherwise noted.

<Laminate>

A laminate of the present invention includes an organic semiconductor film; a protective film on the organic semiconductor film; and a resist film on the protective film, in which the resist film is formed of a photosensitive resin composition that contains a photoacid generator (A) which generates an organic acid of which a pKa of the generated acid is −1 or less and a resin (B) which reacts with an acid generated by the photoacid generator so that the rate of dissolution in a developer containing an organic solvent is decreased. Further, an undercoat layer may be included between the organic semiconductor film and the protective film and/or the protective film and the resist film.

The photosensitive resin composition of the present invention contains a photoacid generator and a mask pattern can be formed by an exposed portion being hardly soluble in a developer containing an organic solvent. After the mask pattern is formed, the mask pattern can be used as a mask of dry etching.

When a normal resist film is formed on an organic semiconductor film and patterning is performed, the organic semiconductor is easily dissolved in an organic solvent contained in a resist and the organic semiconductor film is damaged.

Meanwhile, in the present invention, a protective film is formed on an organic semiconductor and then a resist film is formed thereon. In this case, since the resist film and the organic semiconductor film are not in direct contact, it is possible to prevent the organic semiconductor film from being damaged. In addition, since the resist film uses a photosensitive resin composition, long preservation stability and fine pattern formability can be achieved.

Hereinafter, the present invention will be described in detail.

<Organic Semiconductor Film>

The organic semiconductor film used in the present invention indicates a film containing an organic material showing characteristics of a semiconductor. Similar to a case of a semiconductor formed of an inorganic material, there is a p-type organic semiconductor that conducts positive holes as a carrier and an n-type organic semiconductor that conducts electrons as a carrier. The flowability of a carrier in the organic semiconductor is expressed as a carrier mobility μ. Depending on the applications, the mobility is typically high, preferably $10^{-7}$ $cm^2/Vs$ or greater, more preferably $10^{-6}$ $cm^2/Vs$ or greater, and still more preferably $10^{-5}$ $cm^2/Vs$ or greater. The mobility can be acquired by characteristics or a time-of-flight measurement (TOF) at the time of preparation of a field effect transistor (FET) element.

Typically, it is preferable that the organic semiconductor film is used by being formed on a substrate. That is, it is preferable that the substrate is formed on a surface which is the opposite side to a side on which the water-soluble resin film of the organic semiconductor film is laminated. As the substrate which can be used in the present invention, various materials, for example, silicon, quartz, ceramic, glass, and a polyester film such as polyethylene naphthalene (PEN) or polyethylene terephthalate (PET), and a polyimide film can be used and any substrate may be selected according to the application thereof. For example, in a case where a flexible element is required, a flexible substrate can be used. Moreover, the thickness of the substrate is not particularly limited.

Any of an organic semiconductor material and an inorganic semiconductor material may be used as the p-type semiconductor material which can be used as long as the material shows hole transporting properties, preferred examples thereof including a p-type π conjugated polymer (for example, substituted or unsubstituted polythiophene (for example, poly(3-hexylthiophene) (P3HT)), polyselenophene, polypyrrole, polyparaphenylene, polyparaphenylene vinylene, polythiophene vinylene, or polyaniline), a condensed polycyclic compound (for example, substituted or unsubstituted anthracene, tetracene, pentacene, anthrathiophene, or hexabenzocoronene), a triarylamine compound (for example, m-MTDATA, 2-TNATA, NPD, TPD, mCP, or CBP), a 5-membered heterocyclic compound (for example, a substituted or unsubstituted oligothiophene or TTF), a phthalocyanine compound (various substituted or unsubstituted central metals such as phthalocyanine, naphthalocyanine, anthracyanine, or tetrapyrazinoporphyrazine), a porphyrin compound (various substituted or unsubstituted central metals such as porphyrin), carbon nanotubes, a semiconductor polymer modified with carbon nanotubes, and graphene; more preferred examples thereof including a p-type π conjugated polymer, a condensed polycyclic compound, a triarylamine compound, a 5-membered heterocyclic compound, a phthalocyanine compound, and a porphyrin compound; and still more preferred examples thereof including a p-type π conjugated polymer.

Any of an organic semiconductor material and an inorganic semiconductor material may be used as the n-type semiconductor material which can be used as a semiconductor material as long as the material shows hole transporting properties, preferred examples thereof including a fullerene compound, an electron deficient phthalocyanine compound, a naphthalene tetracarbonyl compound, a perylene tetracarbonyl compound, a TCNQ compound, an n-type π conjugated polymer, and an n-type inorganic semiconductor; more preferred examples thereof including a fullerene compound, an electron deficient phthalocyanine compound, a naphthalene tetracarbonyl compound, a perylene tetracarbonyl compound, and a n-type π conjugated polymer; and particularly preferred examples including a fullerene compound and a n-type π conjugated polymer. In the present invention, a fullerene compound indicates a substituted or unsubstituted fullerene compound and any of $C_{60}$, $C_{70}$, $C_{76}$, $C_{78}$, $C_{80}$, $C_{92}$, $C_{84}$, $C_{86}$, $C_{88}$, $C_{90}$, $C_{96}$, $C_{116}$, $C_{180}$, $C_{240}$, and $C_{540}$ may be used as a fullerene. As the fullerene compound, substituted or unsubstituted $C_{60}$, $C_{70}$, or $C_{86}$ is preferable and PCBM ([6,6]-phenyl-$C_{61}$-butyric acid methyl ester) or an analog thereof (a compound obtained by substituting the $C_{60}$ portion with $C_{70}$ or $C_{86}$; a compound obtained by substituting the benzene ring substituent with another aromatic ring or a hetero ring; or a compound obtained by substituting methyl ester with n-butyl ester or i-butyl ester) is particularly preferable. Examples of electron deficient phthalocyanines include phthalocyanine ($F_{16}$MPc, FPc-S8, or the like) of various central metals to which four or more electron-withdrawing groups are bonded, naphthalocyanine, anthracyanine, and substituted or unsubstituted tetrapyrazinoporphyrazine. The naphthalene tetracarbonyl compound is not particularly limited, and a naphthalene tetracarboxylic anhydride (NTCDA), a naphthalene bisimide compound (NTCDI), or a perinone pigment (Pigment Orange 43, Pigment Red 194, or the like) is preferable. The perylene tetracarbonyl compound is not particularly limited, and a perylene tetracarboxylic anhydride (PTCDA), a perylene bisimide compound (PTCDI), or a benzimidazole condensed ring (PV) is preferable. The TCNQ compound is substituted or unsubstituted TCNQ and a compound obtained by substituting a benzene ring portion of TCNQ with another aromatic ring or hetero ring and examples thereof include TCNQ, TCAQ, and TCN3T. Further, graphene may be exemplified. Particularly preferred examples of the n-type organic semiconductor materials are described below.

R in the formula is not particularly limited, and preferred examples thereof include a hydrogen atom, a substituted or unsubstituted branched or linear alkyl group (having preferably 1 to 18 carbon atoms, more preferably 1 to 12 carbon atoms, and still more preferably 1 to 8 carbon atoms), and a substituted or unsubstituted aryl group (having preferably 6 to 30 carbon atoms, more preferably 6 to 20 carbon atoms, and still more preferably 6 to 14 carbon atoms).

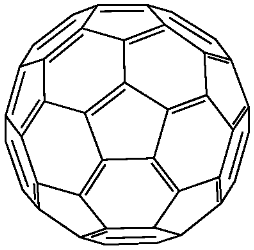

$C_{60}$

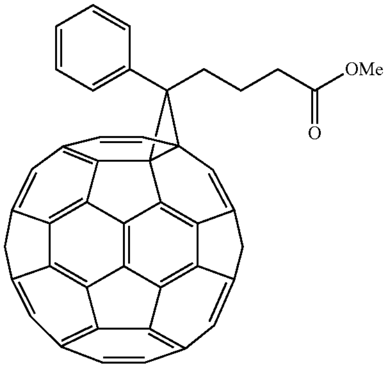

PCBM

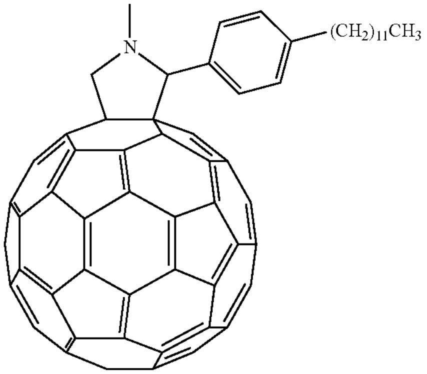

C60MC12

-continued

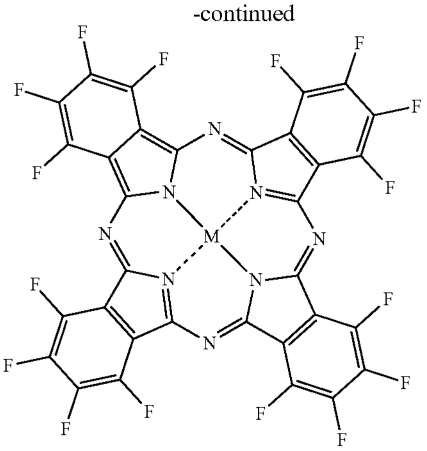

$F_{16}MPc$

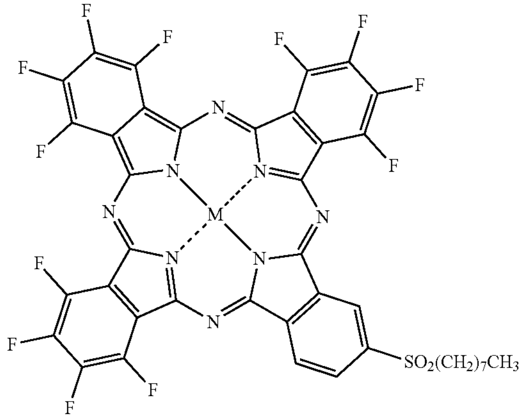

FPc-S8

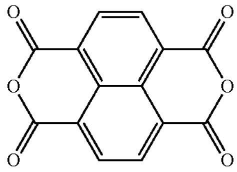

NTCDA

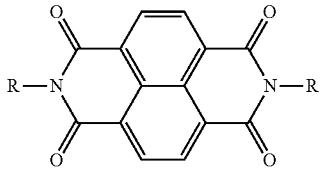

NTCDI

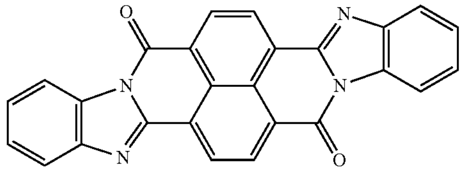

$PO_{43}$

-continued

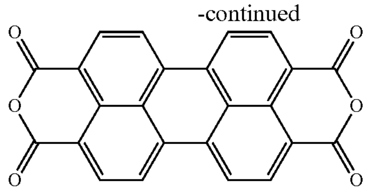

PTCDA

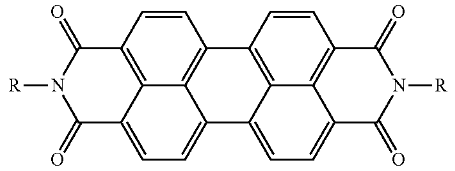

PTCDI

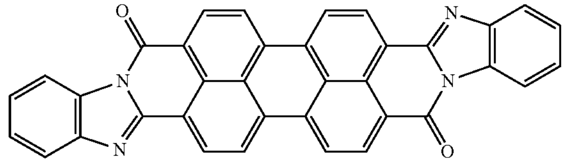

PV

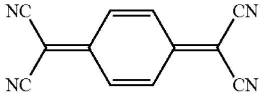

TCNQ

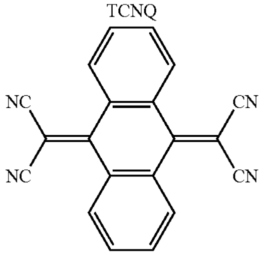

TCNAQ

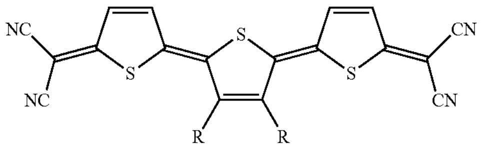

TCN3T

The above-described materials are used for film formation typically by being mixed with a solvent, being applied to have a layer form, and then being dried. As an application method, description of a protective film described below can be referred to.

Examples of the solvent include a hydrocarbon-based solvent such as hexane, octane, decane, toluene, xylene, ethylbenzene, 1-methylnaphthalene, or 1,2-dichlorobenzene; a ketone-based solvent such as acetone, methyl ethyl ketone, methyl isobutyl ketone, or cyclohexanone; a halogenated hydrocarbon-based solvent such as dichloromethane, chloroform, tetrachloromethane, dichloroethane, trichloroethane, tetrachloroethane, chlorobenzene, dichlorobenzene, or chlorotoluene; an ester-based solvent such as ethyl acetate, butyl acetate, or amyl acetate; an alcohol-based solvent such as methanol, propanol, butanol, pentanol, hexanol, cyclohexanol, methyl cellosolve, ethyl cellosolve, or ethylene glycol; an ether-based solvent such as dibutyl ether, tetrahydrofuran, dioxane, or anisole; and a polar solvent such as N,N-dimethylformamide, N,N-dimethylacetamide, 1-methyl-2-pyrrolidone, 1-methyl-2-imidazolidinone, or dimethyl sulfoxide. These solvents may be used alone or in combination of two or more kinds thereof.

The proportion of the organic semiconductor in a composition (composition for forming an organic semiconductor) that forms the organic semiconductor film is preferably in a range of 0.1% by mass to 80% by mass and more preferably in a range of 0.1% by mass to 10% by mass, and a film having an arbitrary thickness can be formed using the composition.

Further, a resin binder may be mixed with the composition for forming an organic semiconductor. In this case, a material that forms a film and a resin binder are dissolved in the above-described suitable solvent or dispersed therein to make a coating solution, and then a thin film can be formed using various coating methods. Examples of the resin binder include an insulating polymer such as polystyrene, polycarbonate, polyarylate, polyester, polyamide, polyimide, polyurethane, polysiloxane, polysulfone, polymethyl methacrylate, polymethyl acrylate, cellulose, polyethylene, or polypropylene and a copolymer of these; a photoconductive polymer such as polyvinyl carbazole or polysilane; and a conductive polymer such as polythiophene, polypyrrole, polyaniline, or polyparaphenylene vinylene. These resin binders may be used alone or in combination of two or more kinds thereof. When mechanical strength of a thin film is considered, a resin binder having a high glass transition temperature is preferable. Further, when charge mobility is considered, a resin binder having a structure not containing a polar group, a photoconductive polymer, or a conductive polymer is preferable.

In a case where a resin binder is to be mixed in, the amount to be mixed in is preferably in a range of 0.1% by mass to 30% by mass in a film such as an organic semiconductor film.

According to the application thereof, a mixed solution to which a single or various semiconductor materials or additives are added may be applied to form a film blend formed of a plurality of materials. For example, in a case where a photoelectric conversion layer is prepared, a solution into which another semiconductor material is mixed can be used.

Moreover, at the time of film formation, a substrate may be heated or cooled, and the film quality or packing of molecules in the film can be controlled by changing the temperature of the substrate. The temperature of the substrate, which is not particularly limited, is preferably in a range of −200° C. to 400° C., more preferably in a range of −100° C. to 300° C., and still more preferably in a range of 0° C. to 200° C.

The characteristics of the formed organic semiconductor film can be adjusted by carrying out a post-treatment. For example, the characteristics can be improved by changing a morphology of the film or a packing of molecules of the film through a heat treatment or exposure to solvent vapor. In addition, when the film is exposed to a gas, a solvent, or a material having oxidizability or reducibility or an oxidation or a reduction reaction is caused due to these being mixed in, and the carrier density in the film can then be adjusted.

The film thickness of the organic semiconductor film is not particularly limited and varies depending on the kind of an electronic device to be used. The film thickness thereof is preferably in a range of 5 nm to 50 μm, more preferably in a range of 10 nm to 5 μm, and still more preferably in a range of 20 nm to 500 nm.

<Protective Film>

The protective film of the present invention is formed on the organic semiconductor film, preferably on the surface of the organic semiconductor film. An undercoat layer or the like may be present between the organic semiconductor film and the protective film.

As the protective film, a film which does not damage the organic semiconductor when the film is formed on the organic semiconductor and does not cause intermixing (interlayer mixing) when the protective film is coated with the resist film is preferable. As the protective film, a film containing a water-soluble resin is preferable and a film containing a fat-soluble resin as a main component is more preferable. The main component indicates a component, whose proportion in components constituting the protective film is the greatest, and means that the content of a water-soluble resin in the protective film is preferably 80% by mass or greater.

The water-soluble resin in the present invention indicates a resin whose solubility in water at 20° C. is 1% or greater.

The protective film is unlikely to dissolve in a developer containing an organic solvent and needs to be dissolved in water. For this reason, in a case where a water-soluble resin is used for the protective film, the sp value (solubility parameter) of the protective film is preferably 18 $(MPa)^{1/2}$ to less than 25 $(MPa)^{1/2}$, more preferably in a range of 20 $(MPa)^{1/2}$ to 24 $(MPa)^{1/2}$, and still more preferably in a range of 21 $(MPa)^{1/2}$ to 24 $(MPa)^{1/2}$. The sp value is a value calculated by a Hoy method and the Hoy method is described in "POLYMER HANDBOOK FOURTH EDITION."

Further, a composition for forming a protective film may contain two or more kinds of resins. In this case, it is preferable that each of the two or more kinds of resins is in the above-described ranges.

Examples of the water-soluble resin used in the present invention include polyvinylpyrrolidone, water-soluble polysaccharides (water-soluble cellulose, (methyl cellulose, hydroxyethyl cellulose, hydroxypropyl cellulose, hydroxyethyl methyl cellulose, or hydroxypropyl methyl cellulose), pullulan or a pullulan derivative, starch, hydroxypropyl starch, carboxymethyl starch, chitosan, and cyclodextrin), polyvinyl alcohol, polyethylene oxide, and polyethyl oxazoline. Among these, polyvinylpyrrolidone, polyvinyl alcohol, or pullulan is preferable. Further, polyvinylpyrrolidone which has an excellent coating surface and dissolution and removal in water can be easily made is more preferable.

In addition, two or more kinds having main chain-like structures different from each other may be selected from among these and then used or may be used as a copolymer.

The weight average molecular weight of the resin that forms the protective film used in the present invention is preferably in a range of 500 to 400,000, more preferably 2,000 to 300,000, and still more preferably 3,000 to 200,000 in terms of polystyrene according to the GPC method.

The resin for forming a protective film having a degree of dispersion (molecular weight distribution) of typically in a range of 1.0 to 3.0 and preferably in a range of 1.0 to 2.6 is preferably used.

In the present invention, the protective film is formed by applying the composition for forming a protective film on an organic semiconductor film and drying the film.

As a method of applying the composition, coating is preferable. Examples of the application method include a casting method, a blade coating method, a wire bar coating method, a spray coating method, a dipping (immersion) coating method, a bead coating method, an air knife coating method, a curtain coating method, an ink-jet method, a spin coating method, and a Langmuir-Blodgett (LB) method. In the present invention, a casting method, a spin coating method, or an ink-jet method is more preferable. When such a process is carried out, it is possible to produce a film such as an organic semiconductor film whose surface is flat and which has a large area at a low cost.

The concentration of the solid content of the composition for forming a protective film is preferably in a range of 0.5% by mass to 30% by mass, more preferably in a range of 1.0% by mass to 20% by mass, and still more preferably in a range of 2.0% by mass to 14% by mass. When the concentration of the solid content is adjusted to be in the above-described range, the composition can be uniformly applied.

It is preferable that the composition for forming a protective film contains a surfactant for the purpose of further improving coating properties.

Any of a non-ionic surfactant, an anionic surfactant, and an amphoteric fluorine-based surfactant may be used as a surfactant as long as surface tension can be decreased. Examples of the surfactant include non-ionic surfactants, for example, polyoxyethylene alkyl ethers such as polyoxyethylene lauryl ether, polyoxyethylene cetyl ether, and polyoxyethylene stearyl ether, polyoxyethylene alkyl allyl ethers such as polyoxyethylene octylphenyl ether and polyoxyethylene nonylphenyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; monoglyceride alkyl esters such as glycerol monostearate and glycerol monooleate; an oligomer containing fluorine or silicon; acetylene glycol; and an ethylene oxide adduct of acetylene glycol; anionic surfactants, for example, alkylbenzene sulfonates such as sodium dodecylbenzene sulfonate; alkylnaphthalene sulfonates such as sodium butylnaphthalene sulfonate, sodium pentylnaphthalene sulfonate, sodium hexylnaphthalene sulfonate, and sodium octylnaphthalene sulfonate; alkyl sulfates such as sodium lauryl sulfate; alkyl sulfonates such as sodium dodecyl sulfonate; and sulfosuccinates such as sodium dilauryl sulfosuccinate; and amphoteric surfactants, for example, alkyl betaines such as lauryl betaine and stearyl betaine; and amino acids. A non-ionic surfactant which has a small content of metal ions affecting electrical characteristics of an organic semiconductor, has excellent anti-foaming properties, and has an acetylene skeleton represented by the following Formula (1) is particularly preferable.

$$R^1—C≡C—R^2 \quad (1)$$

In Formula (1), $R^1$ and $R^2$ each independently represent an alkyl group which may include a substituent and has 3 to 15 carbon atoms, an aromatic hydrocarbon group which may include a substituent and has 6 to 15 carbon atoms, or a heterocyclic aromatic group which may include a substituent and has 4 to 15 carbon atoms (examples of the substituent include an alkyl group having 1 to 20 carbon atoms, an aromatic hydrocarbon group having 6 to 15 carbon atoms, an aralkyl group having 7 to 17 carbon atoms, an alkoxy group having 1 to 20 carbon atoms, an alkoxycarbonyl group having 2 to 20 carbon atoms, or an acyl group having 2 to 15 carbon atoms).

As an examples of the surfactant, Surfynol series (manufactured by Nissin Chemical Co., Ltd.) are exemplified.

In a case where the composition for forming a protective film contains a surfactant, the amount of the surfactant to be added is preferably in a range of 0.05% by mass to 8% by mass, more preferably in a range of 0.07% by mass to 5% by mass, and particularly preferably in a range of 0.1% by mass to 3% by mass when a protective film is obtained.

These surfactants may be used alone or in combination of two or more kinds thereof.

The protective film has a film thickness of preferably in a range of 20 nm to 5μ and more preferably in a range of 100 nm to 1 μm. The above-described film thickness can be obtained by setting the concentration of the solid content in the composition for forming a protective film to be in an appropriate range to have a suitable viscosity and improving the coating properties and the film forming properties.

A dye may be blended in the protective film. When a dye is blended in the protective film, since the absorption wavelength can be adjusted according to the wavelength of an exposure light source, damage to an organic semiconductor material caused by exposure to light can be effectively prevented.

Examples of the dye include an azo dye, a nitro dye, a nitroso dye, a stilbene azo dye, a ketoimine dye, a triphenylmethane dye, a xanthene dye, an acridine dye, a quinoline dye, a methane-polymethine dye, a thiazole dye, an indamine-indophenol dye, an azine dye, an oxazine dye, a thiazine dye, a sulfur dye, an aminoketone dye, an oxyketone dye, an anthraquinone dye, an indigoid dye, and a phthalocyanine dye.

In a case where a dye is blended in the protective film, the content of the protective film can be adjusted to be in a range of 0.1% by mass to 10% by mass.

These dyes may be used alone or in combination of plural kinds thereof.

<Photosensitive Resin Composition>

The photosensitive resin composition used in the present invention plays a role of a resist composition for forming an organic semiconductor and is used to form a resist film on the protective film.

The photosensitive resin composition used in the present invention contains a photoacid generator (A) which generates an organic acid of which a pKa of the generated acid is −1 or less and a resin (B) which reacts with an acid generated by the photoacid generator so that the rate of dissolution in a developer containing an organic solvent is decreased.

A preferred first embodiment of the photosensitive resin composition used in the present invention is a composition whose polarity is changed due to an organic acid generated by a photoacid generator and in which the rate of dissolution in a developer containing an organic solvent is decreased. Further, a composition in which the rate of dissolution in an organic solvent having an sp value of less than 19 $(MPa)^{1/2}$ is decreased is more preferable, a composition which becomes hardly soluble in an organic solvent having an sp value of 18.5 $(MPa)^{1/2}$ or less is still more preferable, and a composition in which the rate of dissolution in an organic solvent having an sp value of 18.0 $(MPa)^{1/2}$ or less is decreased is even still more preferable.

Moreover, a preferred second embodiment of the photosensitive resin composition used in the present invention is a composition in which a cross-linking reaction occurs in the resin (B) due to a generated acid that is generated by the photoacid generator (A) so that the rate of dissolution in the developer containing an organic solvent is decreased.

In the present invention, an aspect satisfying both of the first and second embodiments is more preferable.

Since a finer trench hole pattern can be formed and thus particularly good effects can be obtained, it is preferable that the photosensitive resin composition used in the present invention is a negative type resist composition.

The photosensitive resin composition used in the present invention contains at least a resin (A) and a photoacid generator (B) which can be developed by a developer containing an organic solvent. With the photosensitive resin composition in the present invention, generation of a residue at the time of development is prevented and a resist film having a surface with excellent smoothness can be formed. Moreover, the effects of the present invention are more effectively exhibited by employing a resin (B) that includes a repeating unit having a cross-linking group.

Here, the "residue" in the present invention indicates a residue existing on the peripheral edge of the end portion of a pattern-like resist film when the pattern-like resist film is formed using the photosensitive resin composition.

<Photoacid Generator (A)>

The photoacid generator used in the present invention is a photoacid generator that generates an organic acid of which a pKa of the generated acid is −1 or less. In the acid having a pKa of greater than −1, the reactivity of the resin (B) becomes insufficient and the rate of dissolution in a developer containing an organic solvent cannot be sufficiently decreased. In addition, in a case where an inorganic acid is generated by the photoacid generator (A), the inorganic acid is diffused in the protective film so that the pattern is formed to have an undercut shape or peeling is caused. In addition, occurrence of a reaction between the protective resin and the resin (B) may be a factor of residues. In the present invention, the lower limit of the pKa is not particularly limited, but the lower limit thereof is, for example, −10 or greater and preferably −5 or greater.

As the organic acid of which a pKa generated by the photoacid generator (A) is −1 or less, at least one selected from sulfonic acid, trialkyl sulfonyl methide acid, and dialkyl sulfonylimide acid is preferable.

As the photoacid generator (A) used in the present invention, a photoacid generator corresponding to any one of the group consisting of (i) a compound including an oxime sulfonate group (hereinafter, also referred to as an oxime sulfonate compound) and a compound including an imide sulfonate group (hereinafter, also referred to as an imide sulfonate group), (ii) a compound including a sulfonium cation (hereinafter, also referred to as a sulfonium salt) and a compound including an iodonium cation (hereinafter, also referred to as an iodonium salt), and (iii) a diazodisulfone compound and a disulfone compound (more preferably a diazodisulfone compound) is preferable.

(i) Compound Including Oxime Sulfonate Group and Compound Including Imide Sulfonate Group The oxime sulfonate compound is not particularly limited as long as the compound includes an oxime sulfonate group, and it is preferable that the oxime sulfonate compound is an oxime sulfonate compound represented by the following Formula (2), or (OS-103), (OS-104), or (OS-105) shown below.

(2)

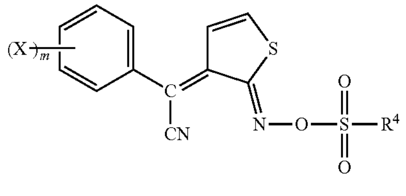

X's in Formula (2) each independently represent an alkyl group, an alkoxy group, or a halogen atom.

The alkyl group and the alkoxy group as X may include a substituent. As the alkyl group as X described above, a linear or branched alkyl group having 1 to 4 carbon atoms is preferable. As the alkoxy group as X described above, a linear or branched alkoxy group having 1 to 4 carbon atoms is preferable. As the halogen atom as X, a chlorine atom or a fluorine atom is preferable.

m in Formula (2) represents an integer of 0 to 3, and 0 or 1 is preferable. When m represents 2 or 3, a plurality of X's may be the same as or different from each other.

$R^4$ in Formula (2) represents an alkyl group or an aryl group. It is preferable that $R^4$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W. W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

Specific examples of the alkyl group having 1 to 10 carbon atoms as $R^4$ include a methyl group, an ethyl group, an n-propyl group, an i-propyl group, an n-butyl group, an i-butyl group, an s-butyl group, a tert-butyl group, an n-amyl group, an i-amyl group, an s-amyl group, an n-hexyl group, an n-heptyl group, an n-octyl group, an n-nonyl group, and an n-decyl group.

Specific examples of the alkoxy group having 1 to 10 carbon atoms as $R^4$ include a methoxy group, an ethoxy group, an n-propoxy group, an i-propoxy group, an n-butoxy group, an n-amyloxy group, an n-octyloxy group, and an n-decyloxy group.

Specific examples of the halogenated alkyl group having 1 to 5 carbon atoms as $R^4$ include a trifluoromethyl group, a pentafluoroethyl group, a perfluoro-n-propyl group, a perfluoro-n-butyl group, and a perfluoro-n-amyl group.

Specific examples of the halogenated alkoxy group having 1 to 5 carbon atoms as $R^4$ include a trifluoromethoxy group, a pentafluoroethoxy group, a perfluoro-n-propoxy group, a perfluoro-n-butoxy group, and a perfluoro-n-amyloxy group.

Specific examples of the phenyl group which can be substituted with W as $R^4$ include an o-tolyl group, an m-tolyl group, a p-tolyl group, an o-ethylphenyl group, an m-ethylphenyl group, a p-ethylphenyl group, a p-(n-propyl)phenyl group, a p-(i-propyl)phenyl group, a p-(n-butyl)phenyl group, a p-(i-butyl)phenyl group, a p-(s-butyl)phenyl group, a p-(tert-butyl)phenyl group, a p-(n-amyl)phenyl group, a p-(i-amyl)phenyl group, a p-(tert-amyl)phenyl group, an o-methoxyphenyl group, an m-methoxyphenyl group, a p-methoxyphenyl group, an o-ethoxyphenyl group, an m-ethoxyphenyl group, a p-ethoxyphenyl group, a p-(n-propoxy)phenyl group, a p-(i-propoxy)phenyl group, a p-(n-butoxy)phenyl group, a p-(i-butoxy)phenyl group, a p-(s-butoxy)phenyl group, a p-(tert-butoxy)phenyl group, a p-(n-amyloxy)phenyl group, a p-(i-amyloxy)phenyl group, a p-(tert-amyloxy)phenyl group, a p-chlorophenyl group, a p-bromophenyl group, a p-fluorophenyl group, a 2,4-dichlorophenyl group, a 2,4-dibromophenyl group, a 2,4-difluorophenyl group, a 2,4,6-dichlorophenyl group, a 2,4,6-tribromophenyl group, a 2,4,6-trifluorophenyl group, a pentachlorophenyl group, a pentabromophenyl group, a pentafluorophenyl group, and a p-biphenylyl group.

Specific examples of the naphthyl group which can be substituted with W as $R^4$ include a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 1-methyl-2-naphthyl group, a 3-methyl-2-naphthyl group, a 4-methyl-2-naphthyl group, a 5-methyl-2-naphthyl group, a 6-methyl-2-naphthyl group, a 7-methyl-2-naphthyl group, and an 8-methyl-2-naphthyl group.

Specific examples of the anthranyl group which can be substituted with W as $R^4$ include a 2-methyl-1-anthranyl group, a 3-methyl-1-anthranyl group, a 4-methyl-1-anthranyl group, a 5-methyl-1-anthranyl group, a 6-methyl-1-anthranyl group, a 7-methyl-1-anthranyl group, an 8-methyl-1-anthranyl group, a 9-methyl-1-anthranyl group, a 10-methyl-1-anthranyl group, a 1-methyl-2-anthranyl group, a 3-methyl-2-anthranyl group, a 4-methyl-2-anthranyl group, a 5-methyl-2-anthranyl group, a 6-methyl-2-anthranyl group, a 7-methyl-2-anthranyl group, an 8-methyl-2-anthranyl group, a 9-methyl-2-anthranyl group, and a 10-methyl-2-anthranyl group.

In Formula (2), a compound in which m represents 1, X represents a methyl group, a substitution position of X is an ortho-position, and $R^4$ represents a linear alkyl group having 1 to 10 carbon atoms, a 7,7-dimethyl-2-orthonorbornylmethyl group, or a p-toluyl group is particularly preferable.

Specific examples of the oxime sulfonate compound represented by Formula (2) include a compound (i), a compound (ii), a compound (iii), and a compound (iv). These compounds may be used alone or in combination of two or more kinds thereof. The compounds (i) to (iv) can be obtained as commercially available products. In addition, specific examples of other oxime sulfonate compounds represented by Formula (2) will be shown below.

(i)

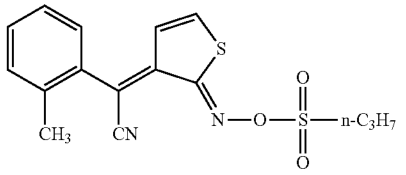

(ii)

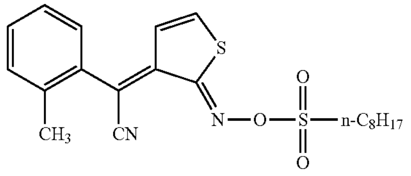

(iii)

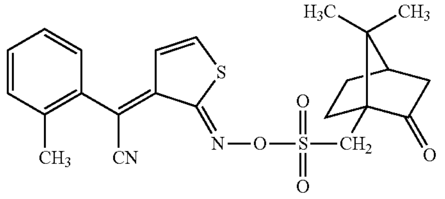

(iv)

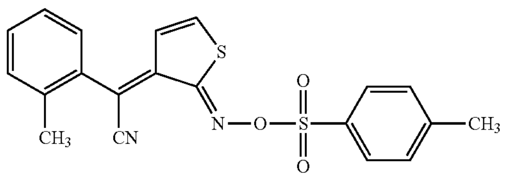

-continued
OS-1
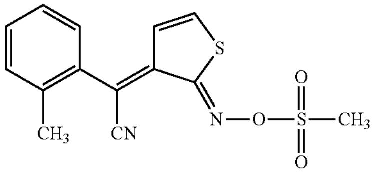
OS-2
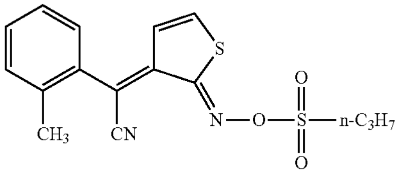
OS-3
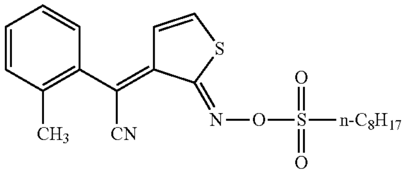
OS-4
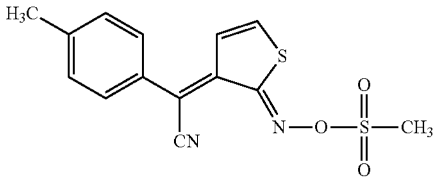
OS-5
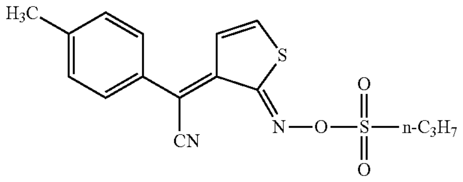
OS-6
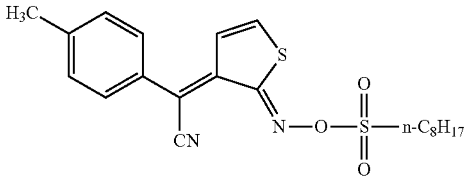
OS-7
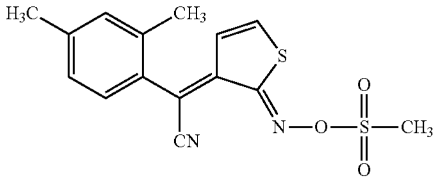
OS-8
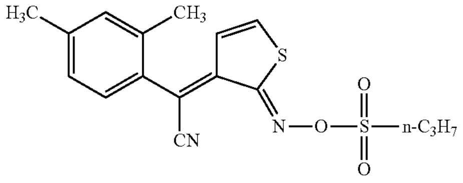
-continued
OS-9
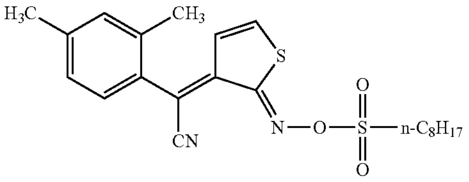
OS-10
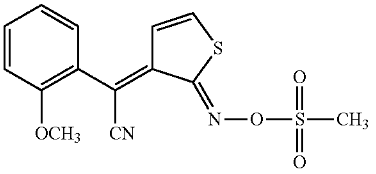
OS-11
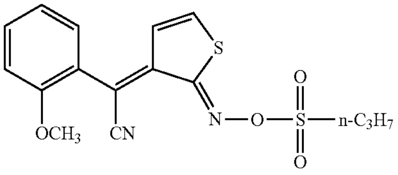
OS-12
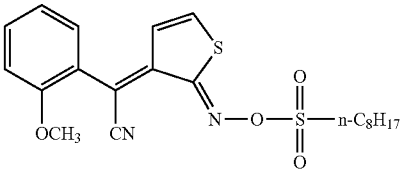
OS-13
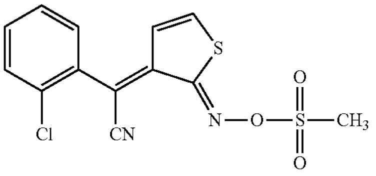
OS-14
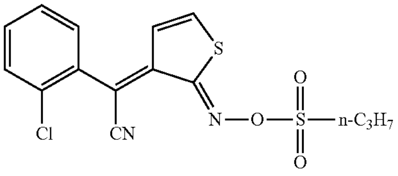
OS-15
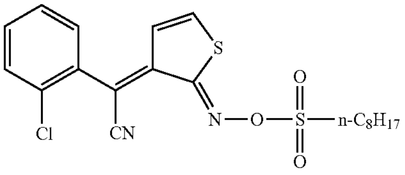
OS-16
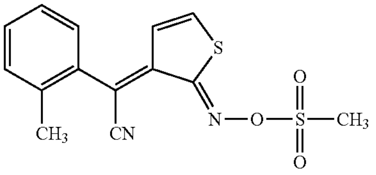

-continued
OS-17
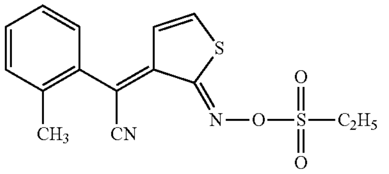
OS-18
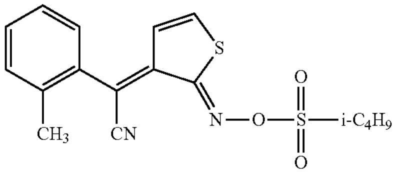
OS-19
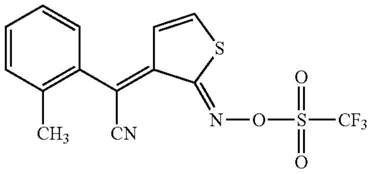
OS-20
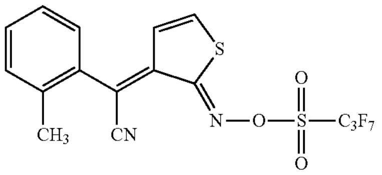
OS-21
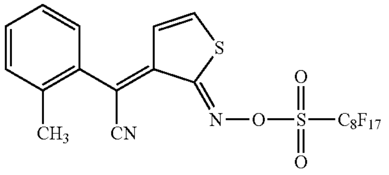
OS-22
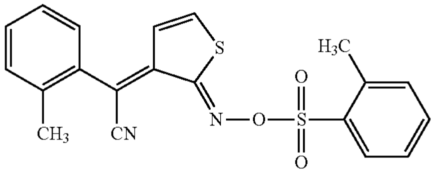
OS-23
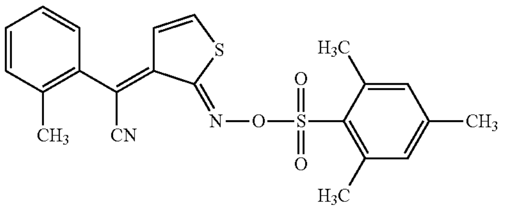
OS-24
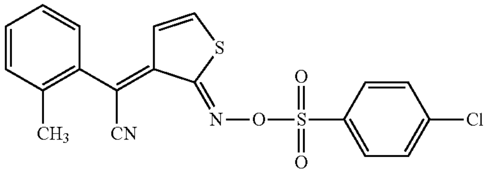
-continued
OS-25
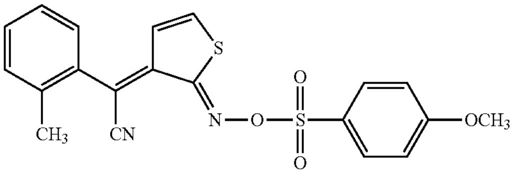
OS-26
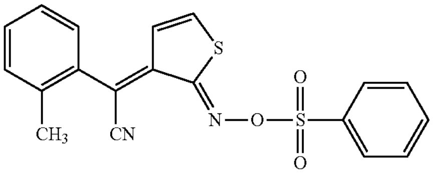
OS-27
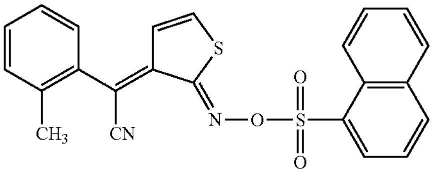
OS-28
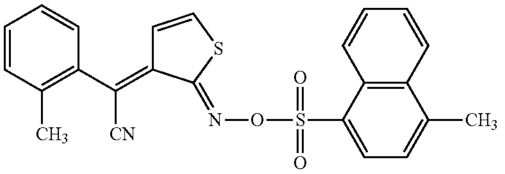
OS-29
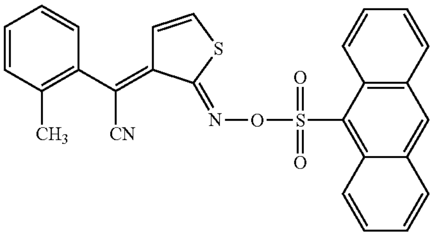
OS-30
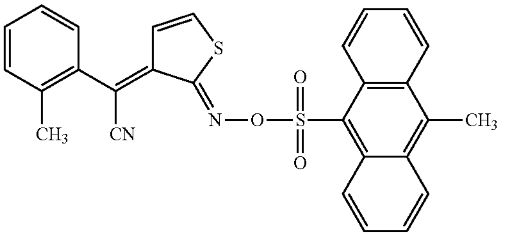
(OS-103)
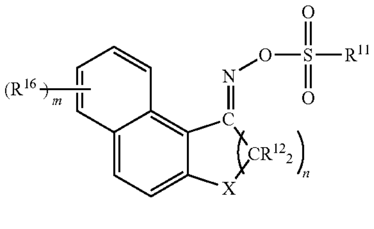

-continued (OS-104)

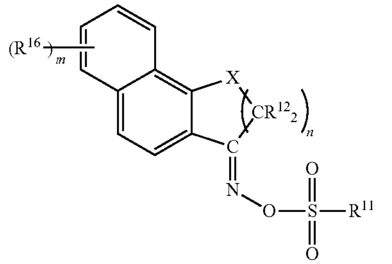

(OS-105)

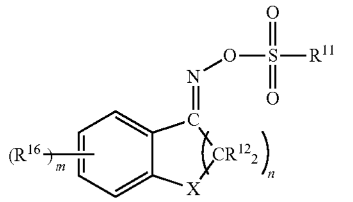

(In Formulae (OS-103) to (OS-105), $R^{11}$ represents an alkyl group, an aryl group, or a heteroaryl group; a plurality of $R^{12}$'s each independently represent a hydrogen atom, an alkyl group, an aryl group, or a halogen atom; a plurality of $R^{16}$'s each independently represent a halogen atom, an alkyl group, an alkyloxy group, a sulfonic acid group, an amino-sulfonyl group, or an alkoxysulfonyl group; X represents O or S; n represents 1 or 2; and m represents an integer of 0 to 6.)

In Formula (OS-103) to (OS-105), the alkyl group, the aryl group, or the heteroaryl group represented by $R^{11}$ may include a substituent.

In Formulae (OS-103) to (OS-105), it is preferable that the alkyl group represented by $R^{11}$ is an alkyl group which may include a substituent and has 1 to 30 carbon atoms.

Examples of the substituent which may be included in the alkyl group represented by $R^{11}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), examples of the alkyl group represented by $R^{11}$ include a methyl group, an ethyl group, an n-propyl group, an i-propyl group, an n-butyl group, an s-butyl group, a tert-butyl group, an n-pentyl group, an n-hexyl group, an n-octyl group, an n-decyl group, an n-dodecyl group, a trifluoromethyl group, a perfluoropropyl group, a perfluorohexyl group, and a benzyl group.

In Formulae (OS-103) to (OS-105), as the aryl group represented by $R^{11}$, an aryl group which may include a substituent and has 6 to 30 carbon atoms is preferable.

Examples of the substituent which may be included in the aryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

Examples of the aryl group represented by $R^{11}$ include a phenyl group, a p-methylphenyl group, a trimethylphenyl group, a p-chlorophenyl group, a pentachlorophenyl group, a pentafluorophenyl group, an o-methoxyphenyl group, and a p-phenoxyphenyl group.

In Formulae (OS-103) to (OS-105), as the heteroaryl group represented by $R^{11}$, a heteroaryl group which may include a substituent and has 4 to 30 carbon atoms is preferable.

Examples of the substituent which may be included in the heteroaryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

In Formulae (OS-103) to (OS-105), the heteroaryl group represented by $R^{11}$ may include at least one heteroaromatic ring and, for example, a heteroaromatic ring and a benzene ring may be condensed.

The heteroaryl group represented by $R^{11}$ may include a substituent. A group obtained by removing one hydrogen atom from a ring selected from the group consisting of a thiophene ring, a pyrrole ring, a thiazole ring, an imidazole ring, a furan ring, a benzothiophene ring, a benzothiazole ring, and a benzimidazole ring is exemplified.

In Formulae (OS-103) to (OS-105), it is preferable that $R^{12}$ represents a hydrogen atom, an alkyl group, or an aryl group and more preferable that $R^{12}$ represents a hydrogen atom or an alkyl group.

In Formulae (OS-103) to (OS-105), among two or more $R^{12}$'s existing in a compound, it is preferable that one or two $R^{12}$'s represent an aryl group or a halogen atom, more preferable that one $R^{12}$ represents an alkyl group, an aryl group, or a halogen atom, and particularly preferable that one $R^{12}$ represents an alkyl group and the rest represent a hydrogen atom.

In Formulae (OS-103) to (OS-105), the alkyl group or the aryl group represented by $R^{12}$ may include a substituent.

Examples of the substituent which may be included in the alkyl group or the aryl group represented by $R^{12}$ are the same as those of the substituent which may be included in the alkyl group or the aryl group represented by $R^1$.

In Formulae (OS-103) to (OS-105), as the alkyl group represented by $R^{12}$, an alkyl group which may include a substituent and has 1 to 12 carbon atoms is preferable and an alkyl group which may include a substituent and has 1 to 6 carbon atoms is more preferable.

As the alkyl group represented by $R^{12}$, a methyl group, an ethyl group, an n-propyl group, an i-propyl group, an n-butyl group, an i-butyl group, an s-butyl group, an n-hexyl group, an allyl group, a chloromethyl group, a bromomethyl group, a methoxymethyl group, or a benzyl group is preferable; a methyl group, an ethyl group, an n-propyl group, an i-propyl group, an n-butyl group, an i-butyl group, an s-butyl group, or an n-hexyl group is more preferable; a methyl group, an ethyl group, an n-propyl group, an n-butyl group, or an n-hexyl group is still more preferable; and a methyl group is particularly preferable.

In Formulae (OS-103) to (OS-105), as the aryl group represented by $R^{12}$, an aryl group which may include a substituent and has 6 to 30 carbon atoms is preferable.

Preferred examples of the aryl group represented by $R^{12}$ include a phenyl group, a p-methylphenyl group, an o-chlorophenyl group, a p-chlorophenyl group, an o-methoxyphenyl group, and a p-phenoxyphenyl group.

Examples of the halogen atom represented by $R^{12}$ include a fluorine atom, a chlorine atom, a bromine atom, and iodine atom. Among these, a chlorine atom or a bromine atom is preferable.

In Formulae (OS-103) to (OS-105), X represents O or S, and it is preferable that X represents O. In Formulae (OS-103) to (OS-105), a ring containing X as a ring member is a 5- or 6-membered ring.

In Formulae (OS-103) to (OS-105), n represents 1 or 2. It is preferable that n represents 1 when X represents O and it is preferable that n represents 2 when X represents S.

In Formulae (OS-103) to (OS-105), the alkyl group and the alkyloxy group represented by $R^{16}$ may include a substituent.

In Formulae (OS-103) to (OS-105), as the alkyl group represented by $R^{16}$, an alkyl group which may include a substituent and has 1 to 30 carbon atoms is preferable.

Examples of the substituent which may be included in the alkyl group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), preferred examples of the alkyl group represented by $R^{16}$ include a methyl group, an ethyl group, an n-propyl group, an i-propyl group, an n-butyl group, an s-butyl group, a tert-butyl group, an n-pentyl group, an n-hexyl group, an n-octyl group, an n-decyl group, an n-dodecyl group, a trifluoromethyl group, a perfluoropropyl group, a perfluorohexyl group, and a benzyl group.

In Formulae (OS-103) to (OS-105), as the alkyloxy group represented by $R^{16}$, an alkyloxy group which may include a substituent and has 1 to 30 carbon atoms is preferable.

Examples of the substituent which may be included in the alkyloxy group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), as the alkyloxy group represented by $R^{16}$, a methyloxy group, an ethyloxy group, a butyloxy group, a hexyloxy group, a phenoxyethyloxy group, a trichloromethyloxy group, or an ethoxyethyloxy group is preferable.

Examples of the aminosulfonyl group as $R^{16}$ include a methylaminosulfonyl group, a dimethylaminosulfonyl group, a phenylaminosulfonyl group, a methylphenylaminosulfonyl group, and an aminosulfonyl group.

Examples of the alkoxysulfonyl group represented by $R^{16}$ include a methoxysulfonyl group, an ethoxysulfonyl group, a propyloxysulfonyl group, and a butyloxysulfonyl group.

Moreover, in Formulae (OS-103) to (OS-105), m represents an integer of 0 to 6, preferably represents an integer of 0 to 2, more preferably represents 0 or 1, and particularly preferably represents 0.

In addition, it is particularly preferable that the compound represented by Formula (OS-103) is a compound represented by the following Formula (OS-106), (OS-110), or (OS-111), the compound represented by Formula (OS-104) is a compound represented by the following Formula (OS-107), and the compound represented by Formula (OS-105) is a compound represented by the following Formula (OS-108) or (OS-109).

(OS-106)

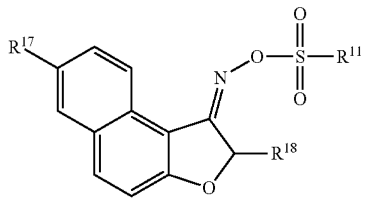

-continued (OS-107)

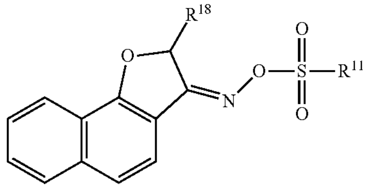

(OS-108)

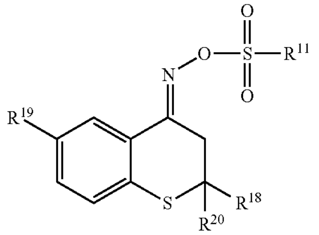

(OS-109)

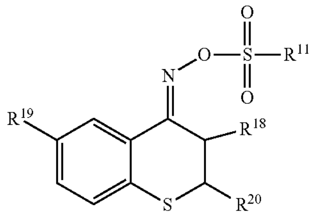

(OS-110)

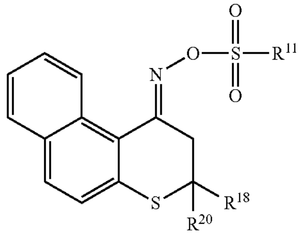

(OS-111)

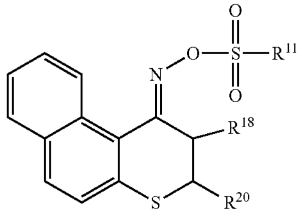

(In Formulae (OS-106) to (OS-111), $R^{11}$ represents an alkyl group, an aryl group, or a heteroaryl group; $R^{17}$ represents a hydrogen atom or a bromine atom; $R^{18}$ represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group; $R^{19}$ represents a hydrogen atom, a halogen atom, a methyl group, or a methoxy group, and $R^{20}$ represents a hydrogen atom or a methyl group.)

$R^{11}$ in Formulae (OS-106) to (OS-111) has the same definition as that for $R^{11}$ in Formulae (OS-103) to (OS-105) and preferred aspects are the same as each other.

$R^{17}$ in Formula (OS-106) represents a hydrogen atom or a bromine atom and preferably represents a hydrogen atom.

$R^{18}$ in Formulae (OS-106) to (OS-111) represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, preferably represents an alkyl group having 1 to 8 carbon atoms, a halogen atom, or a phenyl group, more preferably represents an alkyl group having 1 to 8 carbon atoms, still more preferably represents an alkyl group having 1 to 6 carbon atoms, and particularly preferably represents a methyl group.

$R^{19}$ in Formulae (OS-108) and (OS-109) represents a hydrogen atom, a halogen atom, a methyl group, or a methoxy group and preferably represents a hydrogen atom.

$R^{20}$ in Formulae (OS-108) to (OS-111) represents a hydrogen atom or a methyl group and preferably represents a hydrogen atom.

Moreover, the above-described oxime sulfonate compound may have one or a mixture of oxime steric structures (E, Z).

Specific examples of the oxime sulfonate compounds represented by Formula (OS-103) to (OS-105) include the following exemplary compounds shown below, but the present invention is not limited thereto.

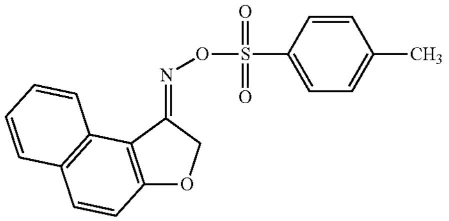

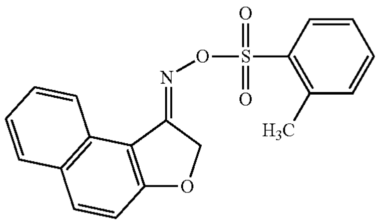

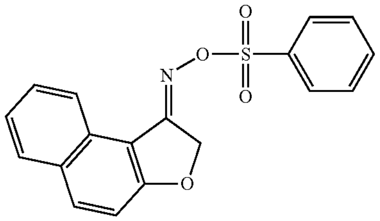

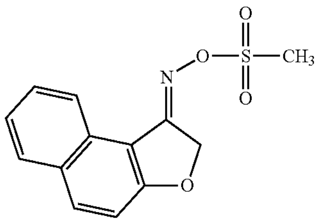

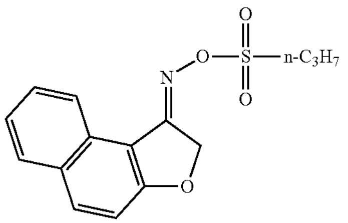

-continued

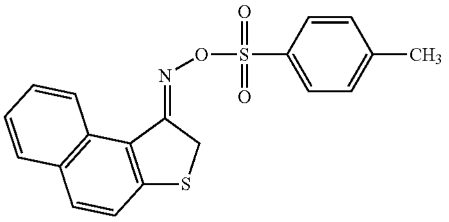

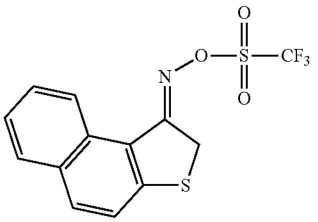

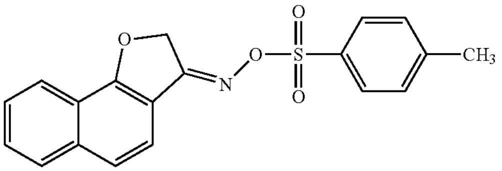

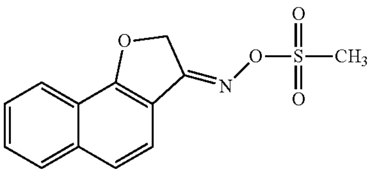

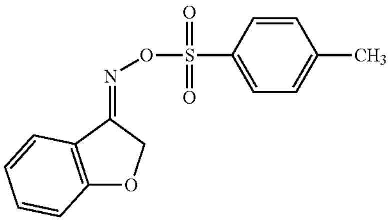

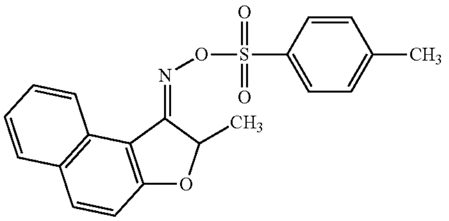

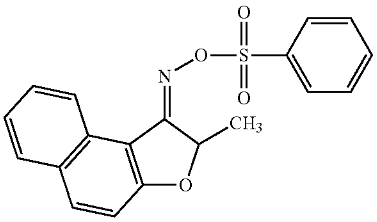

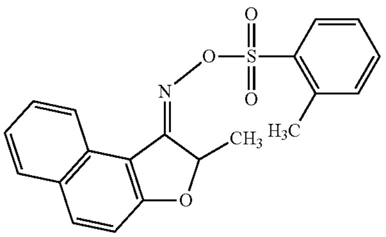

-continued
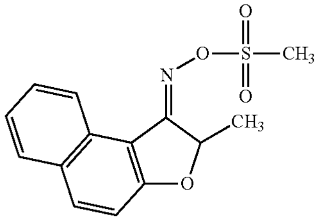
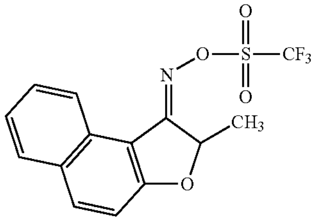
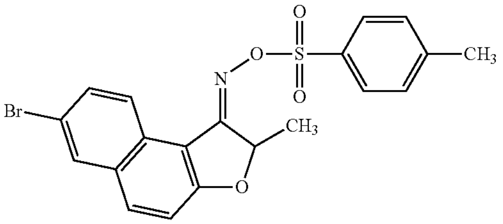
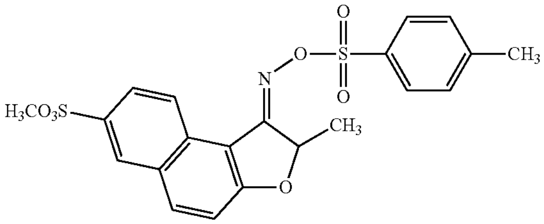
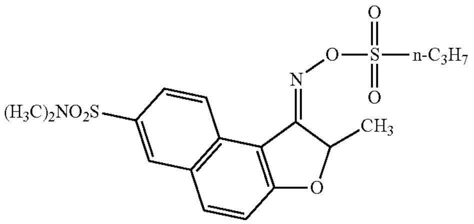
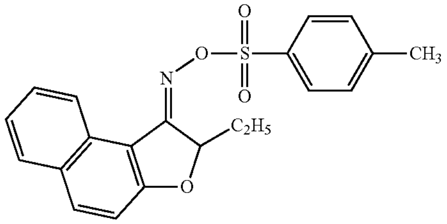
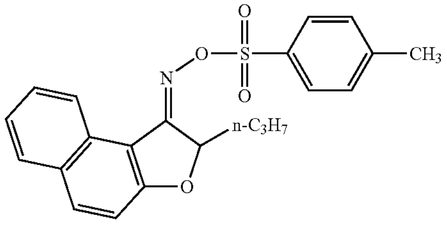
-continued
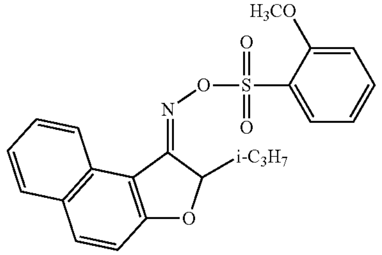
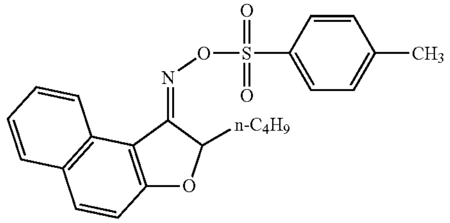
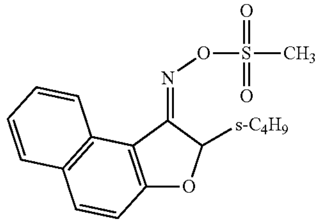
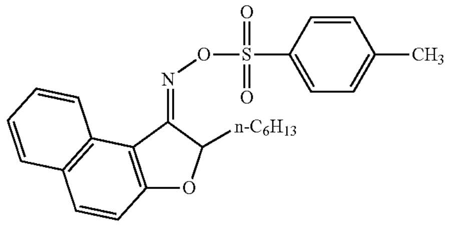
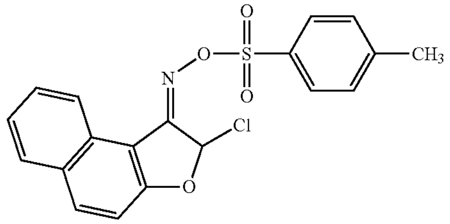
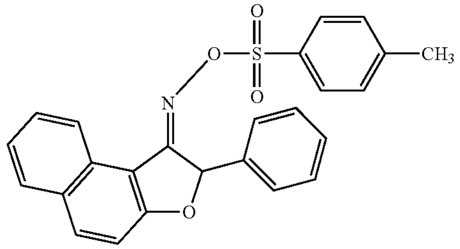
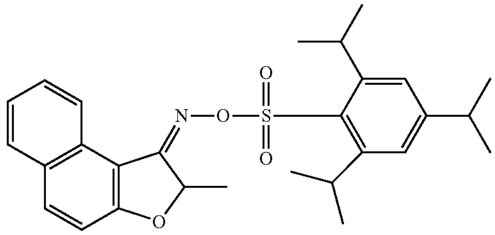

-continued
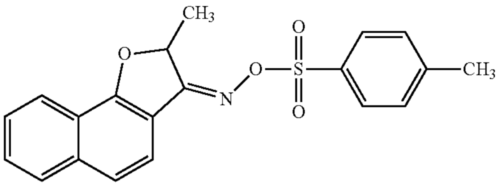
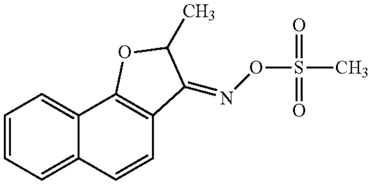
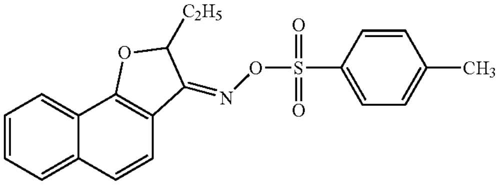
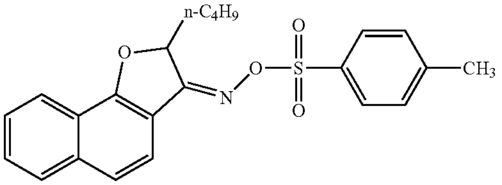
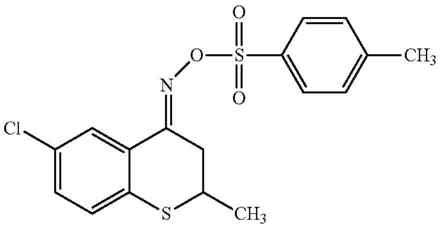
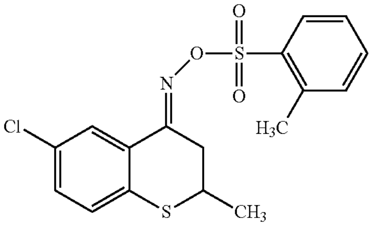
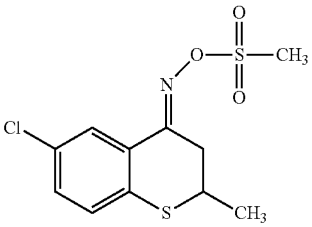
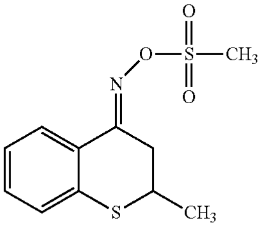
-continued
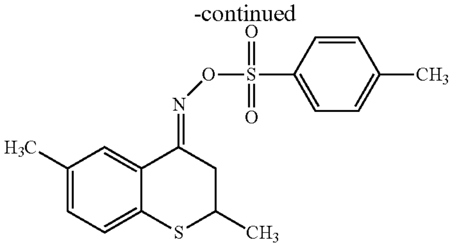
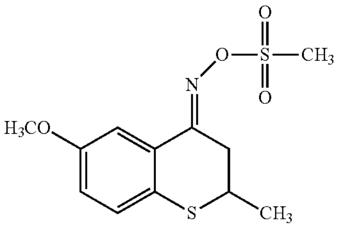
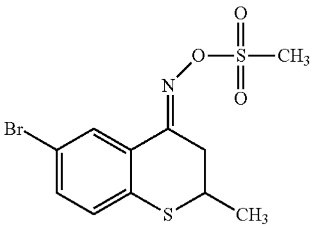
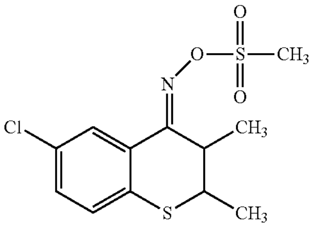
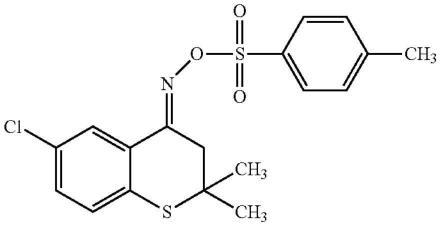
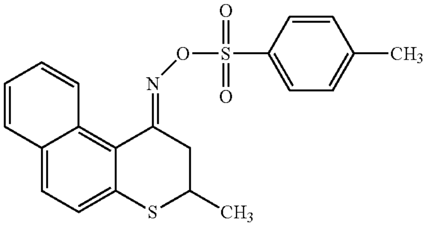
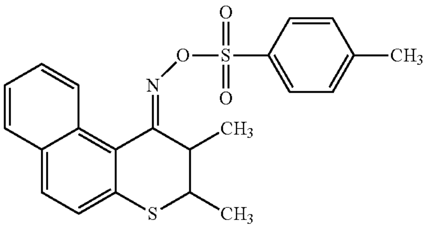

-continued

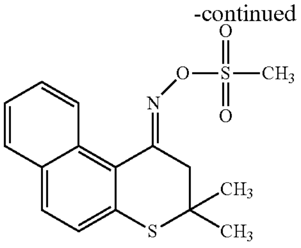

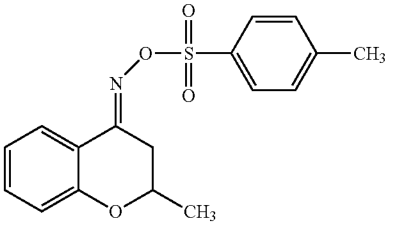

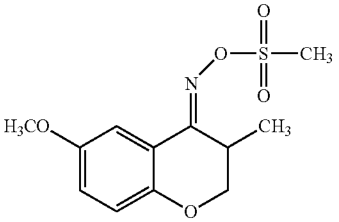

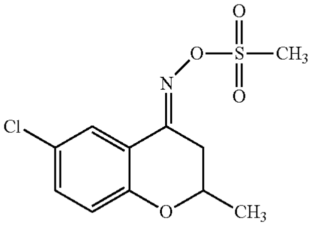

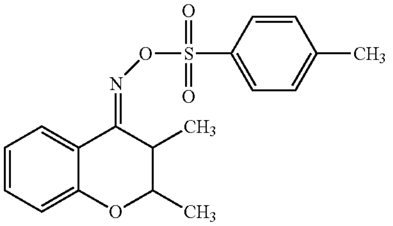

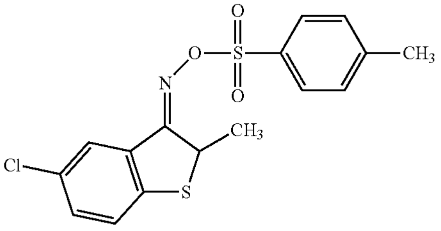

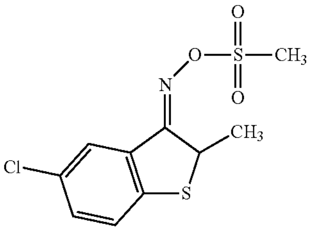

-continued

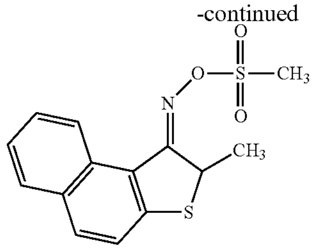

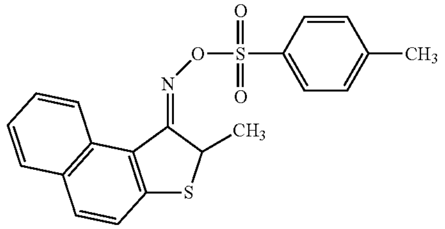

As another preferred aspect of an oxime sulfonate compound which includes at least one oxime sulfonate group, a compound represented by the following Formula (OS-101) is exemplified.

(OS-101)

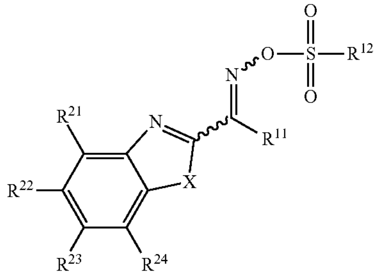

In Formula (OS-101), $R^{11}$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^{12}$ represents an alkyl group or an aryl group.

X represents —O—, —S—, —NH—, —$NR^{15}$—, —$CH_2$—, —$CR^{16}H$—, or —$CR^{16}R^{17}$—, and $R^{15}$ to $R^{17}$ each independently represent an alkyl group or an aryl group.

$R^{21}$ to $R^{24}$ each independently represent a hydrogen atom, a halogen atom, an alkyl group, an alkenyl group, an alkoxy group, an amino group, an alkoxycarbonyl group, an alkylcarbonyl group, an arylcarbonyl group, an amide group, a sulfo group, a cyano group, or an aryl group. Two of $R^{21}$ to $R^{24}$ may be bonded to each other to form a ring.

As $R^{21}$ to $R^{24}$, a hydrogen atom, a halogen atom, or an alkyl group is preferable and an aspect in which at least two of $R^{21}$ to $R^{24}$ are bonded to each other to form an aryl group is preferably exemplified. Among these, from the viewpoint of sensitivity, an aspect in which all of $R^{21}$ to $R^{24}$ represent a hydrogen atom is preferable.

Any of the above-described substituents may further include a substituent.

It is more preferable that the compound represented by Formula (OS-101) above is a compound represented by the following Formula (OS-102).

(OS-102)

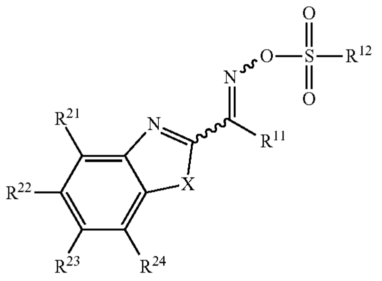

In Formula (OS-102), $R^{11}$, $R^{12}$, and $R^{21}$ to $R^{24}$ respectively have the same definitions as those for $R^{11}$, $R^{12}$, and $R^{21}$ to $R^{24}$ in Formula (SO-101), and preferred examples are the same as each other.

Among these, an aspect in which $R^{11}$ in Formulae (OS-101) and (OS-102) represents a cyano group or an aryl group is more preferable and an aspect which is represented by Formula (OS-102) and $R^{11}$ represents a cyano group, a phenyl group, or a naphthyl group is most preferable.

Moreover, the above-described oxime sulfonate compound may have one or a mixture of steric structures (E, Z, and the like) of oxime or a benzothiazole ring.

Hereinafter, specific examples (exemplary compounds b-1 to b-34) of the compounds represented by Formula (OS-101) which can be suitably used in the present invention will be shown, but the present invention is not limited thereto. Further, in the specific examples, Me represents a methyl group, Et represents an ethyl group, Bn represents a benzyl group, and Ph represents a phenyl group.

b-1

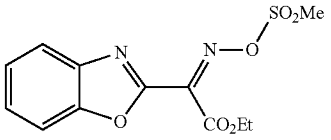

b-2

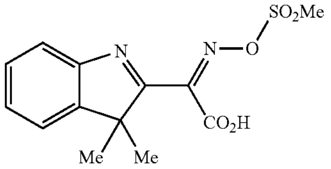

b-3

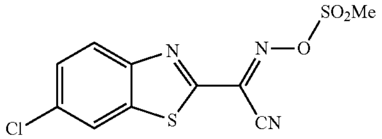

b-4

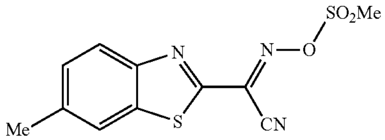

b-5

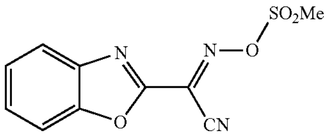

-continued b-6

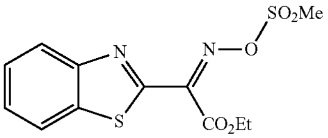

b-7

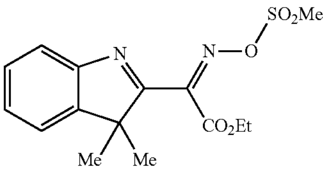

b-8

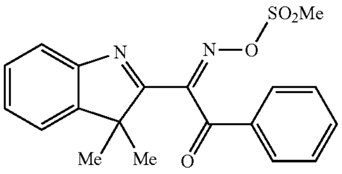

b-9

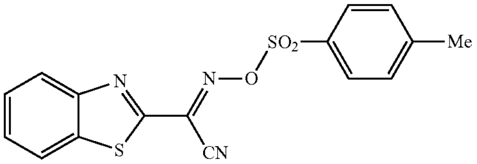

b-10

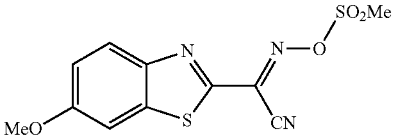

b-11

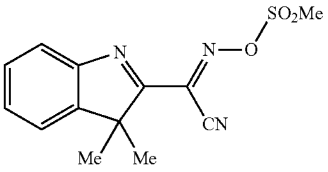

b-12

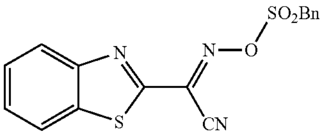

b-13

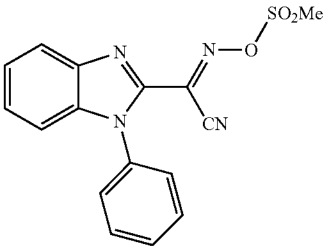

b-14

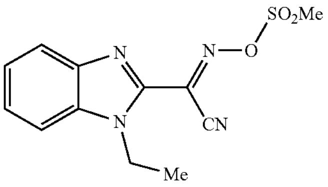

-continued
b-15
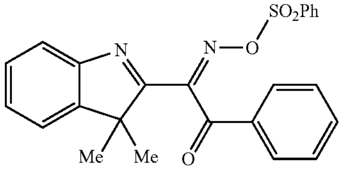
b-16
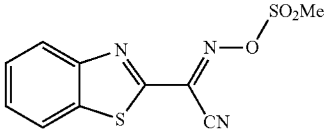
b-17
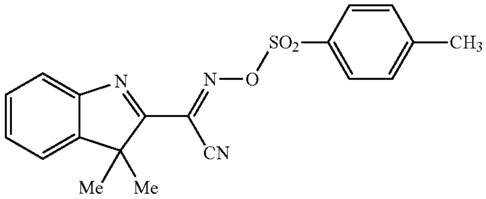
b-18
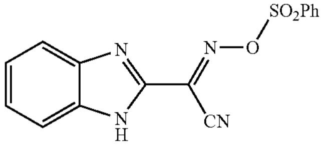
b-19
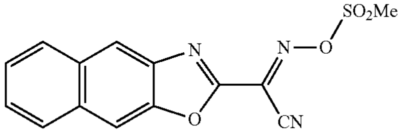
b-20
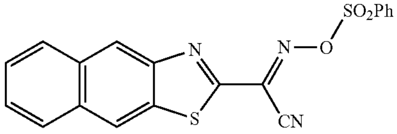
b-21
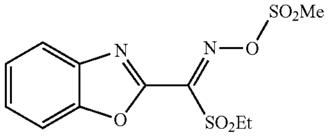
b-22
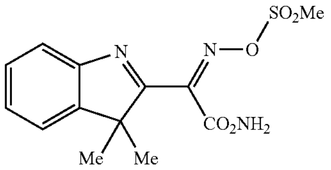
b-23
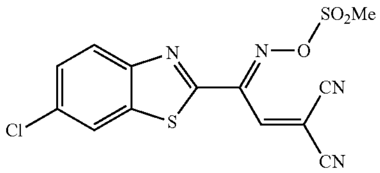
-continued
b-24
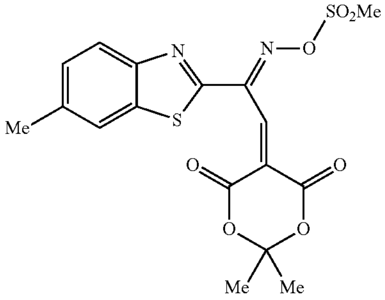
b-25
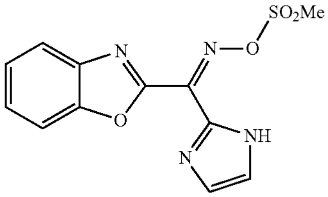
b-26
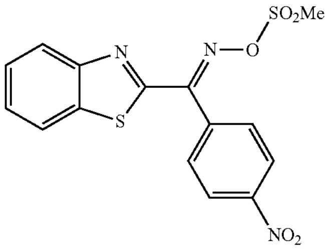
b-27
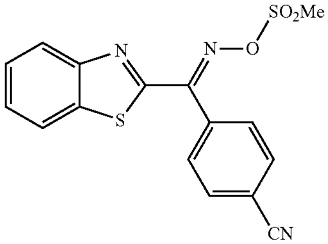
b-28
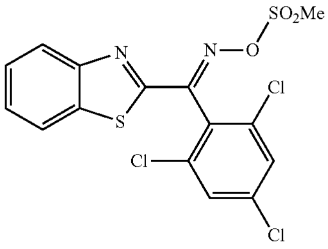
b-29
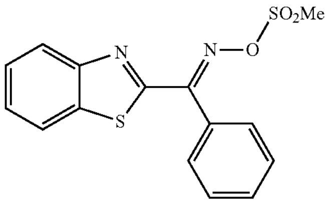

-continued b-30

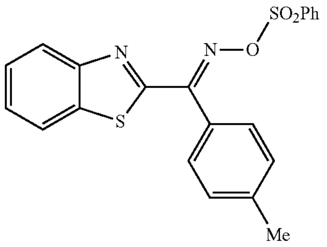

b-31

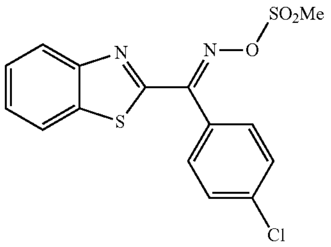

b-32

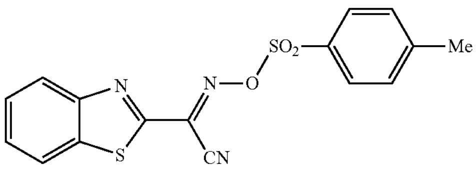

b-33

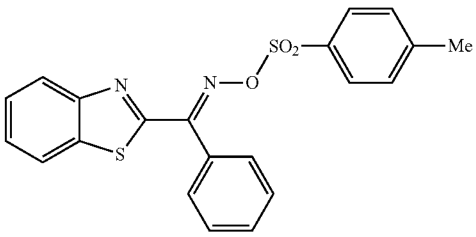

b-34

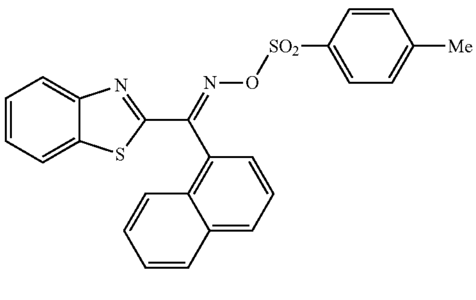

Among the above-described compounds, from the viewpoint of compatibility of sensitivity and stability, compounds b-9, b-16, b-31, and b-33 are preferable.

Examples of commercially available products thereof include WPAG-336 (manufactured by Wako Pure Chemical Industries, Ltd.), WPAG-443 (the following structure, manufactured by Wako Pure Chemical Industries, Ltd.), and MBZ-101 (the following structure, manufactured by Midori Kagaku Co., Ltd.).

A compound represented by Formula (ZV) is exemplified as the imide sulfonate compound.

(ZV)

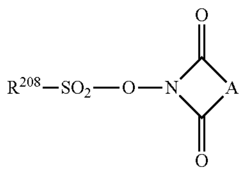

In Formula (ZV), $R^{208}$ represents an alkyl group or an aryl group. A represents an alkylene group, an alkenylene group, or an arylene group. In a case where the alkyl group is a cyclic alkyl group, a ring may be formed through a carbonyl group.

It is preferable that the alkyl group as $R^{208}$ is a linear alkyl group or a cyclic alkyl group. It is preferable that $R^{208}$ represents a linear or branched alkyl group or an aryl group. These groups may or may not be substituted. In addition, in a case where the alkyl group is a cyclic alkyl group, a ring may be formed through a carbonyl group and a cyclic alkyl group may be polycyclic. Preferred examples thereof include a linear or branched alkyl group having 1 to 10 carbon atoms (for example, a methyl group, an ethyl group, a propyl group, a butyl group, or a pentyl group) and a cycloalkyl group having 3 to 10 carbon atoms (for example, a cyclopentyl group, a cyclohexyl group, or a norbornyl group). The alkyl group as $R^{208}$ may be further substituted with, for example, a halogen atom, an alkoxy group (for example, an alkoxy group having 1 to 5 carbon atoms), a hydroxyl group, a cyano group and/or a nitro group.

It is preferable that the aryl group as $R^{208}$ is a phenyl group or a naphthyl group.

The aryl group as $R^{208}$ may be further substituted with a halogen atom, an alkoxy group (for example, an alkoxy group having 1 to 5 carbon atoms), a hydroxyl group, a cyano group and/or a nitro group, and preferred examples thereof include a linear or branched alkyl group having 1 to 10 carbon atoms (for example, a methyl group, an ethyl group, a propyl group, an isopropyl group, a butyl group, or a pentyl group) and a cycloalkyl group having 3 to 10 carbon atoms (for example, a cyclopentyl group, a cyclohexyl group, or a norbornyl group).

Examples of the alkylene group as A include an alkylene group having 1 to 12 carbon atoms (for example, a methylene group, an ethylene group, a propylene group, an isopropylene group, a butylene group, or an isobutylene group). Examples of the alkenylene group as A include an alkenylene group having 2 to 12 carbon atoms (for example, an ethenylene group, a propenylene group, or a butenylene group). Examples of the arylene group as A include an arylene group having 6 to 10 carbon atoms (for example, a phenylene group, a tolylene group, or a naphthylene group). Among these, a naphthylene group is a preferred example in a case where i-line is used as the exposure wavelength.

Hereinafter, examples of the imide sulfonate compound will be described, but the present invention is not limited thereto.

-continued
(I-1)
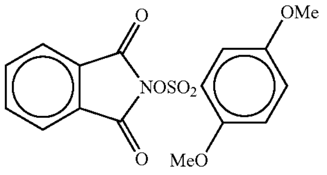
(I-2)
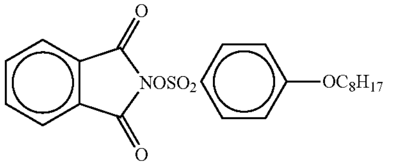
(I-3)
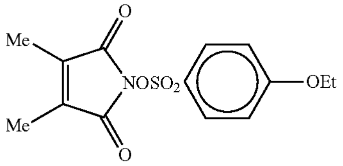
(I-4)
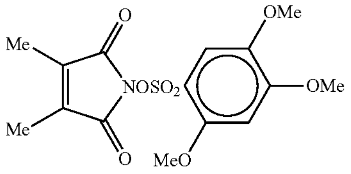
(I-5)
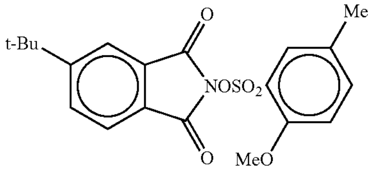
(I-6)
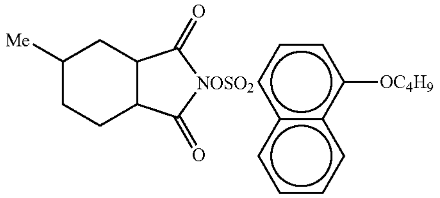
(I-7)
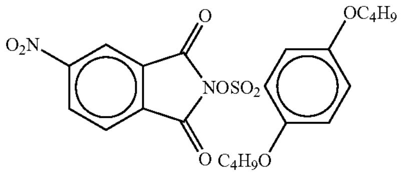
(I-8)
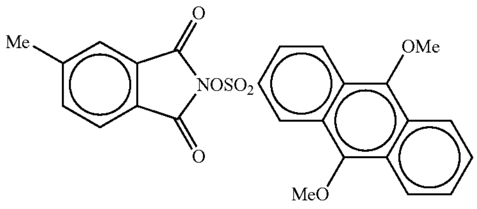
(I-9)
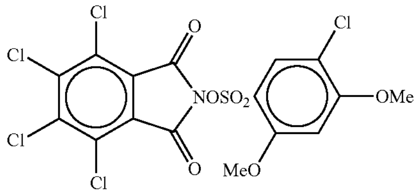
(I-10)
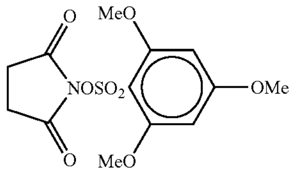
(I-11)
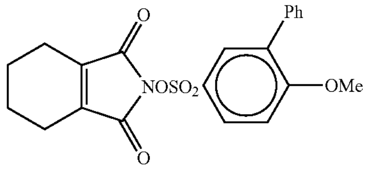
(I-12)
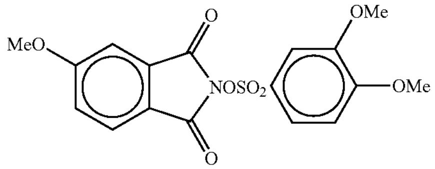
(I-13)
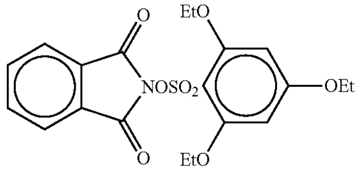
(I-14)
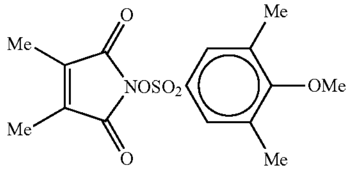
(I-15)
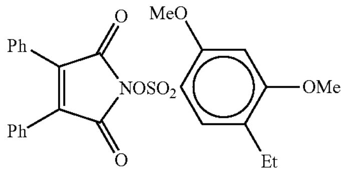
(I-16)
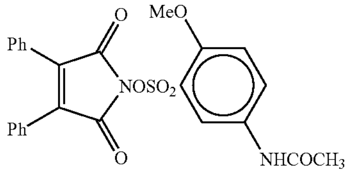

-continued (I-17)

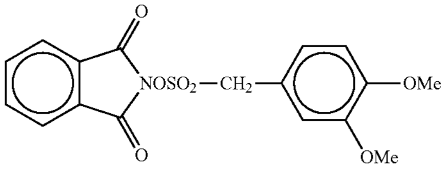

(I-18)

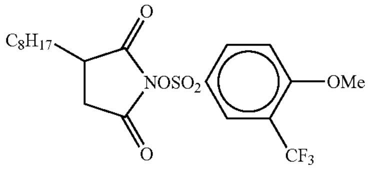

(I-19)

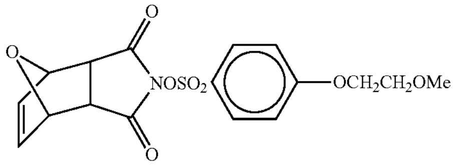

(I-20)

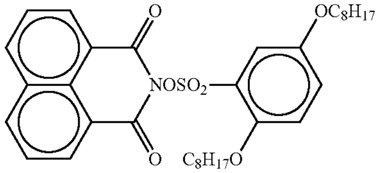

(I-21)

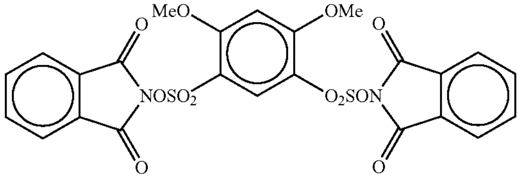

(I-22)

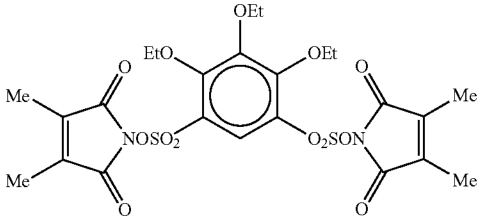

(I-23)

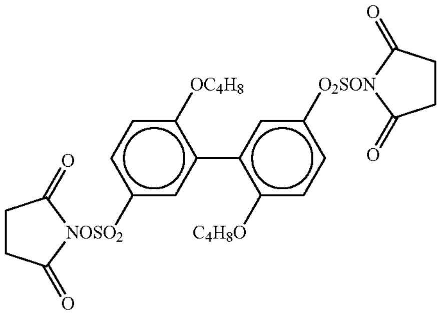

-continued

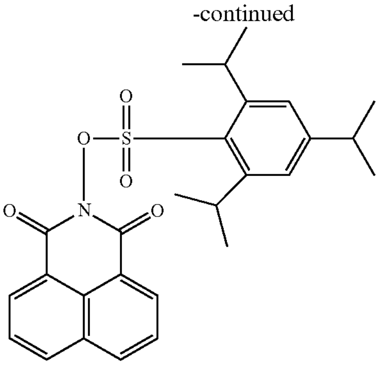

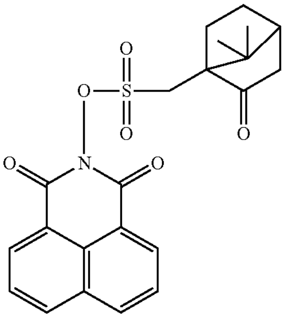

(ii) Sulfonium Salt, Iodonium Sulfonium Salt, or Iodonium Salt (ii) A sulfonium salt, an iodonium sulfonium salt, or an iodonium salt is not particularly limited as long as a compound has non-nucleophilic anions and generates an organic acid having a pKa of −1 or less by being photodegraded, but it is desirable that a sulfonate anion, a sulfonyl imide anion, a bis(alkylsulfonyl)imide anion, and a tris(alkylsulfonyl)methyl anion are included as the anions.

More preferably, compounds represented by the following Formulae (ZI), (ZII), and (ZIII) can be exemplified.

(ZI)

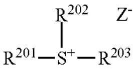

(ZII)

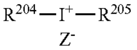

In Formula (ZI), $R^{201}$, $R^{202}$, and $R^{203}$ each independently represent an organic group.

The number of carbon atoms of the organic group as $R^{201}$, $R^{202}$, and $R^{203}$ is typically in a range of 1 to 30 and preferably in a range of 1 to 20.

Further, two of $R^{201}$ to $R^{203}$ may be bonded to each other to form a ring or may include an oxygen atom, a sulfur atom, an ester bond, an amide bond, or a carbonyl group in a ring. As a ring formed by two of $R^{201}$ to $R^{203}$ being bonded to each other, an alkylene group (for example, a butylene group or a pentylene group) can be exemplified.

As Z−, a sulfonate anion (such as an aliphatic sulfonate anion, an aromatic sulfonate anion, or a camphorsulfonate anion), a carboxylate anion (such as an aliphatic carboxylate anion, an aromatic carboxylate anion, or an aralkyl carboxylate anion), a sulfonylimide anion, a bis(alkylsulfonyl)imide anion, or a tris(alkylsulfonyl)methide anion can be exemplified.

An aliphatic moiety in an aliphatic sulfonate anion and an aliphatic carboxylate anion may be an alkyl group or a cycloalkyl group, and preferred examples thereof include a linear or branched alkyl group having 1 to 30 carbon atoms or a cycloalkyl group having 3 to 30 carbon atoms.

Preferred examples of an aromatic group in an aromatic sulfonate anion and an aromatic carboxylate anion include an aryl group having 6 to 14 carbon atoms such as a phenyl group, a tolyl group, or a naphthyl group.

The alkyl group and the aryl group described above may include a substituent. Specific examples thereof include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). As an aryl group and a ring structure included in each group, an alkyl group (preferably having 1 to 15 carbon atoms) can be further exemplified as a substituent.

Preferred examples of an aralkyl group in an aralkyl carboxylate anion include an aralkyl group having 7 to 12 carbon atoms such as a benzyl group, a phenethyl group, a naphthylmethyl group, a naphthylethyl group, or a naphthylbutyl group.

As a sulfonylimide anion, a saccharin anion can be exemplified.

As an alkyl group in a bis(alkylsulfonyl)imide anion and a tris(alkylsulfonyl)methide anion, an alkyl group having 1 to 5 carbon atoms is preferable. Examples of the substituents of these alkyl groups include a halogen atom, an alkyl group substituted with a halogen atom, an alkoxy group, an alkylthio group, an alkyloxysulfonyl group, an aryloxysulfonyl group, and a cycloalkylaryloxysulfonyl group. Among these, a fluorine atom or an alkyl group substituted with a fluorine atom is preferable.

Moreover, alkyl groups in a bis(alkylsulfonyl)imide anion may be bonded to each other and form a ring. In this manner, acid strength increases.

From the viewpoint of suppressing intermixing (interlayer mixing of sulfonium salts and iodonium salts into a protective film) at the time of coating a protective film layer with a photosensitive resin composition, as $Z^-$, it is preferable that a cation includes an aromatic ring group including an alkyl group having 3 or more carbon atoms as a substituent. The number of carbon atoms of the alkyl group is preferably 6 or more and more preferably 8 or more. The alkyl group may be linear, branched, or cyclic and specific examples thereof include groups such as n-propyl, i-propyl, n-butyl, i-butyl, tert-butyl, n-amyl, i-amyl, tert-amyl, n-hexyl, cyclopropyl, cyclobutyl, cyclopentyl, cyclohexyl, n-octyl, and 2-ethylhexyl.

Similarly, as an anion, sulfonate including an alkyl group having 6 or more carbon atoms or sulfonate including an aromatic ring which has an alkyl group having 3 or more carbon atoms as a substituent is preferable.

It is particularly preferable that $Z^-$ represents an anion represented by the following Formula (AN1). When such a configuration is employed, a photoacid generator is unlikely to enter a protective film, which is preferable, in a case where a film containing a water-soluble resin is used as a protective film. This configuration is particularly effective in a case where a resist film is provided on the surface of the protective film.

(AN1)

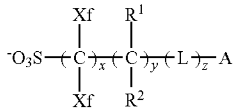

In the formula, Xf's each independently represent a fluorine atom or an alkyl group substituted with at least one fluorine atom.

$R^1$ and $R^2$ each independently represent a hydrogen atom, a fluorine atom, or an alkyl group, and a plurality of $R^1$'s and $R^2$'s may be the same as or different from each other.

L represents a divalent linking group and a plurality of L's may be the same as or different from each other.

A represents a cyclic organic group.

x represents an integer of 0 to 20, y represents an integer of 0 to 10, and z represents an integer of 0 to 10.

Formula (AN1) will be described in detail.

The number of carbon atoms of an alkyl group in the alkyl group substituted with a fluorine atom as Xf is preferably in a range of 1 to 10 and more preferably in a range of 1 to 4.

In addition, it is preferable that the alkyl group substituted with a fluorine atom as Xf is a perfluoroalkyl group. It is preferable that Xf represents a fluorine atom or a perfluoroalkyl group having 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable. It is particularly preferable that both Xf's represent a fluorine atom.

The alkyl group as $R^1$ and $R^2$ may include a substituent (preferably a fluorine atom) and an alkyl group having 1 to 4 carbon atoms is preferable as the alkyl group. A perfluoroalkyl group having 1 to 4 carbon atoms is more preferable. Specific examples of the alkyl group including a substituent as $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F$, $CH_2C_3F_7$, $CH_2CH_2C_3F_7$, $CH_2C_4F_9$, and $CH_2CH_2C_4F_9$. Among these, $CF_3$ is preferable.

It is preferable that $R^1$ and $R^2$ represent a fluorine atom or $CF_3$.

x represents an integer of preferably 0 to 10 and more preferably 0 to 2.

y represents an integer of preferably 0 to 8 and more preferably 0 to 6.

z represents an integer of preferably 0 to 5 and more preferably 0 to 3.

A divalent linking group as L is not particularly limited, and examples thereof include —COO—, —OCO—, —CO—, —O—, —S—, —SO—, —$SO_2$—, an alkylene group, a cycloalkylene group, an alkenylene group, and a linking group to which a plurality of these groups are linked. Among these, a linking group having 12 or less carbon atoms is preferable. Further, —COO—, —OCO—, —CO—, or —O— is preferable and —COO— or —OCO— is more preferable.

The cyclic organic group as A is not particularly limited as long as the cyclic organic group has a ring structure, and examples thereof include an alicyclic group, an aryl group, a heterocyclic group (including those which have or do not have aromaticity).

The alicyclic group may be monocyclic or polycyclic, and a monocyclic cycloalkyl group such as a cyclopentyl group, a cyclohexyl group, or a cyclooctyl group and a polycyclic group such as a norbornyl group, a tricyclodecanyl group, a tetracyclodecanyl group, a tetracyclododecanyl group, or an adamantly group are preferable. Among these, from the viewpoints of suppressing film diffusibility during a post-exposure heating process and improving MEEF, an alicyclic group which has 7 or more carbon atoms and a bulky structure such as a norbornyl group, a tricyclodecanyl group, a tetracyclodecanyl group, a tetracyclododecanyl group, or an adamantly group is preferable.

Examples of the aryl group include a benzene ring, a naphthalene ring, a phenanthrene ring, and an anthracene ring.

Examples of the heterocyclic group include groups derived from a furan ring, a thiophene ring, a benzofuran ring, a benzothiophene ring, a dibenzofuran ring, a dibenzothiophene ring, and a pyridine ring. Among these, groups derived from a furan ring, a thiophene ring, and a pyridine ring are preferable.

Further, as the cyclic organic group, a lactone structure can be exemplified, and specific examples thereof include lactone structures which may be included in the above-described resin (A) and are represented by Formula (LC1-1) to (LC1-17).

The cyclic organic group may include a substituent, and examples of the substituent include a linear or branched alkyl group (alkyl group which may be linear, branched, or cyclic and has preferably 1 to 12 carbon atoms), a cycloalkyl group (cycloalkyl group which may be monocyclic, polycyclic, or spirocyclic and has preferably 3 to 20 carbon atoms), an aryl group (preferably having 6 to 14 carbon atoms), a hydroxy group, an alkoxy group, an ester group, an amide group, a urethane group, an ureido group, a thioether group, a sulfonamide group, and a sulfonic acid ester group. Further, carbon (carbon contributing to formation of a ring) constituting a cyclic organic group may be carbonyl carbon.

As the organic group as $R^{201}$, $R^{202}$, and $R^{203}$, an aryl group, an alkyl group, or a cycloalkyl group can be exemplified.

It is preferable that at least one of $R^{201}$, $R^{202}$, or $R^{203}$ represents an aryl group and more preferable that all of $R^{201}$, $R^{202}$, and $R^{203}$ represent an aryl group. The aryl group may be a heteroaryl group such as an indole residue or a pyrrole residue in addition to a phenyl group or a naphthyl group. Preferred examples of the alkyl group and the cycloalkyl group as $R^{201}$ to $R^{203}$ include a linear or branched alkyl group having 1 to 10 carbon atoms and a cycloalkyl group having 3 to 10 carbon atoms. More preferred examples of the alkyl group include a methyl group, an ethyl group, an n-propyl group, an i-propyl group, and an n-butyl group. More preferred examples of the cycloalkyl group include a cyclopropyl group, a cyclobutyl group, a cyclopentyl group, a cyclohexyl group, and a cycloheptyl group. These groups may further include a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the examples are not limited thereto.

Moreover, in the case where two or $R^{201}$ to $R^{203}$ are bonded to each other and form a ring structure, it is preferable that the ring structure is a structure represented by the following Formula (A1).

(A1)

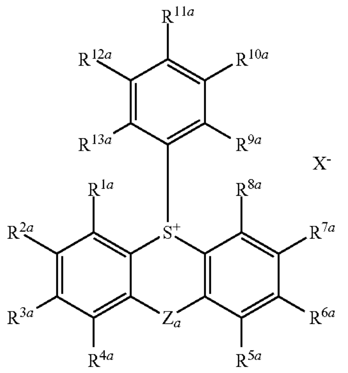

In Formula (A1), $R^{1a}$ to $R^{13a}$ each independently represent a hydrogen atom or a substituent.

It is preferable that one to three of $R^{1a}$ to $R^{13a}$ do not represent a hydrogen atom and more preferable that any one of $R^{9a}$ to $R^{13a}$ does not represent a hydrogen atom.

Za represents a single bond or a divalent linking group.

$X^-$ has the same definition as that for Z in Formula (ZI).

Specific examples of the case where $R^{1a}$ to $R^{13a}$ do not represent a hydrogen atom include a halogen atom, a linear, branched, or cyclic alkyl group, an alkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an amide group, a phosphino group, a phosphinyl group, a phosphinyloxy group, a phosphinylamino group, a phosphono group, a silyl group, a hydrazino group, an ureido group, a boronic acid group (—$B(OH)_2$), a phosphate group (—$OPO(OH)_2$), a sulfato group (—$OSO_3H$), and other known substituents.

In the case where $R^{1a}$ to $R^{13a}$ do not represent a hydrogen atom, a linear, branched, or cyclic alkyl group substituted with a hydroxyl group is preferable.

Examples of the divalent linking group as Za include an alkylene group, an arylene group, a carbonyl group, a sulfonyl group, a carbonyloxy group, a carbonylamino group, a sulfonylamide group, an ether bond, a thioether bond, an amino group, a disulfide group, —$(CH_2)_n$—CO—, $—(CH_2)_n—SO_2—$, $—CH{=}CH—$, an aminocarbonylamino group, and an aminosulfonylamino group (n represents an integer of 1 to 3).

Further, preferred examples of the structure in the case where at least one of $R^{201}$, $R^{202}$, or $R^{203}$ does not represent an aryl group include cation structures such as compounds described in the paragraphs 0046 to 0048 of JP2004-233661A, compounds described in the paragraphs 0040 to 0046 of JP2003-35948A, compounds represented by Formulae (I-1) to (I-70) in the specification of US2003/0224288A1, and compounds represented by Formulae (IA-1) to (IA-54) and (IB-1) to (IB-24) in the specification of US2003/0077540A1.

In Formula (ZII), $R^{204}$ and $R^{205}$ represent an aryl group.

The aryl group as $R^{204}$ and $R^{205}$ has the same definitions as those for the aryl group as $R^{201}$ to $R^{203}$ in the above-described compound (ZI).

The aryl group as $R^{204}$ and $R^{205}$ may include a substituent. Examples of the substituent include the substituents which may be included in the aryl group as $R^{201}$ to $R^{203}$ in the above-described compound (ZI).

Hereinafter, preferred examples of the sulfonium salt, the iodonium sulfonyl salt, or the iodonium salt will be described. It goes without saying that the present invention is not limited thereto. In addition, compounds described in JP2013-214053A can be preferably employed.

(z1)

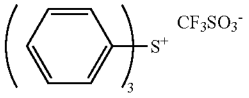

(z2)

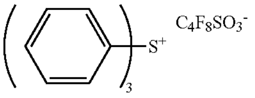

(z3)

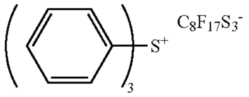

(z4)

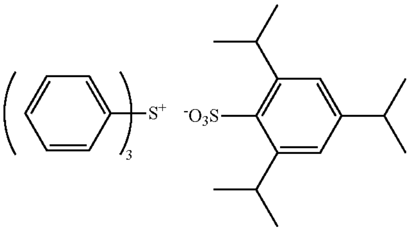

(z5)

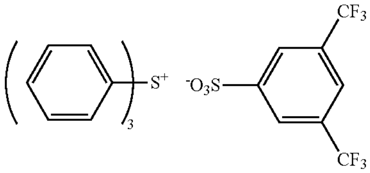

(z6)

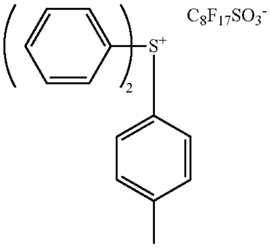

(z7)

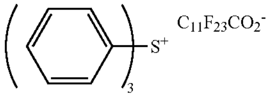

(z8)

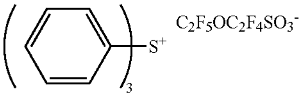

(z9)

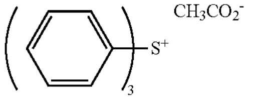

(z10)

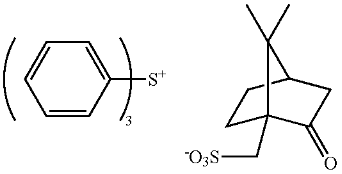

(z11)

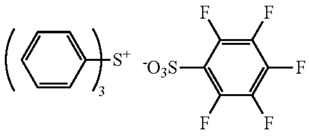

(z12)

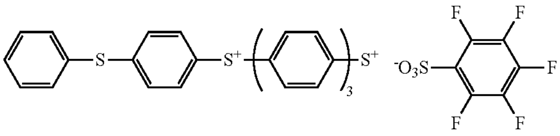

(z13)

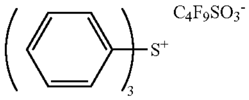

(z14)

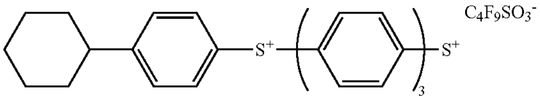

-continued
(z15)
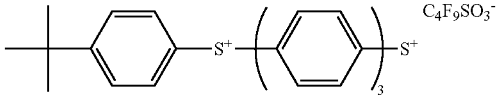
(z16)
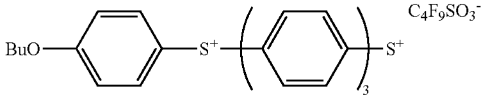
(z17)
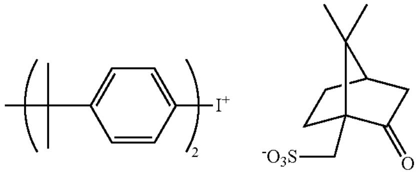
(z18)
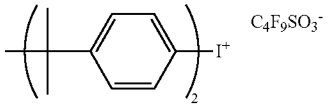
(z19)
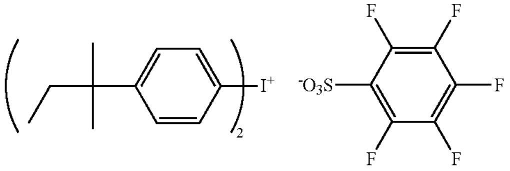
(z20)
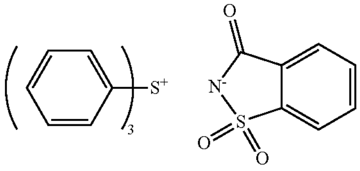
(z21)
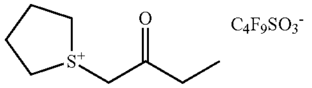
(z22)
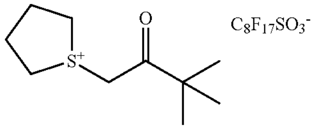
(z23)
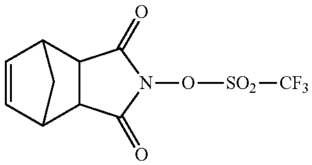
(z24)
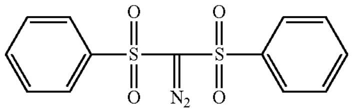
(z25)
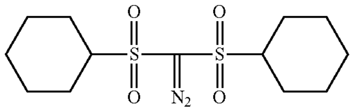
(z26)
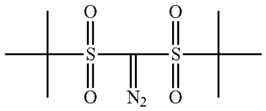
(z27)
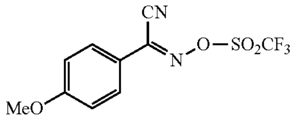
(z28)
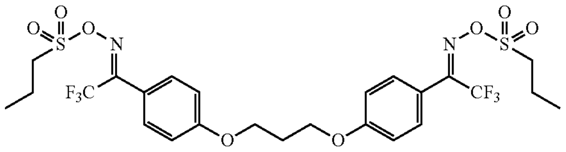
(z29)
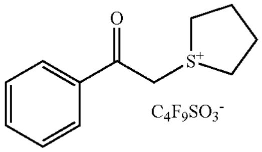
(z30)
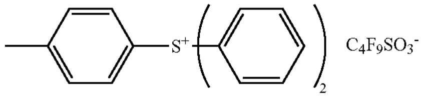
(z31)
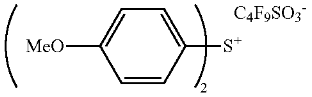
(z32)
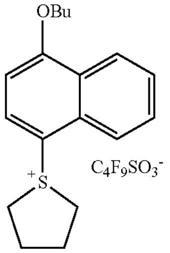

-continued
(z33)
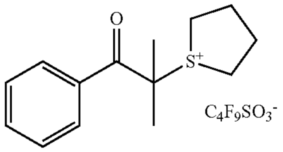
(z34)
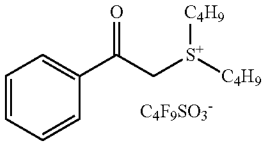
(z35)
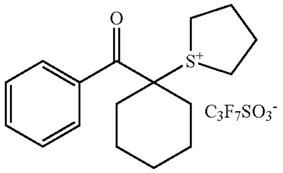
(z36)
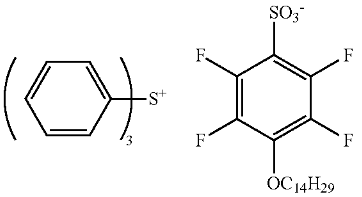
(z37)
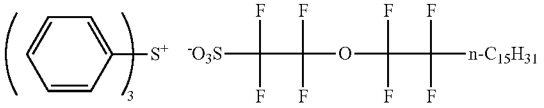
(z38)
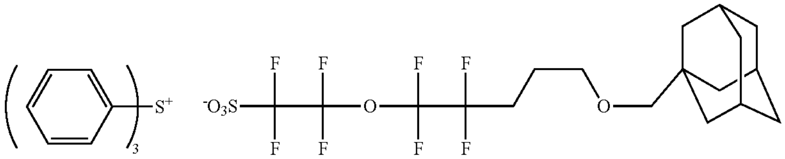
(z39)
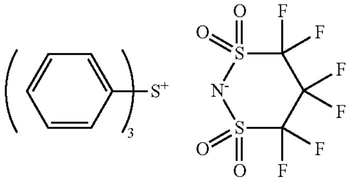
(z40)
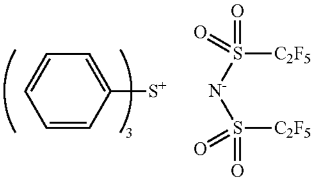
(z41)
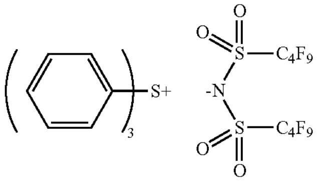
(z42)
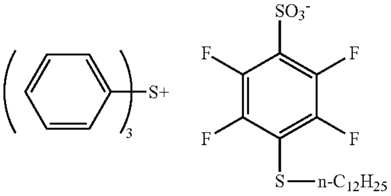
(z43)
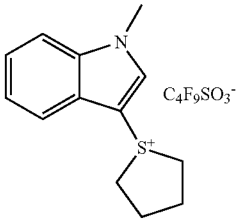
(z44)
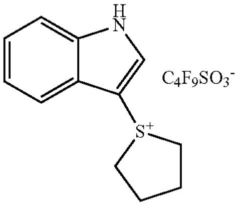
(z45)
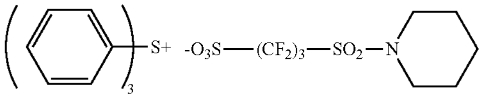
(z46)
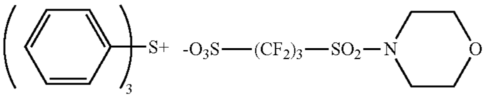
(z47)
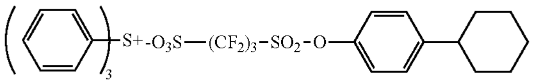
(z48)
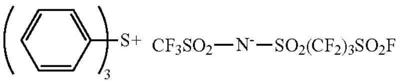
(z49)
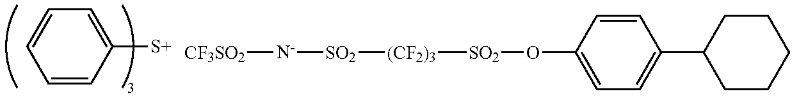

-continued
(z50)
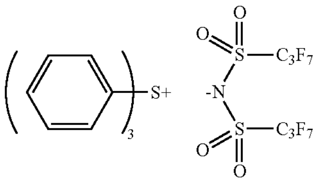
(z51)
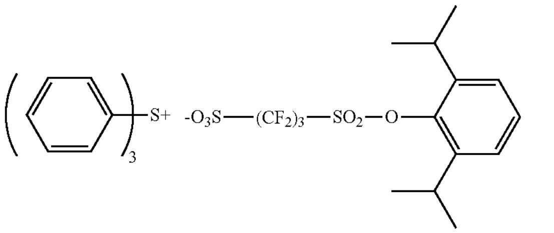
(z52)
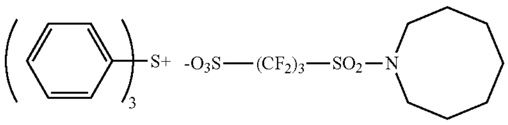
(z53)
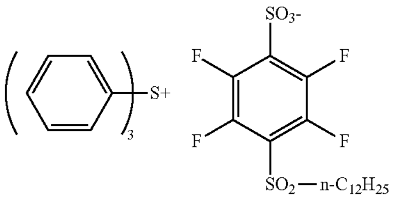
(z54)
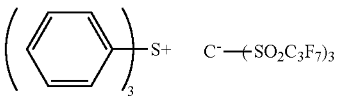
(z55)
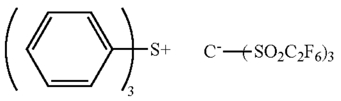
(z56)
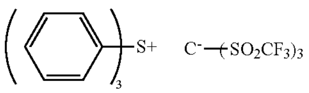
(z57)
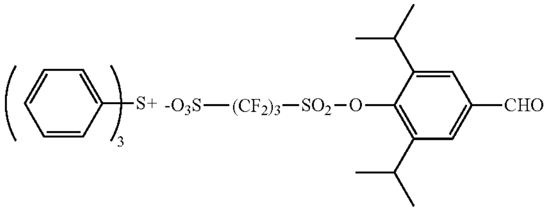
(z58)
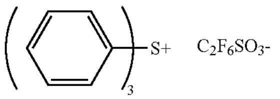
(z59)
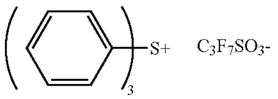
(z60)
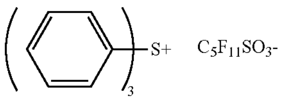
(z61)
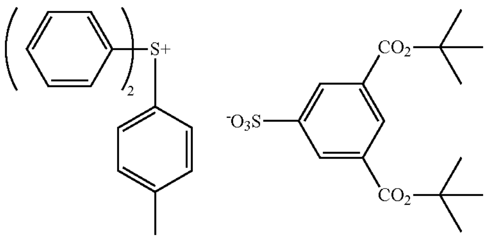
(z62)
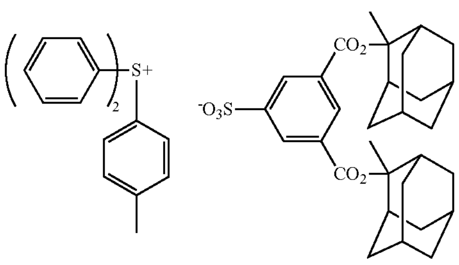
(z63)
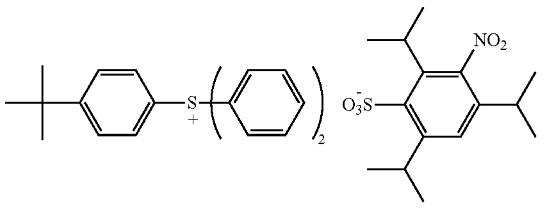

-continued
(z64)
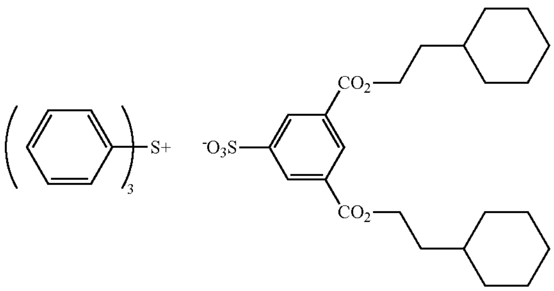
(z65)
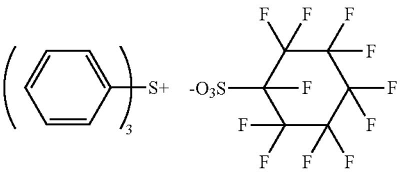
(z66)
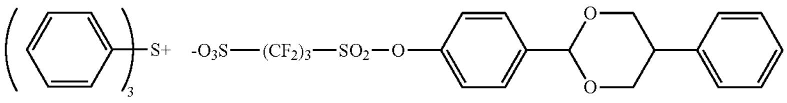
(z67)
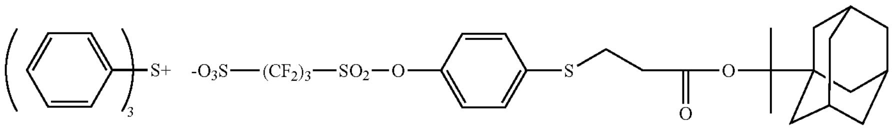
(z68)
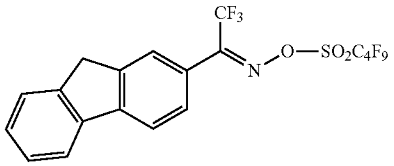
(z69)
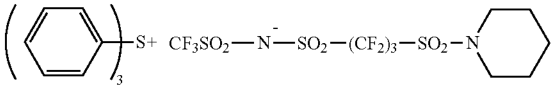
(z70)
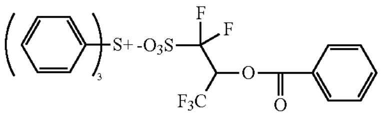
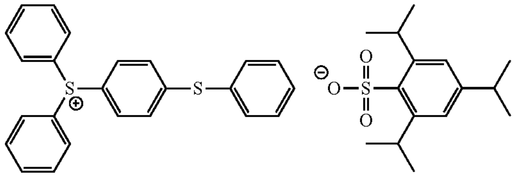
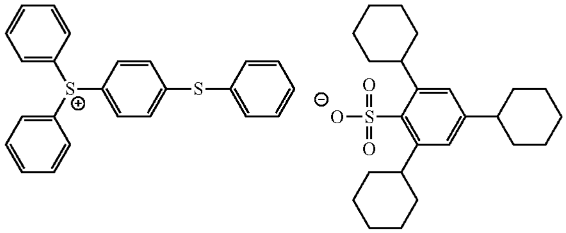
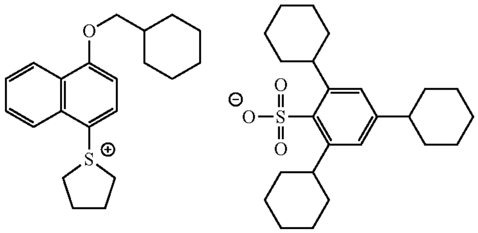
(z82)
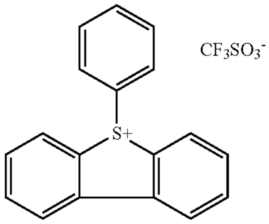
(z83)
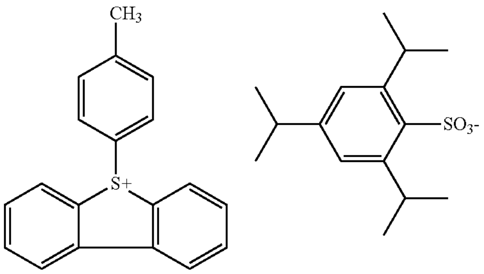

-continued
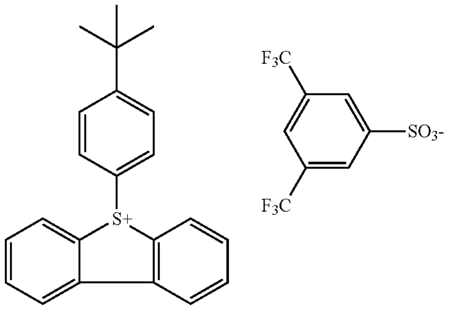
(z84)
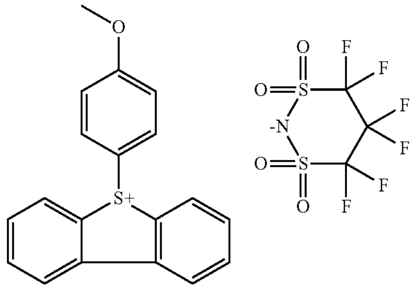
(z85)
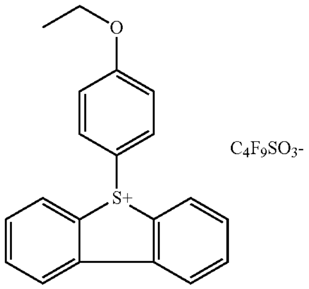
(z86)
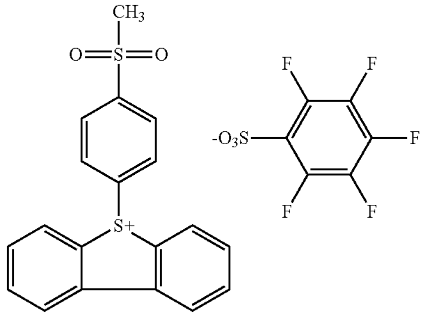
(z87)
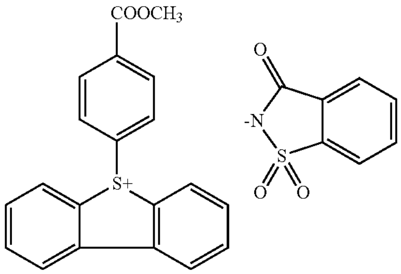
(z88)
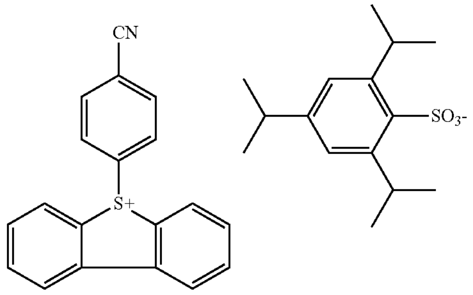
(z89)
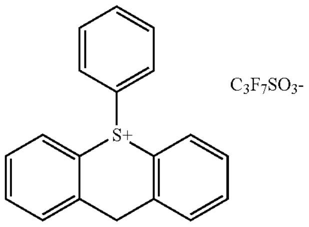
(z90)
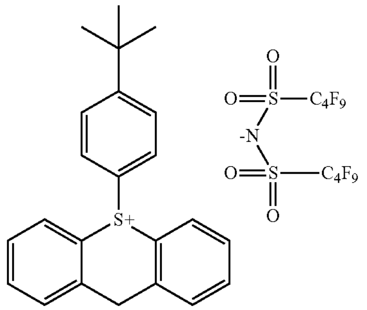
(z91)
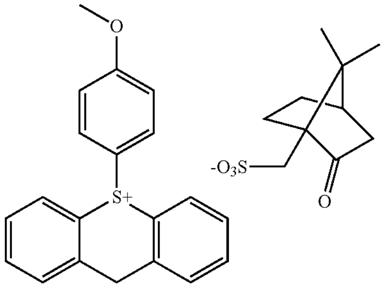
(z92)
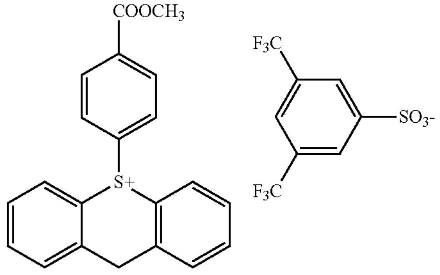
(z93)

-continued
(z94)
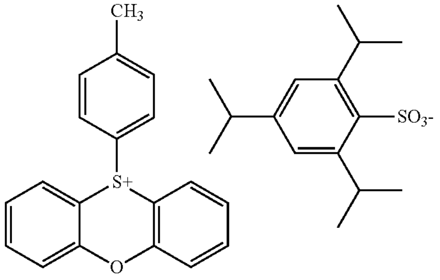
(z95)
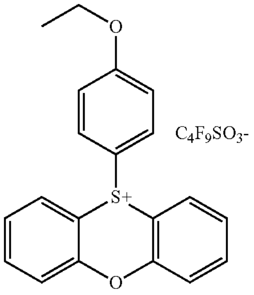
(z96)
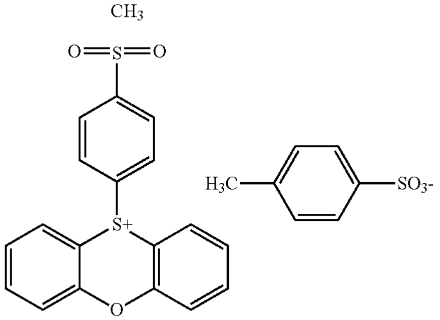
(z97)
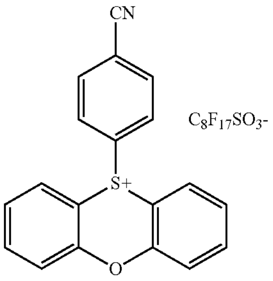
(z98)
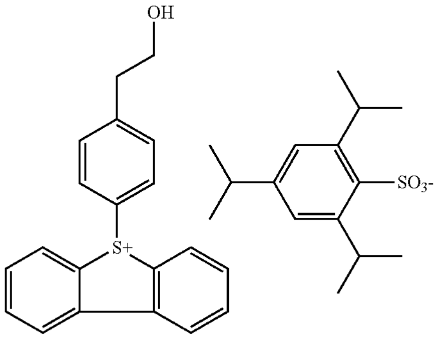
(z99)
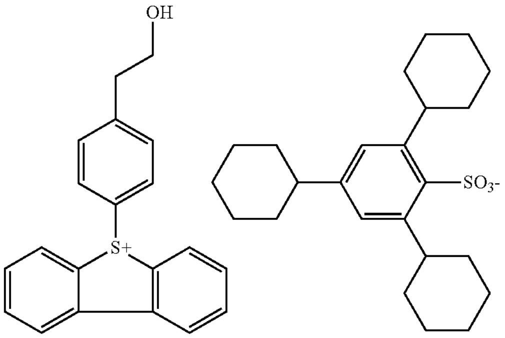
(z100)
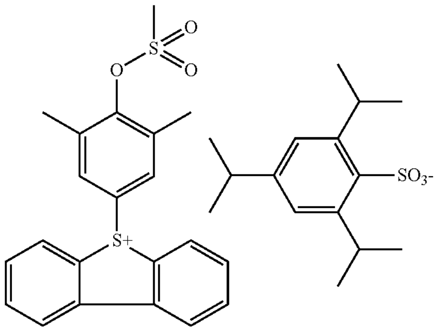
(z101)
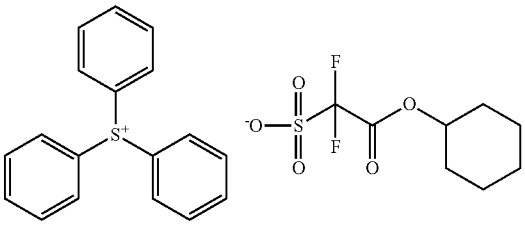
(z102)
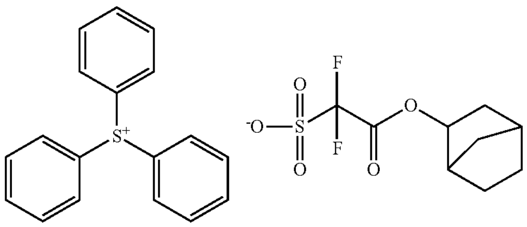
(z103)
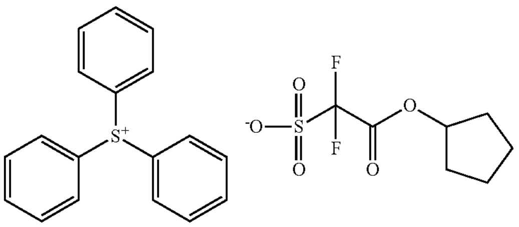

-continued
(z104)
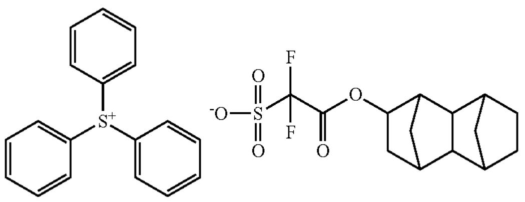
(z105)
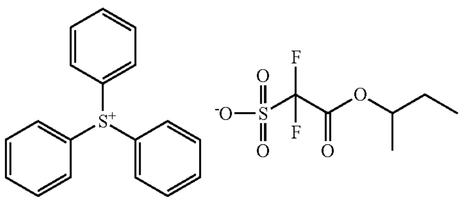
(z106)
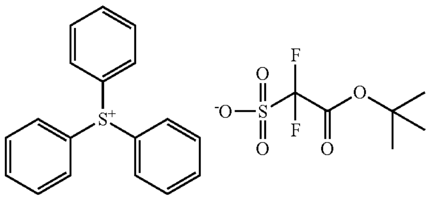
(z107)
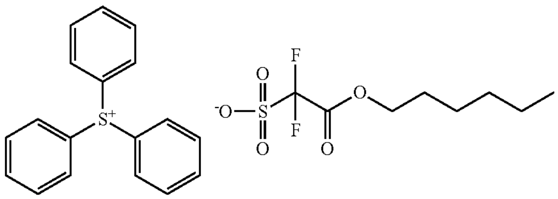
(z108)
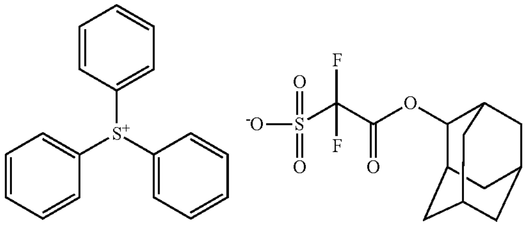
(z109)
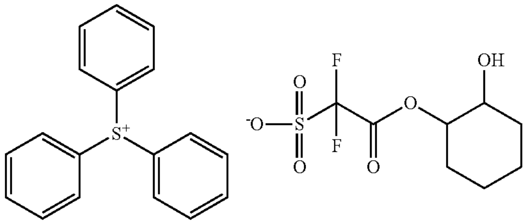
(z110)
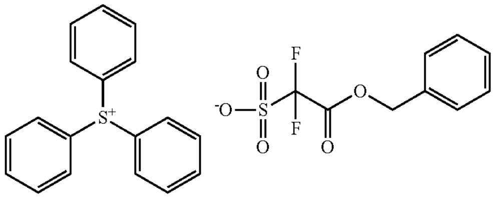
(z111)
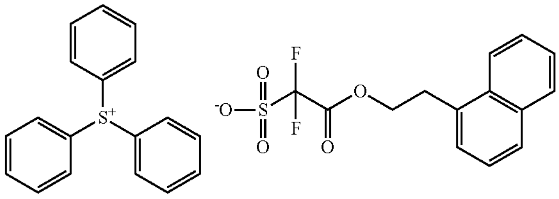
(z112)
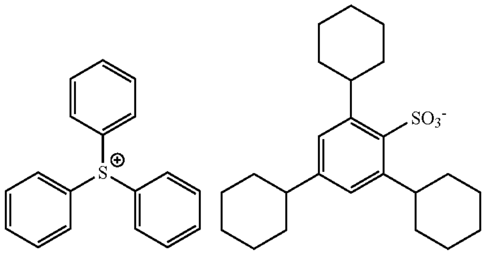
(z113)
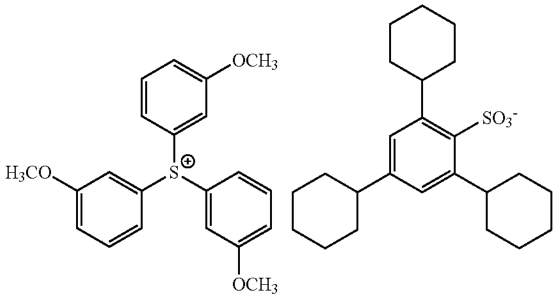
(z114)
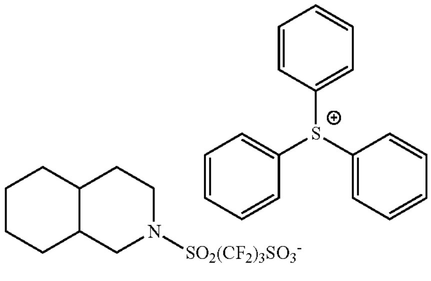

-continued
(z115)
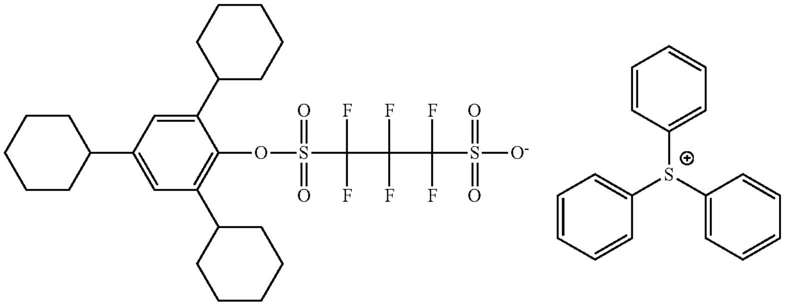
(z116)
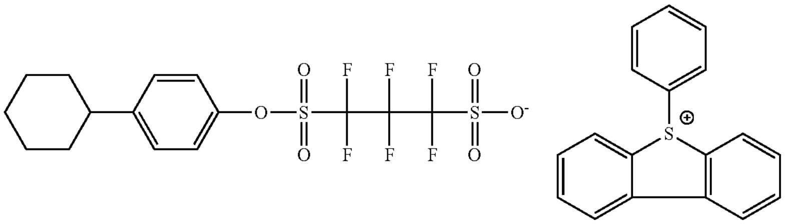
(z117)
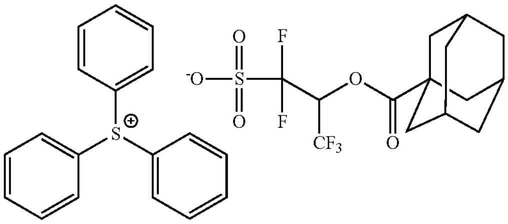
(z118)
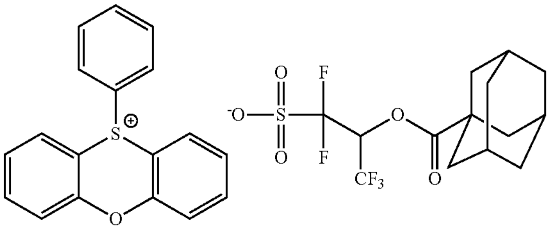
(z119)
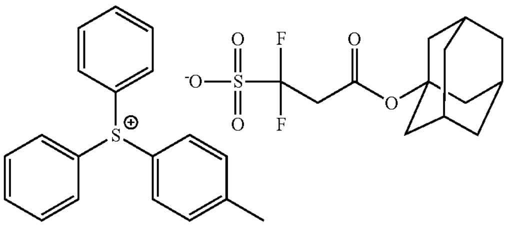
(z120)
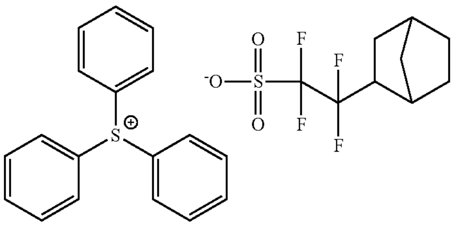
(z121)
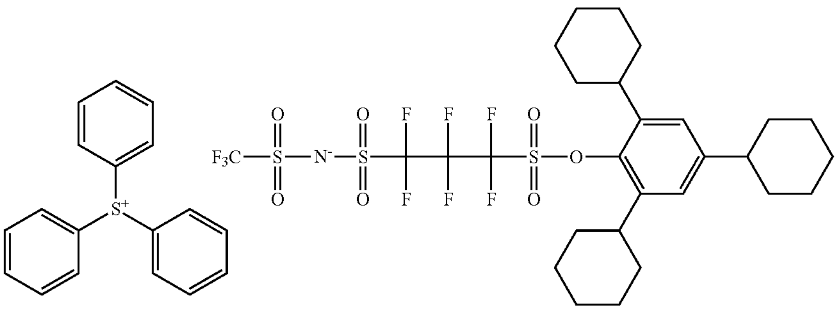

-continued
(z122)
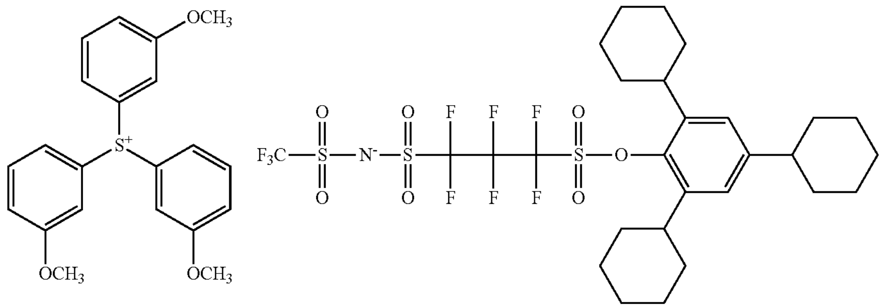
(z123)
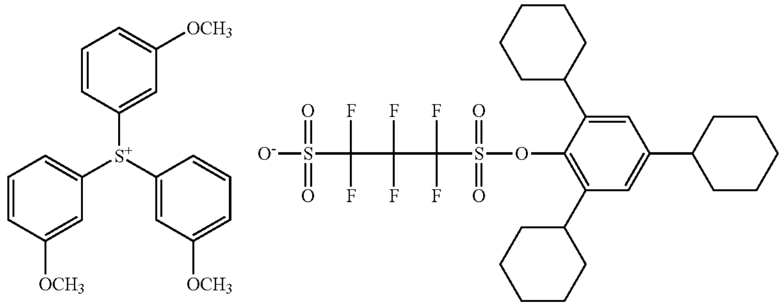
(z124)
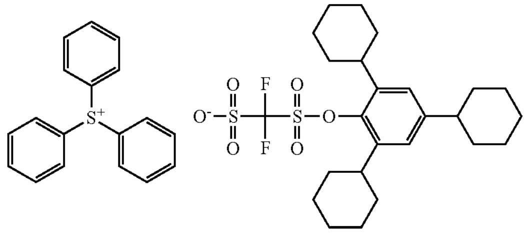
(z125)
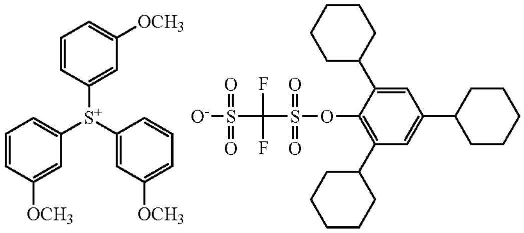
(z126)
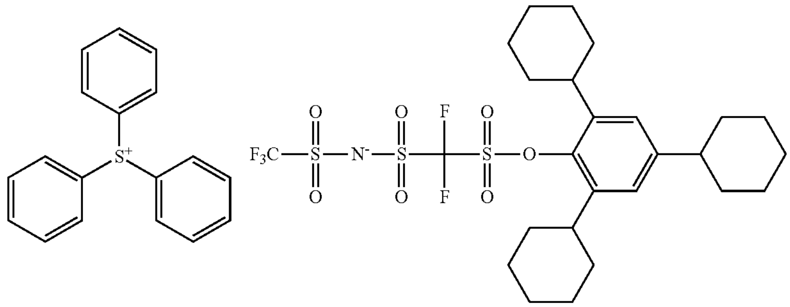
(z127)
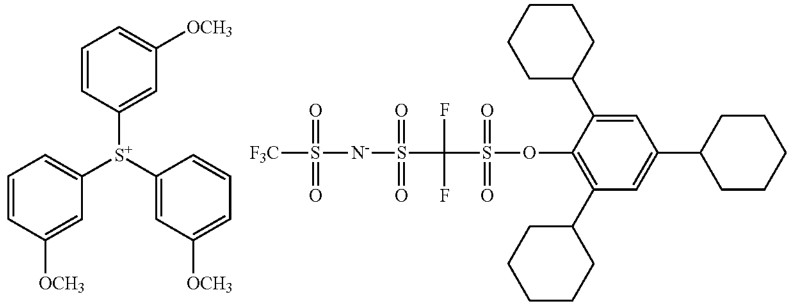

-continued (z128)

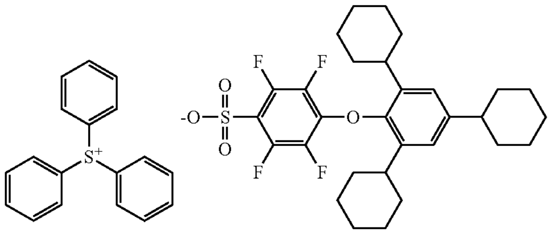

(z129)

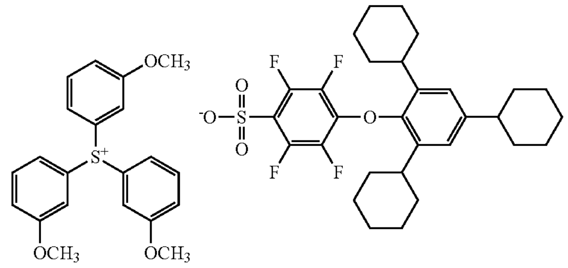

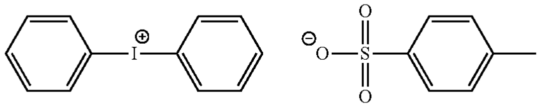

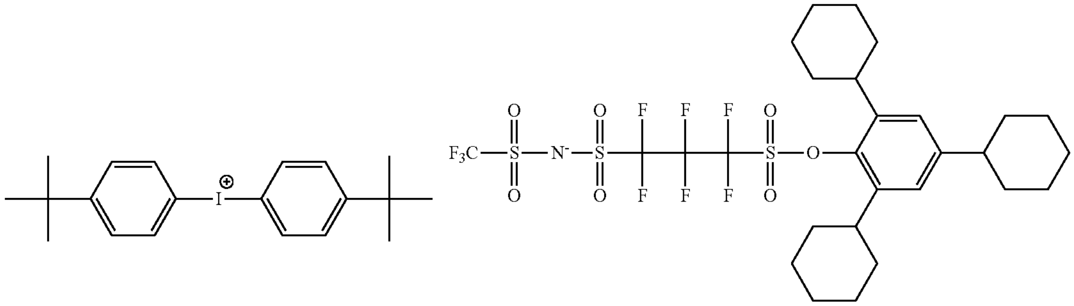 [SMILES: CC(C)(C)c1ccc([I+]c2ccc(C(C)(C)C)cc2)cc1 ; O=S(=O)([N-]S(=O)(=O)C(F)(F)C(F)(F)C(F)(F)S(=O)(=O)Oc1c(C2CCCCC2)cc(C2CCCCC2)cc1C1CCCCC1)C(F)(F)F]

(iii) Diazodisulfone Compound and Disulfone Compound

As the diazodisulfone compound, a compound represented by the following Formula (ZIII) can be exemplified.

(ZIII)

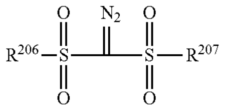

In Formula (ZIII), $R^{206}$ and $R^{207}$ each independently represent an aryl group or an alkyl group.

As the aryl group and the alkyl group as $R^{206}$ and $R^{207}$ have the same definitions as those for the aryl group and the alkyl group as $R^{201}$ to $R^{203}$ in the above-described compound (ZI).

The aryl group and the alkyl group as $R^{206}$ and $R^{207}$ may include a substituent. Examples of the substituent are the same as those which may be included in the aryl group and the alkyl group as $R^{201}$ to $R^{203}$ in the above-described compound (ZI).

Examples of the disulfone compound include compounds represented by the following Formula (ZIV).

$$Ar^3—SO_2—SO_2—Ar^4 \qquad (ZIV)$$

In Formulae (ZIV) to (ZVI), $Ar^3$ and $Ar^4$ each independently represent an aryl group.

Specific examples of the aryl group as $Ar^3$ and $Ar^4$ are the same as those of the aryl group as $R^{201}$, $R^{202}$, and $R^{203}$ in Formula (ZI) described above.

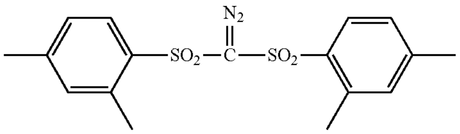

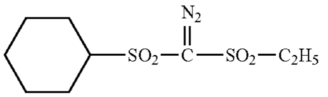

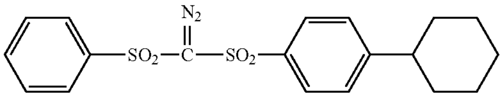

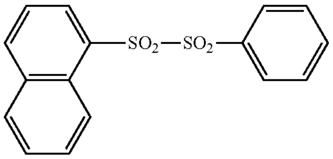

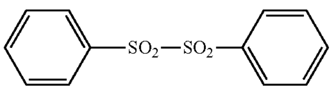

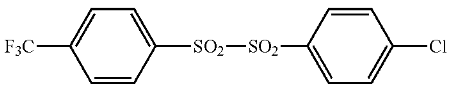

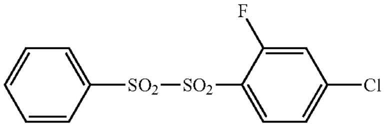

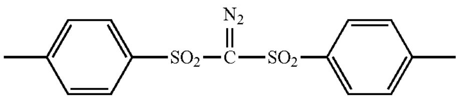

-continued

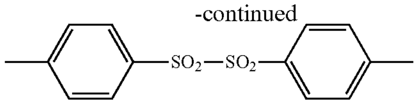

It is preferable that the photosensitive resin composition of the present invention does not contain a 1,2-quinonediazide compound as an acid generator sensitive to active rays. The reason for this is that the 1,2-quinonediazide compound generates a carboxy group using a sequential photochemical reaction, but the quantum yield is 1 or less.

Meanwhile, high sensitivity can be obtained in the present invention by means of using a photoacid generator which is sensitive to active rays to generate an acid, a resin in which decomposition is promoted due to an action of an acid, or a resin in which cross-linking is promoted due to the action of an acid.

The photoacid generator of the present invention may be used alone or in combination of two or more kinds thereof.

In the photosensitive resin composition of the present invention, the acid generator is used by an amount of preferably in a range of 0.1% by weight to 20% by weight and more preferably in a range of 0.5% by weight to 18% by weight with respect to the total content of the photosensitive resin composition.

<Resin (B)>

It is preferable that the resin (B) used in the present invention is a resin (B-1) which includes a repeating unit having a group (hereinafter, also referred to as an "acid-decomposable group") protected by a leaving group that is desorbed by a polar group being decomposed due to the action of an acid and/or a resin (B-2) which includes a repeating unit having a group (hereinafter, also referred to as a "cross-linking group") in which cross-linking occurs between molecular chains of the resin (B) due to the action of an acid. Further, it is preferable to use a resin (B-3) which forms a cross-linked structure between resins using a cross-linking agent.

When the resin (B-1) is used, a composition whose polarity is changed due to an organic acid generated by a photoacid generator so that the rate of dissolution in a developer containing an organic solvent is decreased can be obtained. When the resin (B-2) is used, a composition in which a cross-linking reaction occurs in the resin (B) due to a generated acid that is generated by the photoacid generator (A) so that the rate of dissolution in a developer containing an organic solvent is decreased can be obtained.

In the present invention, a resin that is a combination of the resin (B-1) and the resin (B-2) is preferable.

Hereinafter, the resin (B-1) will be described.

<Acid-Decomposable Group>

The polar group generated by an acid-decomposable group being decomposed due to the action of an acid is not particularly limited as long as the group is hardly soluble or insoluble in a developer containing an organic solvent, and examples thereof include an acid group (group dissociated in a 2.38 mass % tetramethylammonium hydroxide aqueous solution which is used as a developer of a conventional resist) such as a carboxyl group or a sulfonic acid group and a hydroxyl group (such as an alcoholic hydroxyl group or a phenolic hydroxyl group).

In addition, the alcoholic hydroxyl group indicates a hydroxyl group bonded to a hydrocarbon group other than a hydroxyl group (phenolic hydroxyl group) directly bonded to an aromatic ring, and aliphatic alcohol (for example, a fluorinated alcohol group (hexafluoroisopropanol group or the like)) in which the α-position is substituted with an electron-withdrawing group such as a fluorine atom as an acid group is removed. It is preferable that the alcoholic hydroxyl group is a hydroxyl group having a pKa of 12 to 20.

A group preferable as the acid-decomposable group is a group substituted with a group in which hydrogen atoms of the group are desorbed by an acid.

Examples of the group desorbed by an acid include $-C(R^{36})(R^{37})(R^{38})$, $-C(R^{36})(R^{37})(OR^{39})$, and $-C(R^{01})(R^{02})(OR^{39})$.

In the formula above, $R^{36}$ to $R^{39}$ each independently represent an alkyl group, an aryl group, an aralkyl group, or an alkenyl group. $R^{36}$ and $R^{37}$ may be bonded to each other and form a ring. The alkyl group is a linear, branched, or cyclic alkyl group.

$R^{01}$ and $R^{02}$ each independently represent a hydrogen atom, an alkyl group, an aryl group, an aralkyl group, or an alkenyl group.

It is preferable that the linear or branched alkyl group as $R^{36}$ to $R^{39}$, $R^{01}$, and $R^{02}$ is an alkyl group having 1 to 8 carbon atoms, and examples thereof include a methyl group, an ethyl group, a propyl group, an n-butyl group, a sec-butyl group, a hexyl group, and an octyl group.

The cycloalkyl group as $R^{36}$ to $R^{39}$, $R^{01}$, and $R^{02}$ may be monocyclic or polycyclic. A cycloalkyl group having 3 to 8 carbon atoms is preferable as the monocyclic cycloalkyl group, and example thereof include a cyclopropyl group, a cyclobutyl group, a cyclopentyl group, a cyclohexyl group, and a cyclooctyl group. A cycloalkyl group having 6 to 20 carbon atoms is preferable as the polycyclic cycloalkyl group, and examples thereof include an adamantly group, a norbornyl group, an isobornyl group, a camphanyl group, a dicyclopentyl group, an α-pinel group, a tricyclodecanyl group, a tetracyclododecyl group, and an androstanyl group. In addition, at least one carbon atom in the cycloalkyl group may be substituted with a heteroatom such as an oxygen atom.

It is preferable that the aryl group as $R^{36}$ to $R^{39}$, $R^{01}$, and $R^{02}$ is an aryl group having 6 to 10 carbon atoms, and examples thereof include a phenyl group, a naphthyl group, and an anthryl group.

It is preferable that the aralkyl group as $R^{36}$ to $R^{39}$, $R^{01}$, and $R^{02}$ is an aralkyl group having 7 to 12 carbon atoms, and examples thereof include a benzyl group, a phenethyl group, and a naphthylmethyl group.

It is preferable that the aralkenyl group as $R^{36}$ to $R^{39}$, $R^{01}$, and $R^{02}$ is an alkenyl group having 2 to 8 carbon atoms, and examples thereof include a vinyl group, an allyl group, a butenyl group, and a cyclohexenyl group.

As the ring formed by $R^{36}$ and $R^{37}$ being bonded to each other, a cycloalkyl group (monocyclic or polycyclic) is preferable. Preferred examples of the cycloalkyl group include a monocyclic cycloalkyl group such as a cyclopentyl group or a cyclohexyl group; and a polycyclic cycloalkyl group such as a norbornyl group, a tetracyclodecanyl group, a tetracyclododecanyl group, or an adamantly group. A monocyclic cycloalkyl group having 5 or 6 carbon atoms is more preferable and a monocyclic cycloalkyl group having 5 carbon atoms is particularly preferable.

<Repeating Unit Having Acid-Decomposable Group>

It is preferable that the repeating unit having an acid-decomposable group included in the resin (B-1) is a repeating unit represented by the following Formula (III).

(III)

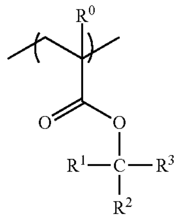

In Formula (III), $R^0$ represents a hydrogen atom or a linear or branched alkyl group.

$R^1$ to $R^3$ each independently represent a linear or branched alkyl group or a monocyclic or polycyclic cycloalkyl group.

Two or $R^1$ to $R^3$ may be bonded to each other and form a monocyclic or polycyclic cycloalkyl group.

The linear or branched alkyl group as $R^0$ may include a substituent, and a linear or branched alkyl group having 1 to 4 carbon atoms is preferable. Examples thereof include a methyl group, an ethyl group, an n-propyl group, an isopropyl group, an n-butyl group, an isobutyl group, and a tert-butyl group. Examples of the substituent include a hydroxyl group and a halogen atom (for example, a fluorine atom).

It is preferable that $R^0$ represents a hydrogen atom, a methyl group, a trifluoromethyl group, or a hydroxymethyl group.

It is preferable that the alkyl group as $R^1$ to $R^3$ is an alkyl group having 1 to 4 carbon atoms such as a methyl group, an ethyl group, an n-propyl group, an isopropyl group, an n-butyl group, an isobutyl group, or a tert-butyl group.

It is preferable that the cycloalkyl group as $R^1$ to $R^3$ is a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantly group.

It is preferable that the cycloalkyl group formed by two of $R^1$ to $R^3$ being bonded to each other is a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantly group. A monocyclic cycloalkyl group having 5 or 6 carbon atoms is particularly preferable.

As one preferred aspect, an aspect in which $R^1$ represents a methyl group or an ethyl group and $R^2$ and $R^3$ are bonded to each other and form the above-described cycloalkyl group can be exemplified.

The respective groups described above may include a substituent, and examples of the substituent include a hydroxyl group, a halogen atom (such as a fluorine atom), an alkyl group (having 1 to 4 carbon atoms), a cycloalkyl group (having 3 to 8 carbon atoms), an alkoxy group (having 1 to 4 carbon atoms), a carboxyl group, and an alkoxycarbonyl group (having 2 to 6 carbon atoms). The number of carbon atoms is preferably 8 or less.

A particularly preferred aspect of the repeating unit represented by Formula (III) described above is an aspect in which $R^1$, $R^2$, and $R^3$ each independently represent a linear or branched alkyl group.

In this aspect, an alkyl group having 1 to 4 carbon atoms is preferable as the linear or branched alkyl group as $R^1$, $R^2$, and $R^3$, and examples thereof include a methyl group, an ethyl group, an n-propyl group, an isopropyl group, an n-butyl group, an isobutyl group, and a tert-butyl group.

As $R^1$, a methyl group, an ethyl group, an n-propyl group, or an n-butyl group is preferable; a methyl group or an ethyl group is more preferable; and a methyl group is particularly preferable.

As $R^2$, a methyl group, an ethyl group, an n-propyl group, an isopropyl group, or an n-butyl group is preferable; a methyl group or an ethyl group is more preferable; and a methyl group is particularly preferable.

As $R^3$, a methyl group, an ethyl group, an n-propyl group, an isopropyl group, an n-butyl group, an isobutyl group, or a tert-butyl group is preferable; a methyl group, an ethyl group, an isopropyl group, or an isobutyl group is more preferable; and a methyl group, an ethyl group, or an isopropyl group is particularly preferable.

Preferred specific examples of the repeating unit having the above-described acid-decomposable group will be described below, but the present invention is not limited thereto.

In the specific examples, Rx represents a hydrogen atom, $CH_3$, $CF_3$, or $CH_2OH$. Rxa and Rxb each independently represent an alkyl group having 1 to 4 carbon atoms. Z represents a substituent. In a case where a plurality of Z's are present, the plurality of Z's may be the same as or different from each other. p represents 0 or a positive integer. Specific examples and preferred examples of Z are the same as those of substituents which may be included in respective groups as $R^1$ to $R^3$.

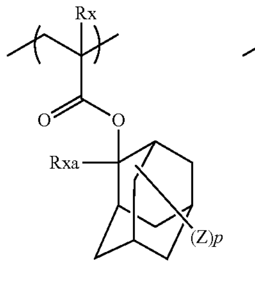

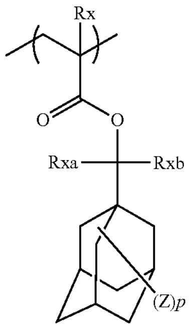

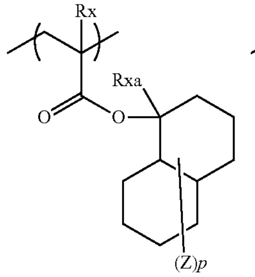

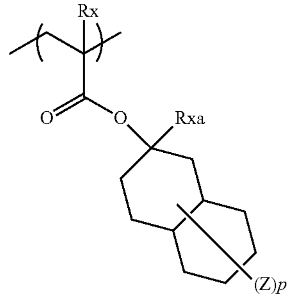

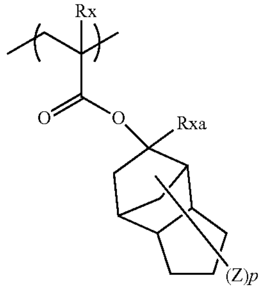

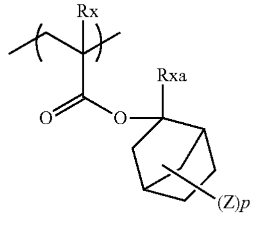

-continued
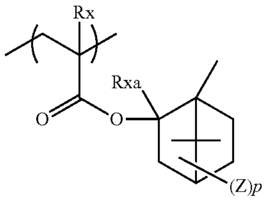
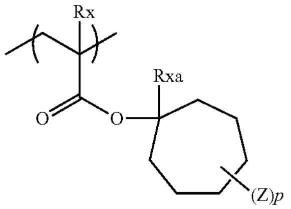
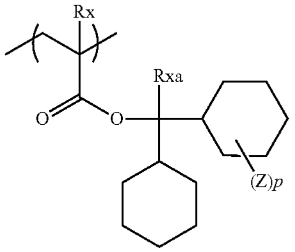
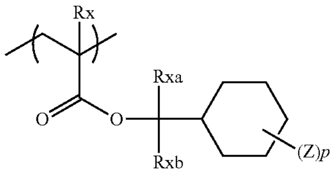
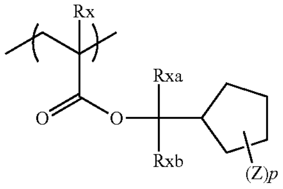
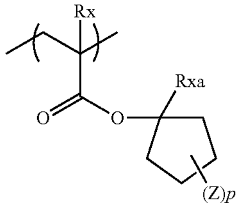
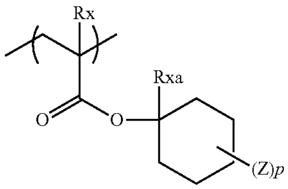
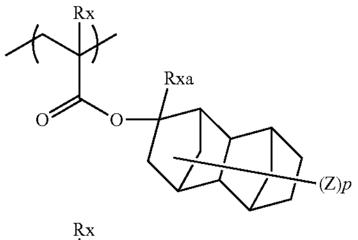
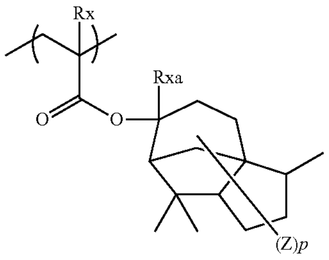
-continued
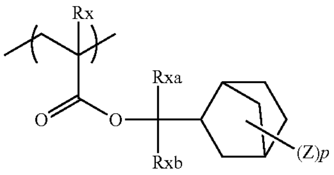
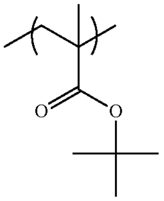
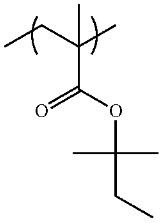
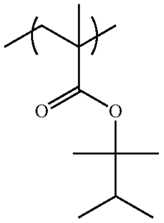
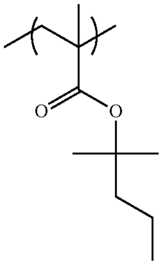
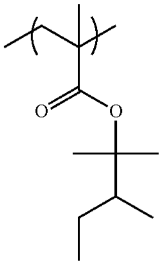
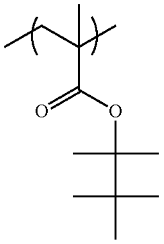
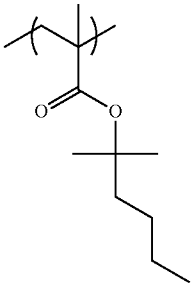
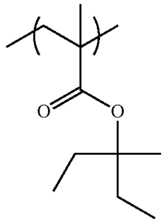
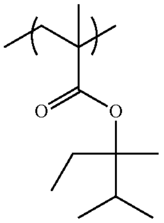
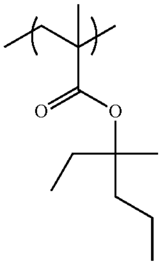
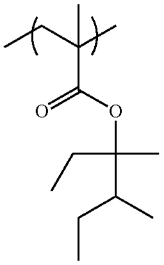
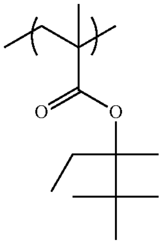
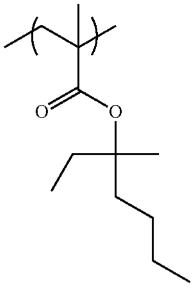

-continued

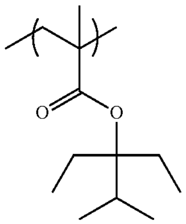
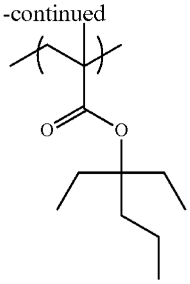
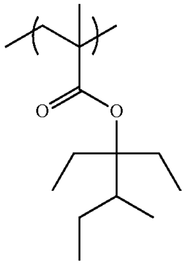
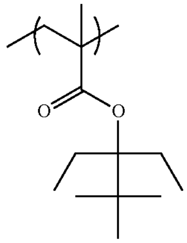
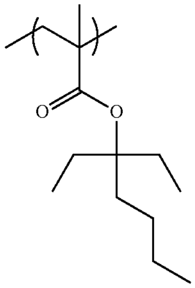
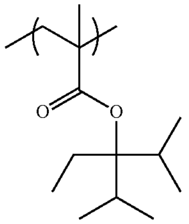
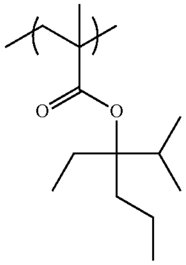
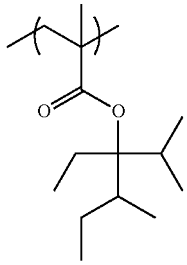
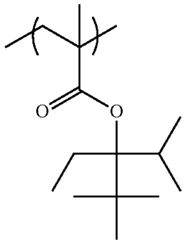
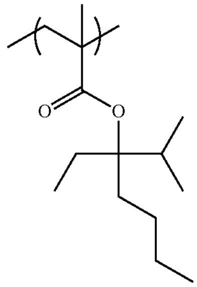
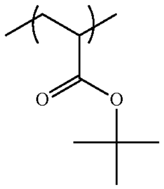
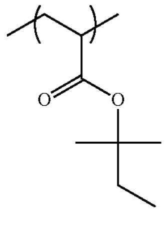
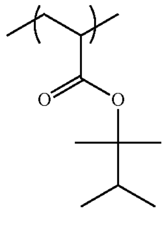

-continued

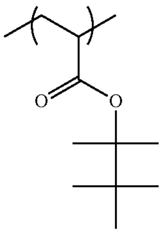
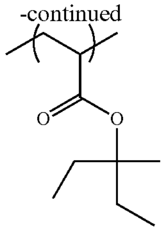
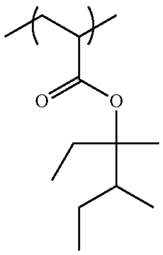
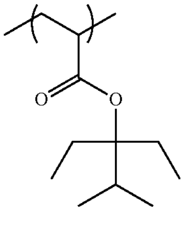
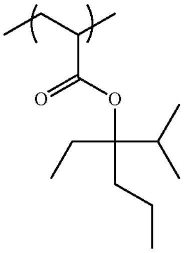
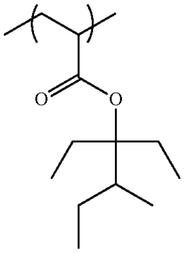
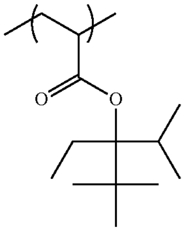
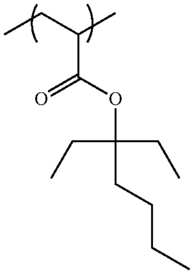

In the present invention, it is also preferable that the repeating unit having an acid-decomposable group is a repeating unit having a group in which a carboxy group or a phenolic hydroxyl group is protected by an acetal or a group in which a carboxy group or a phenolic hydroxyl group is protected by a ketal. Further, it is also preferable that the acid-decomposable group is a group in which a carboxy group is protected by an acetal or a ketal represented by the following Formula (a1-1). Moreover, in a case where the carboxy group is a residue protected by an acetal or a ketal represented by the following Formula (a1-1), the entirety of the residue has a structure of —(CO)—O—$CR^1R^2(OR^3)$.

(a1-1)

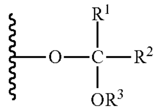

(In Formula (a1-1), $R^1$ and $R^2$ each independently represent a hydrogen atom or an alkyl group, but both of $R^1$ and $R^2$ do not represent a hydrogen atom at the same time. $R^3$ represents an alkyl group. $R^1$ or $R^2$ and $R^3$ may be linked to each other and form a cyclic ether.)

In Formula (a1-1), $R^1$ to $R^3$ each independently represent a hydrogen atom or an alkyl group, and the alkyl group may be linear, branched, or cyclic. Here, both of $R^1$ and $R^2$ do not represent a hydrogen atom at the same time and at least one of $R^1$ or $R^2$ represents an alkyl group.

In Formula (a1-1), in a case where $R^1$, $R^2$, and $R^3$ represent an alkyl group, the alkyl group may be linear, branched, or cyclic. The number of carbon atoms of the linear or branched alkyl group is preferably in a range of 1 to 12, more preferably in a range of 1 to 6, and still more preferably in a range of 1 to 4. Specific examples thereof include a methyl group, an ethyl group, an n-propyl group, an i-propyl group, an n-butyl group, an i-butyl group, a sec-butyl group, a tert-butyl group, an n-pentyl group, a neopentyl group, an n-hexyl group, a thexyl group (2,3-dimethyl-2-butyl group) an n-heptyl group, an n-octyl group, a 2-ethylhexyl group, an n-nonyl group, and an n-decyl group.

The number of carbon atoms of the cyclic alkyl group is preferably in a range of 3 to 12, more preferably in a range of 4 to 8, and still more preferably in a range of 4 to 6. Examples of the cyclic alkyl group include a cyclopropyl group, a cyclobutyl group, a cyclopentyl group, a cyclohexyl group, a cycloheptyl group, a cyclooctyl group, a norbornyl group, and an isobornyl group.

The alkyl group may include a substituent, and examples of the substituent include a halogen atom, an aryl group, and an alkoxy group. In a case where the alkyl group includes a halogen atom as a substituent, $R^1$, $R^2$, and $R^3$ become a haloalkyl group. In a case where the alkyl group includes an aryl group as a substituent, $R^1$, $R^2$, and $R^3$ become an aralkyl group.

Examples of the halogen atom include a fluorine atom, a chlorine atom, a bromine atom, and an iodine atom. Among these, a fluorine atom or a chlorine atom is preferable.

In addition, as the aryl group, an aryl group having 6 to 20 carbon atoms is preferable and an aryl group having 6 to 12 carbon atoms is more preferable. Examples thereof include a phenyl group, an α-methylphenyl group, and a naphthyl group and examples of the entire alkyl group substituted with an aryl group, that is, the aralkyl group include a benzyl group, an α-methylbenzyl group, a phenethyl group, and a naphthylmethyl group.

As the alkoxy group, an alkoxy group having 1 to 6 carbon atoms is preferable; an alkoxy group having 1 to 4 carbon atoms is more preferable; and a methoxy group or an ethoxy group is still more preferable.

Further, in a case where the alkyl group is a cycloalkyl group, the cycloalkyl group may have a linear or branched alkyl group having 1 to 10 carbon atoms as a substituent. In a case where the alkyl group is a linear or branched alkyl group, the cycloalkyl group may have a cycloalkyl group having 3 to 12 carbon atoms as a substituent.

These substituents may be further substituted with the above-described substituents.

In Formula (a1-1), in a case where $R^1$, $R^2$, and $R^3$ represent an aryl group, the number of carbon atoms of the aryl group is preferably in a range of 6 to 12 and more preferably in a range of 6 to 10. The aryl group may have a substituent, and preferred examples of the substituent include an alkyl group having 1 to 6 carbon atoms. Examples of the aryl group include a phenyl group, a tolyl group, a silyl group, a cumenyl group, and a 1-naphthyl group.

Moreover, $R^1$, $R^2$, and $R^3$ are bonded to each other and can form a ring together with a carbon atom to which $R^1$, $R^2$, and $R^3$ are bonded. Examples of the ring structure in a case where $R^1$ and $R^2$, $R^1$ and $R^3$, or $R^2$ and $R^3$ are bonded to each other include a cyclobutyl group, a cyclopentyl group, a cyclohexyl group, a cycloheptyl group, a tetrahydrofuranyl group, an adamantly group, and a tetrahydropyranyl group.

Further, in Formula (a1-1), it is preferable that any one of $R^1$ and $R^2$ represents a hydrogen atom or a methyl group.

Preferred specific examples of the repeating unit having a residue in which a carboxy group is protected by an acid-decomposable group include the followings. In addition, R represents a hydrogen atom or a methyl group.

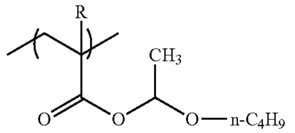

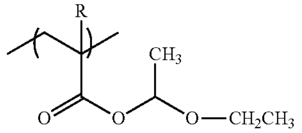

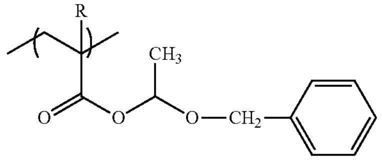

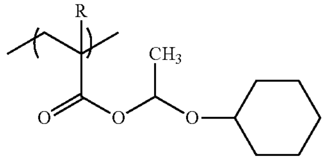

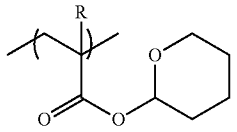

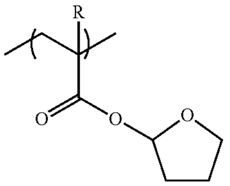

It is preferable that the repeating unit having an acid-decomposable group used in the present invention is a repeating unit represented by the following Formula (XP).

Formula (XP)

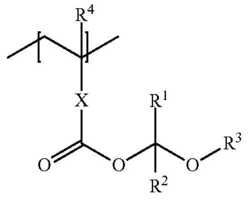

(In Formula (XP), $R^1$ and $R^2$ each independently represent a hydrogen atom, an alkyl group, or an aryl group, at least one of $R^1$ or $R^2$ represent an alkyl group or an aryl group, $R^3$ represents an alkyl group or an aryl group, $R^1$ or $R^2$ and $R^3$ may be linked to each other and form a cyclic ether, $R^4$ represents a hydrogen atom or a methyl group, and X represents an arylene group.)

In a case where $R^1$ and $R^2$ represent an alkyl group, an alkyl group having 1 to 10 carbon atoms is preferable. In a case where $R^1$ and $R^2$ represent an aryl group, a phenyl group is preferable. It is preferable that $R^1$ and $R^2$ each independently represent a hydrogen atom or an alkyl group having 1 to 4 carbon atoms.

$R^3$ represents an alkyl group or an aryl group, and an alkyl group having 1 to 10 carbon atoms is preferable and an alkyl group having 1 to 6 carbon atoms is more preferable.

It is preferable that X represents a phenylene group.

Hereinafter, examples of the repeating unit represented by Formula (XP) will be described, but it goes without saying that the present invention is not limited thereto.

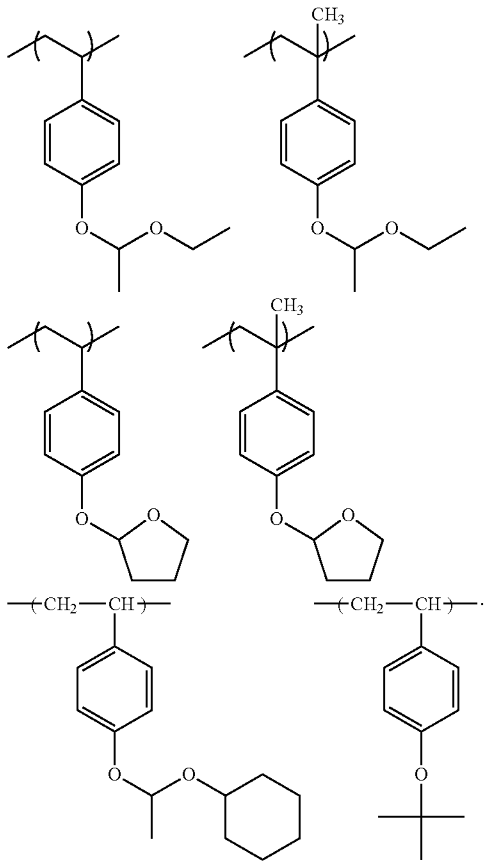

The repeating unit having an acid-decomposable group of the resin (B-1) may be used alone or in combination of two or more kinds thereof.

In the resin (B-1) of the present invention, from the viewpoints of sufficiently maintaining the solubility of an unexposed portion in an organic developer while the solubility of an exposed portion in the organic developer is sufficiently decreased and improving the dissolution contrast, the content (total content in a case where a plurality of repeating units are included) of the repeating unit having an acid-decomposable group (preferably, the repeating unit represented by Formula (III) described above) is preferably in a range of 20% by mole to 90% by mole, more preferably in a range of 30% by mole to 80% by mole, particularly preferably in a range of 40% by mole to 70% by mole, and most preferably in a range of 40% by mole to 60% by mole with respect to the entirety of the repeating units in the resin (B-1).

The resin (B-1) may include other repeating units in addition to the repeating units having the above-described acid-decomposable groups.

Examples of other repeating units include a repeating unit represented by Formula (I), a repeating unit having a non-phenolic aromatic group other than the repeating unit represented by Formula (I), a repeating unit having a lactone structure, a repeating unit having an acid group, a repeating unit having a hydroxyl group and/or a cyano group, and a repeating unit which has an alicyclic hydrocarbon structure free from a polar group and does not exhibit acid decomposability.

<Repeating Unit Represented by Formula (I)>

In the present invention, a repeating unit represented by the following Formula (I) may be included with respect to the entirety of the repeating units in the resin (A).

(I)

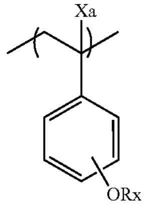

In Formula (I), Xa represents a hydrogen atom or a linear or branched alkyl group.

Rx represents a group a hydrogen atom or a group which is decomposed and desorbed by the action of an acid.

Specific examples and preferred examples of the linear or branched alkyl group as Xa are the same as those of the linear or branched alkyl group as $R^0$ in Formula (III) described above.

Specific examples and preferred examples of the group which is decomposed and desorbed by the action of an acid as Rx are the same as those of the group which is decomposed and desorbed by the action of an acid that protects a polar group constituting the acid-decomposable group in the resin (B-1).

In the resin (B-1) of the present invention, from the viewpoints of sufficiently maintaining the solubility of an unexposed portion in an organic developer while the solubility of an exposed portion in the organic developer is sufficiently decreased and improving the dissolution contrast, the content (total content in a case where a plurality of repeating units are included) of the repeating unit represented by Formula (I) is preferably 30% by mole or less, more preferably 10% by mole or less, still more preferably 5% by mole or less, and ideally 0% by mole, that is, particularly preferably not containing the above-described repeating unit with respect to the entirety of the repeating units in the resin (B-1). When the content of the repeating unit represented by Formula (I) is 30% by mole or greater with respect to the entirety of the repeating units in the resin (B-1), there is a tendency that the solubility in an organic solvent becomes extreme so that the resolution and the rectangularity of a pattern cannot be obtained.

<Repeating Unit Having Non-Phenolic Aromatic Group Other than Repeating Unit Represented by Formula (I)>

In the present invention, it is preferable that the resin (B-1) has a repeating unit that has a non-phenolic aromatic group other than the repeating unit represented by Formula (I).

Here, "the repeating unit that has a non-phenolic aromatic group other than the repeating unit represented by Formula (I)" indicates a repeating unit that has an aromatic group having a phenolic hydroxyl group and a repeating unit that has an aromatic group free from a phenolic hydroxyl group other than a repeating unit that has an aromatic group having a group (for example, a group protected by a group in which a phenolic hydroxyl group is decomposed and desorbed by the action of an acid) derived from a phenolic hydroxyl group, such as a repeating unit represented by Formula (I).

It is preferable that the non-phenolic aromatic group is an aryl group which may have a substituent and has 6 to 10 carbon atoms, and examples thereof include a phenyl group and a naphthyl group.

The substituent is not particularly limited unless the substituent is a phenolic hydroxyl group, and examples thereof include a linear or branched alkyl group having 1 to 4 carbon atoms, a cycloalkyl group having 3 to 10 carbon atoms, an aryl group having 6 to 10 carbon atoms, a halogen atom such as a fluorine atom, a cyano group, an amino group, a nitro group, and a carboxyl group. The above-described substituent such as a linear or branched alkyl group having 1 to 4 carbon atoms, a cycloalkyl group having 3 to 10 carbon atoms, or an aryl group having 6 to 10 carbon atoms may further have a substituent, and examples of the substituent include a halogen atom such as a fluorine atom.

In a case where the non-phenolic aromatic group is a phenyl group and the phenyl group has a substituent, it is preferable that the substituent is substituted with the 4-position of the phenyl group.

From the viewpoint of etching resistance, it is preferable that the non-phenolic aromatic group is a phenyl group which may have a substituent.

In the present invention, it is preferable that the repeating unit having a non-phenolic aromatic group other than the repeating unit represented by Formula (I) is a repeating unit represented by the following Formula (II).

(II)

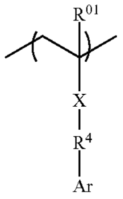

In Formula (II), $R^{01}$ represents a hydrogen atom or a linear or branched alkyl group.

X represents a single bond or a divalent linking group.

Ar represents a non-phenolic aromatic group.

$R^4$ represents a single bond or an alkylene group.

Specific examples and preferred examples of the linear or branched alkyl group as $R^{01}$ are the same as those of the linear or branched alkyl group as $R^0$ in Formula (III) described above.

It is preferable that X represents a divalent linking group. Preferred examples of the divalent linking group include —COO— and —CONH—.

Specific examples and preferred examples of a non-phenolic aromatic group Ar are the same as those of the non-phenolic aromatic group described above.

As the alkylene group as $R^4$, an alkylene group which may have a substituent and has 1 to 4 carbon atoms is preferable, and examples thereof include a methylene group, an ethylene group, and a propylene group. Examples of the substituent which can be included in the alkylene group as $R^4$ include an alkyl group having 1 to 4 carbon atoms and a halogen atom such as a fluorine atom.

A substituent which can be included in the alkylene group as $R^4$ and a substituent which can be included in the non-phenolic aromatic group Ar may be bonded to each other and form a ring, and examples of the group forming a ring include an alkylene group (such as an ethylene group or a propylene group).

From the viewpoint of the glass transition temperature (Tg) preferable for a resin in the formation of a pattern, it is preferable that $R^4$ represents a single bond or a methylene group which may be substituted with a substituent.

In the resin (B-1) of the present invention, from the viewpoints of sufficiently maintaining the solubility of an unexposed portion in an organic developer while the solubility of an exposed portion in the organic developer is sufficiently decreased, improving the dissolution contrast, and providing etching resistance, the content (total content in a case where a plurality of repeating units are included) of the repeating unit having the non-phenolic aromatic group (preferably, the repeating unit represented by Formula (II) described above) is preferably in a range of 10% by mole to 70% by mole, more preferably in a range of 20% by mole to 60% by mole, and particularly preferably in a range of 30% by mole to 50% by mole with respect to the entirety of the repeating units in the resin (B-1).

<Repeating Unit Having Lactone Structure>

The resin (B-1) may further have a repeating unit having a lactone structure. As the repeating unit having a lactone structure, a repeating unit represented by the following Formula (A-II) is more preferable.

(AII)

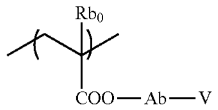

In Formula (AII), $Rb_0$ represents a hydrogen atom, a halogen atom, or an alkyl group (preferably having 1 to 4 carbon atoms) which may have a substituent.

Preferred examples of the substituent which may be included in the alkyl group as $Rb_0$ include a hydroxyl group and a halogen atom. Examples of the halogen atom as $Rb_0$ include a fluorine atom, a chlorine atom, a bromine atom, and an iodine atom. As $Rb_0$, a hydrogen atom, a methyl group, a hydroxymethyl group, or a trifluoromethyl group is preferable and a hydrogen atom or a methyl group is particularly preferable.

Ab represents a single bond, an alkylene group, a divalent linking group having a monocyclic or polycyclic cycloalkyl structure, an ether bond, an ester bond, a carbonyl group, or a divalent linking group obtained by combining these. As Ab, a single bond or a divalent linking group represented by $-Ab_1-CO_2-$ is preferable.

It is preferable that $Ab_1$ represents a linear or branched alkylene group or a monocyclic or polycyclic cycloalkyl group and more preferable that $Ab_1$ represents a methylene group, an ethylene group, a cyclohexylene group, an adamantylene group, or a norbornylene group.

V represents a group having a lactone structure.

As the group having a lactone structure, any group can be used as long as the group has a lactone structure. A 5- to 7-membered ring lactone structure is preferable and a lactone structure in which another ring structure is condensed such that a bicycle structure and a spiro structure are formed in a 5- to 7-membered ring lactone structure is preferable. It is more preferable to have a repeating unit having a lactone structure represented by any one of the following Formulae (LC1-1) to (LC1-17). Further, the lactone structure may be directly bonded to the main chain. Preferred examples of the lactone structure include (LC1-1), (LC1-4), (LC1-5), (LC1-6), (LC1-8), (LC1-13), and (LC1-14).
LC1-1
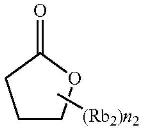
LC1-2
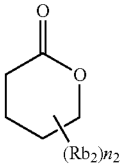
LC1-3
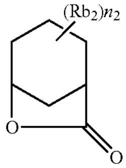
LC1-4
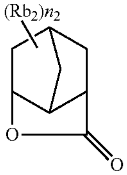
LC1-5
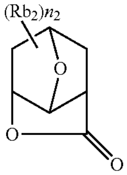
LC1-6
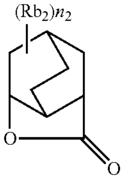
LC1-7
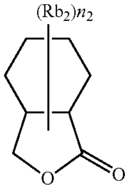
LC1-8
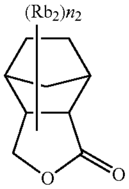
-continued
LC1-9
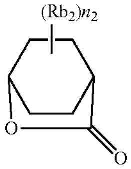
LC1-10
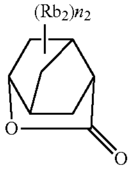
LC1-11
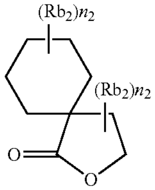
LC1-12
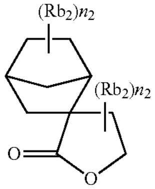
LC1-13
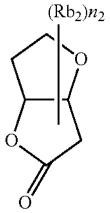
LC1-14
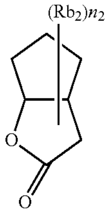
LC1-15
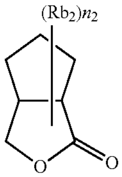
LC1-16
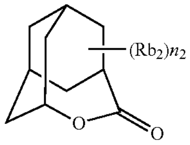

-continued

LC1-17

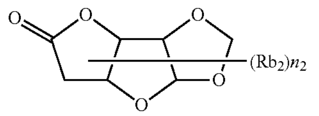

The lactone structure portion may or may not have a substituent ($Rb_2$). Preferred examples of the substituent ($Rb_2$) include an alkyl group having 1 to 8 carbon atom, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid decomposable group. More preferred examples thereof include an alkyl group having 1 to 4 carbon atoms, a cyano group, and an acid-decomposable group. $n_2$ represents an integer of 0 to 4. When $n_2$ represents an integer of 2 or greater, a plurality of the substituents ($Rb_2$'s) may be the same as or different from each other or the plurality of substituents ($Rb_2$'s) may be bonded to each other and form a ring.

Optical isomers are typically present in the repeating unit having a lactone group, but any of the optical isomers may be used. In addition, one optical isomer may be used alone or a plurality of optical isomers may be used in mixture. In a case where one optical isomer is mainly used, an optical isomer having an optical purity (ee) of 90% or greater is preferable and an optical isomer having an optical purity of 95% or greater is more preferable.

The resin (B-1) may or may not include a repeating unit having a lactone structure. In a case where the resin (B-1) includes a repeating unit having a lactone structure, the content of the repeating unit in the resin (B-1) is preferably in a range of 0.5% by mole to 50% by mole, more preferably in a range of 1% by mole to 40% by mole, and still more preferably in a range of 3% by mole to 30% by mole with respect to the entirety of the repeating units. The repeating unit may be used alone or in combination of two or more kinds thereof. When a specific lactone structure is used, the resolution of the pattern is improved and the rectangular profile becomes excellent.

Hereinafter, specific examples of the repeating unit having a lactone structure in the resin (B-1) will be described, but the present invention is not limited thereto. In the formula, Rx represents H, C, $H_3$, $CH_2OH$, or $CF_3$.

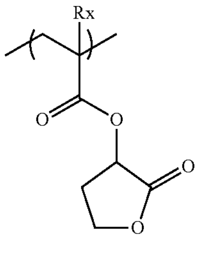

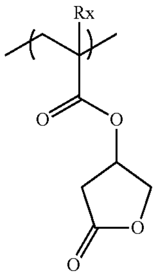

-continued

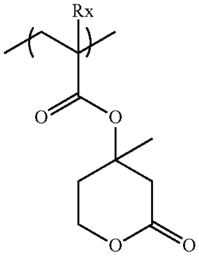

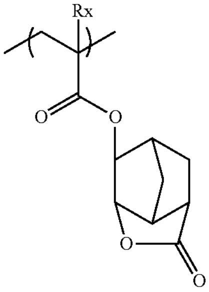

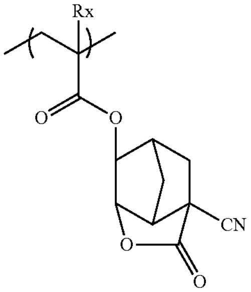

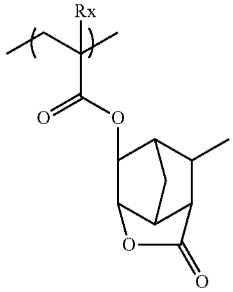

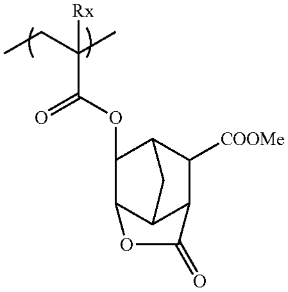

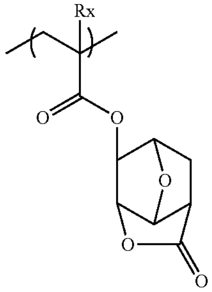

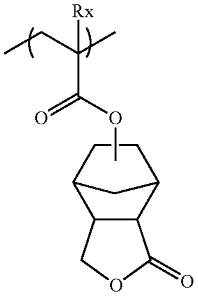

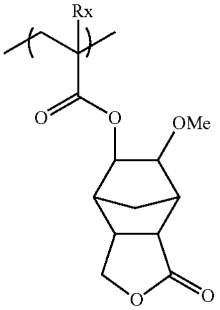

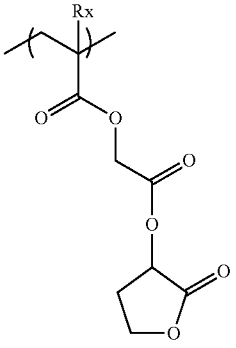

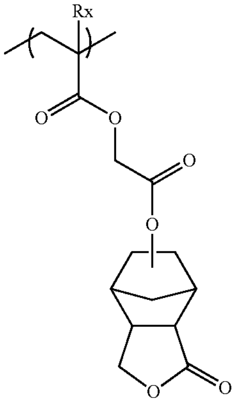

-continued

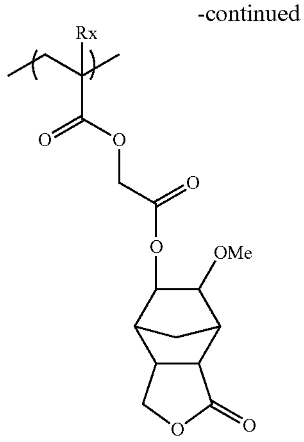

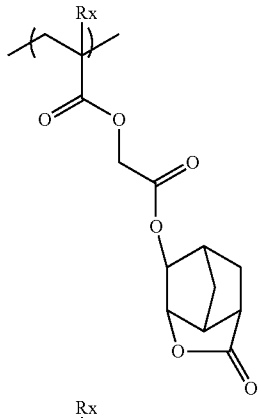

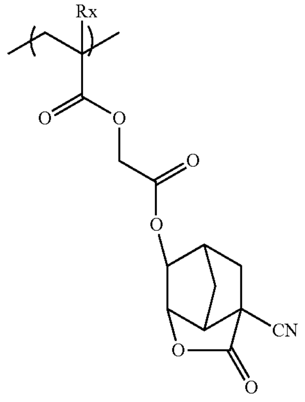

<Repeating Unit Having Acid Group>

The resin (B-1) may have a repeating unit having an acid group. Examples of the acid group include a carboxyl group, a sulfonamide group, a sulfonylimide group, a bissulfonylimide group, and aliphatic alcohol (such as hexafluoroisopropanol group) in which the α-position is substituted with an electron-withdrawing group, and it is more preferable that the resin (B-1) has a repeating unit having a carboxyl group. When the resin (B-1) includes a repeating unit having an acid group, the resolution increases because of applications of a contact hole. As the repeating unit having an acid group, any of a repeating unit in which an acid group is directly bonded to the main chain of a resin such as a repeating unit resulting from acrylic acid or methacrylic acid; a repeating unit in which an acid group is bonded to the main chain of a resin through a linking group, and a repeating unit which is introduced to the terminal of a polymer chain using a polymerization initiator having an acid group or a chain transfer agent at the time of polymerization is preferable, and the linking group may have a monocyclic or polycyclic hydrocarbon structure. A repeating unit resulting from acrylic acid or methacrylic acid is particularly preferable.

Specific examples of the repeating unit having an acid group will be described below, but the present invention is not limited thereto.

In the specific examples, Rx represents H, $CH_3$, $CH_2OH$, or $CF_3$.

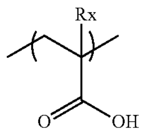
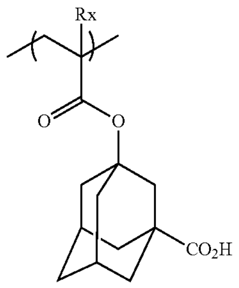

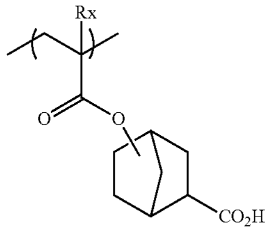
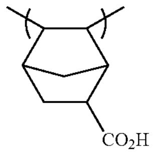

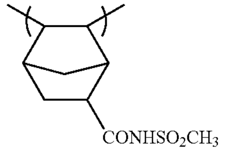
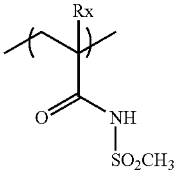

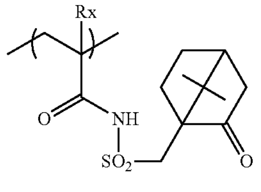
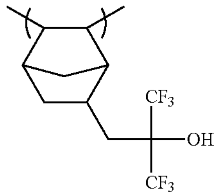

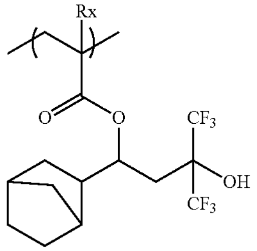
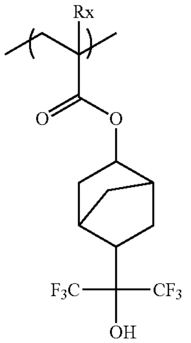

-continued

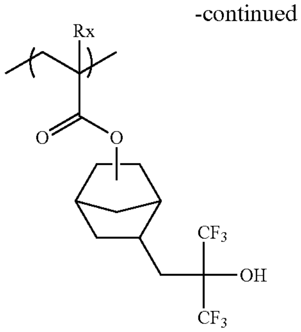

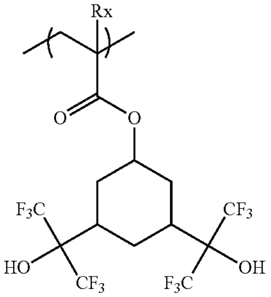

The resin (B-1) may or may not include the repeating unit having an acid group. In the case where the resin (B-1) includes the repeating unit having an acid group, the content of the repeating unit is preferably in a range of 1% by mole to 25% by mole, more preferably in a range of 1% by mole to 20% by mole, and still more preferably in a range of 3% by mole to 15% by mole with respect to the entirety of the repeating units of the resin (A).

<Repeating Unit Having Hydroxyl Group and/or Cyano Group>

The resin (B-1) may have a repeating unit having a hydroxyl group or a cyano group. In this manner, adhesion to a substrate and an affinity for a developer are improved. It is preferable that the repeating unit having a hydroxyl group or a cyano group is a repeating unit having a hydrocarbon structure substituted with a hydroxyl group or a cyano group. As the hydrocarbon structure, an aliphatic hydrocarbon group having a linear, branched, or ring structure is preferable and a repeating unit having an alicyclic hydrocarbon structure is more preferable. In addition, it is preferable that the repeating unit having a hydroxyl group and/or a cyano group does not have an acid-decomposable group.

Moreover, it is preferable that the repeating unit having an alicyclic hydrocarbon structure substituted with a hydroxyl group or a cyano group is different from a repeating unit having an acid-decomposable group (that is, a repeating unit that is stable with respect to an acid is preferable).

As the alicyclic hydrocarbon structure in the alicyclic hydrocarbon structure substituted with a hydroxyl group or a cyano group, an adamantly group, a diamantyl group, or a norbornane group is preferable.

As the alicyclic hydrocarbon structure, a repeating unit represented by any of the following Formulae (AIIa) to (AIIc) is more preferable.

(AIIa)

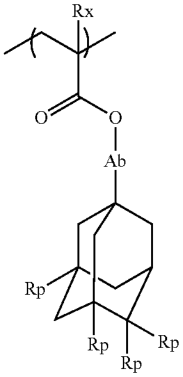

(AIIb)

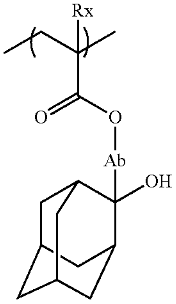

(AIIc)

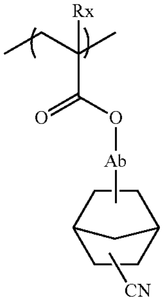

In the formula, $R_x$ represents a hydrogen atom, a methyl group, a hydroxymethyl group, or a trifluoromethyl group.

Ab represents a single bond or a divalent linking group.

Examples of the divalent linking group represented by Ab include an alkylene group, a cycloalkylene group, an ester bond, an amide bond, an ether bond, a urethane bond, a urea bond, or a combination of these. As the alkylene group, an alkylene group having 1 to 10 carbon atoms is preferable and an alkylene group having 1 to 5 carbon atoms is more preferable, and examples thereof include a methylene group, an ethylene group, and a propylene group.

In one aspect of the present invention, it is preferable that Ab represents a single bond or an alkylene group.

Rp represents a hydrogen atom, a hydroxyl group, or a hydroxyalkyl group. A plurality of Rp's may be the same as or different from each other, but at least one of the plurality of Rp's represents a hydroxyl group or a hydroxyalkyl group.

The resin (B-1) may or may not include the repeating unit having a hydroxyl group or a cyano group. In the case where the resin (B-1) includes a repeating unit having a hydroxyl group or a cyano group, the content of the repeating unit having a hydroxyl group or a cyano group is preferably in a range of 1% by mole to 40% by mole, more preferably in a range of 3% by mole to 30% by mole, and still more preferably in a range of 5% by mole to 25% by mole with respect to the entirety of the repeating units in the resin (B-1).
Specific examples of the repeating unit having a hydroxyl group or a cyano group are described below, but the present invention is not limited thereto.
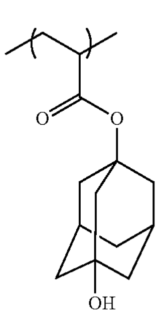
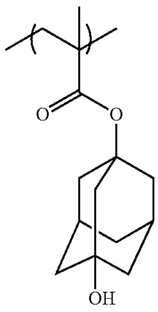
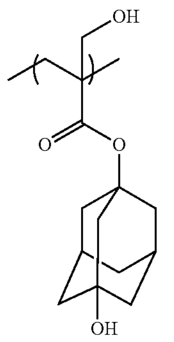
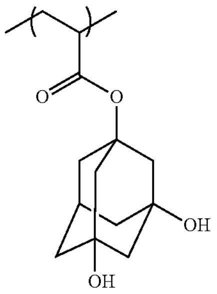
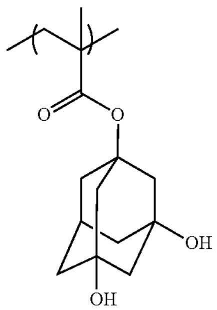
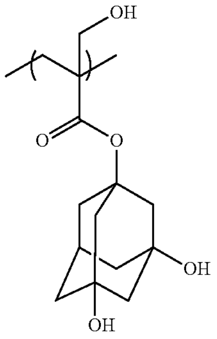
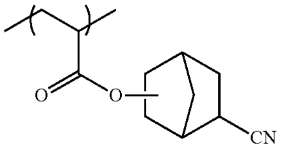
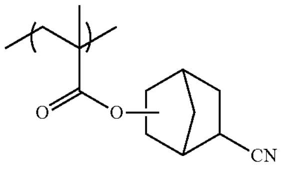
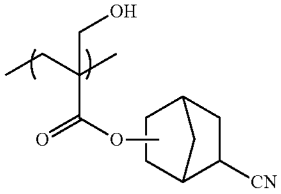
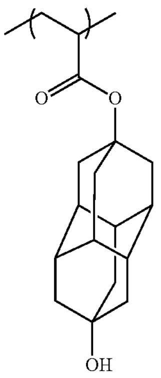
-continued
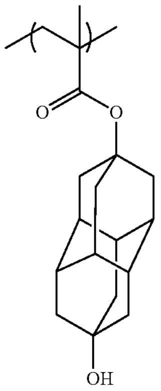
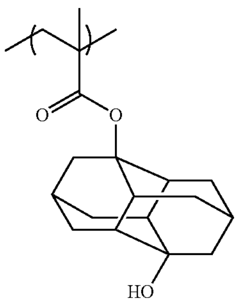
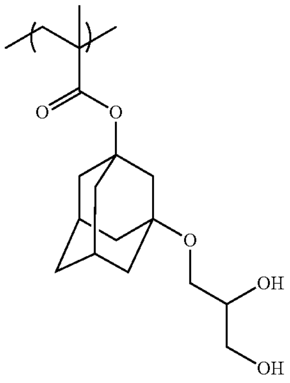
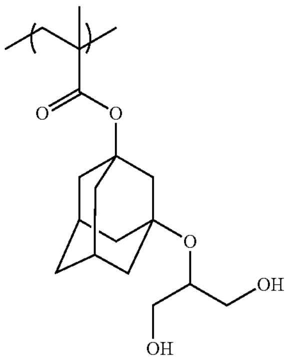
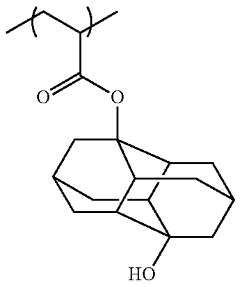

-continued

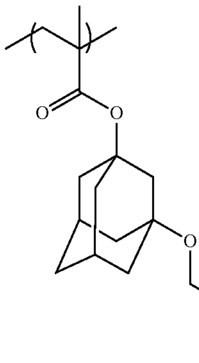

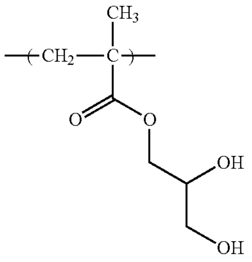

In addition, monomers and repeating units corresponding to the monomers described in paragraphs subsequent to the paragraph 0011 of the specification of WO2011/122336A can be suitably used.

<Repeating Unit that has Hydrocarbon Structure Free from Polar Group and does not Exhibit Acid Decomposability>

The resin (B-1) of the present invention may further have a repeating unit that has a hydrocarbon structure free from a polar group (for example, the above-described acid groups, a hydroxyl group, and a cyano group) and does not exhibit acid decomposability. In this manner, the solubility of a resin at the time of development using a developer including an organic solvent can be appropriately adjusted. A repeating unit represented by Formula (IV) can be exemplified as such a repeating unit.

(IV)

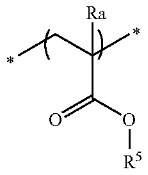

In Formula (IV), $R^5$ represents a hydrocarbon group that does not have a polar group.

Ra represents a hydrogen atom, an alkyl group, or a —$CH_2$—O—$Ra_2$ group. In the formula, $Ra_2$ represents a hydrogen atom, an alkyl group, or an acyl group. It is preferable that Ra represents a hydrogen atom, a methyl group, a hydroxymethyl group, or a trifluoromethyl group and particularly preferable that Ra represents a hydrogen atom or a methyl group.

The hydrocarbon group that does not have a polar group as $R^5$ is preferably an alkyl group, more preferably a linear or branched alkyl group having 1 to 10 carbon atoms, and still more preferably a methyl group, an ethyl group, an n-propyl group, an i-propyl group, an n-butyl group, an i-butyl group, an n-amyl group, an i-amyl group, an n-hexyl group, an n-octyl group, a 2-ethylhexyl group. These groups may further have substituents. Examples of the substituents include a nitro group, a halogen atom such as a fluorine atom, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the examples are not limited thereto.

The hydrocarbon group that does not have a polar group as $R^5$ may have a ring structure. Examples of the ring structure include a monocyclic hydrocarbon group and a polycyclic hydrocarbon group. Examples of the monocyclic hydrocarbon group include a cycloalkyl group having 3 to 12 carbon atoms such as a cyclopentyl group, a cyclohexyl group, a cycloheptyl group, or a cyclooctyl group and a cycloalkenyl group having 3 to 12 carbon atoms such as a cyclohexenyl group. As the monocyclic hydrocarbon group, a monocyclic hydrocarbon group having 3 to 7 carbon atoms is preferable and a cyclopentyl group or a cyclohexyl group is more preferable.

As the polycyclic hydrocarbon group, a ring-aggregated hydrocarbon group or a cross-linked cyclic hydrocarbon group is exemplified. Examples of the ring-aggregated hydrocarbon group include a bicyclohexyl group and a perhydronaphthalenyl group.

Examples of the cross-linked cyclic hydrocarbon ring include a bicyclic hydrocarbon ring such as a pinane ring, a bornane ring, a norpinane ring, a norbornane ring, or a bicyclooctane ring (a bicyclo[2.2.2]octane ring or a bicyclo [3.2.1]octane ring); a tricyclic hydrocarbon ring such as a homoblendane ring, an adamantane ring, a tricyclo[5.2.1.$0^{2,6}$]decane ring, or a tricyclo[4.3.1.$1^{2,5}$]undecane ring; and a tetracyclic hydrocarbon ring such as a tetracyclo[4.4.0.$1^{2,5}$.$1^{7,10}$]dodecane ring or a perhydro-1,4-methane-5,8-methanonaphthalene ring. In addition, examples of the cross-linked cyclic hydrocarbon ring include a fused cyclic hydrocarbon ring, for example, a fused ring in which a plurality of 5- to 8-membered cycloalkane rings such as a perhydronaphthalene (decalin) ring, a perhydroanthracene ring, a perhydrophenanthrene ring, a perhydroacenaphthene ring, a perhydrofluorene ring, a perhydroindene ring, or a perhydrophenalene ring are fused.

Preferred examples of the cross-linked cyclic hydrocarbon ring include a norbornyl group, an adamantly group, a bicyclooctanyl group, and a tricyclo[5,2,1,$0^{2,6}$]decanyl group. More preferred examples of the cross-linked cyclic hydrocarbon ring include a norbornyl group and an adamantly group.

These alicyclic hydrocarbon groups may have substituents, and preferred examples of the substituents include a halogen atom, an alkyl group, a hydroxyl group whose hydrogen atom is substituted, and an amino group whose hydrogen atom is substituted. Preferred examples of the halogen atom include a bromine atom, a chlorine atom, and a fluorine atom, and preferred examples of the alkyl group include a methyl group, an ethyl group, a butyl group, and a tert-butyl group. The above-described alkyl group may further have a substituent, and examples of the substituent that may be further included therein include a halogen atom, an alkyl group, a hydroxyl group whose hydrogen atom is substituted, and an amino group whose hydrogen atom is substituted.

Examples of the substituent of the hydrogen atom include an alkyl group (including a cycloalkyl group), an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms. Preferred examples of the substituted methyl group include a methoxymethyl group, a methoxythiomethyl group, a benzyloxymethyl group, a tert-butoxymethyl group, and a 2-methoxyethoxymethyl group.

Preferred examples of the substituted ethyl group include a 1-ethoxyethyl group and a 1-methyl-1-methoxyethyl group. Preferred examples of the acyl group include an aliphatic acyl group having 1 to 6 carbon atoms such as a formyl group, an acetyl group, a propionyl group, a butyryl group, an isobutyryl group, a valeryl group, or a pivaloyl group. Examples of the alkoxycarbonyl group include an alkoxycarbonyl group having 1 to 4 carbon atoms.

The resin (B-1) has a hydrocarbon structure free from a polar group and may or may not include a repeating unit that does not exhibit acid decomposability. In the case where the resin (B-1) has a hydrocarbon structure free from a polar group and includes a repeating unit that does not exhibit acid decomposability, the content of the repeating unit is preferably in a range of 1% by mole to 49% by mole, more preferably in a range of 1% by mole to 40% by mole, and still more preferably in a range of 1% by mole to 20% by mole with respect to the entirety of the repeating units in the resin (B-1).

Specific examples of the repeating unit that has a hydrocarbon structure free from a polar group and does not exhibit acid decomposability will be described below, but the present invention is not limited thereto. In the formula, Ra represents H, $CH_3$, $CH_2OH$, or $CF_3$.

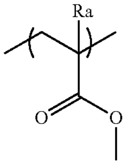
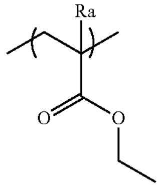
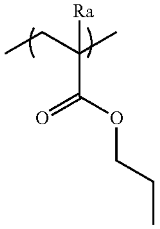
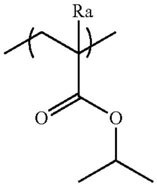
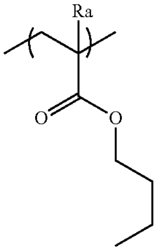
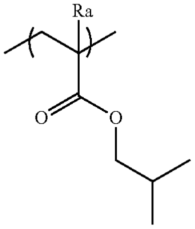
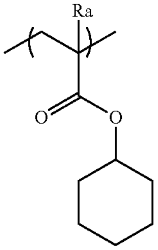
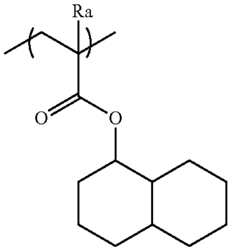
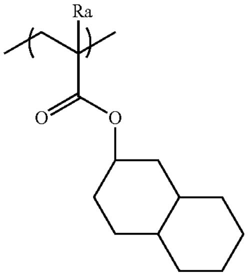

-continued

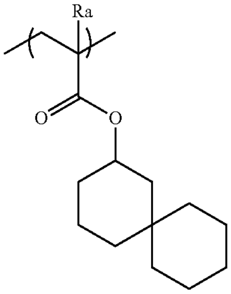
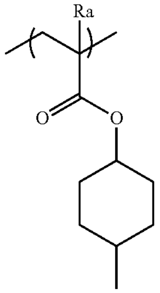
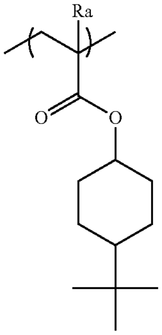
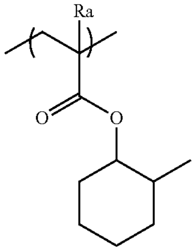
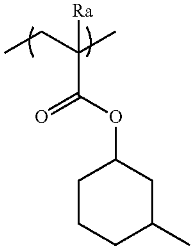
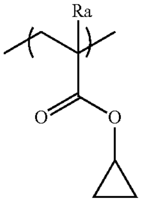
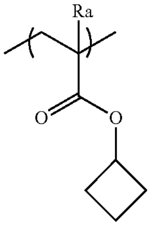
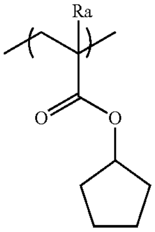
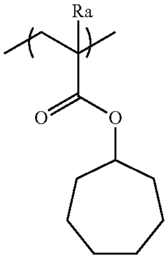
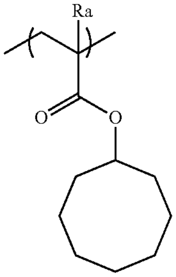
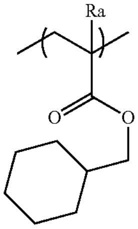
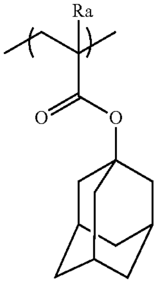
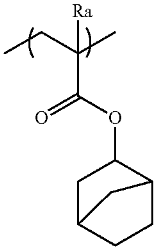

-continued

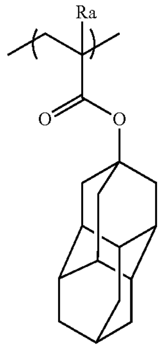

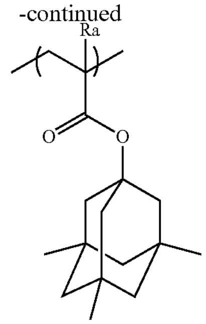

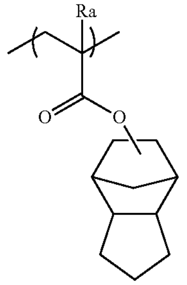

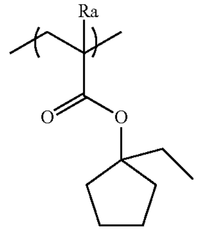

Next, the resin (B-2) will be described.

As the resin (B-2), a resin (B-2a) including a repeating unit that has a group (hereinafter, also referred to as a "cross-linking group") in which cross-linking occurs between molecular chains of the resin (B) due to the action of an acid and a resin (B-2b) in which cross-linking occurs between molecular chains of the resin (B) through a cross-linking agent described below are exemplified.

In a case of the resin (B-2a), the cross-linking group is not particularly limited as long as the group causes a curing reaction using a heat treatment in the presence of an acid. As an aspect of the repeating unit having a preferable cross-linking group, a repeating unit including at least one selected from the group consisting of an epoxy group, an oxetanyl group, a —NH—$CH_2$—OR (R represents an alkyl group having 1 to 20 carbon atoms) group, and a vinyl ether group is exemplified.

In the photosensitive resin composition of the present invention, among these, it is more preferable that the component (A) includes a repeating unit including at least one of an epoxy group or an oxetanyl group and particularly preferable that the component (A) includes a repeating unit including an oxetanyl group. More specific details are described below.

<Repeating Unit Having Epoxy Group and/or Oxetanyl Group>

It is preferable that the copolymer (A) includes a repeating unit having an epoxy group and/or an oxetanyl group. The 3-membered cyclic ether group is referred to as an epoxy group and the 4-membered cyclic ether group is referred to as an oxetanyl group. The repeating unit having an epoxy group and/or an oxetanyl group is preferable and a repeating unit having an oxetanyl group is more preferable.

In the repeating unit having an epoxy group and/or an oxetanyl group, one repeating unit may include at least one of an epoxy group or an oxetanyl group, or one repeating unit may include one or more epoxy groups and one or more oxetanyl groups or two or more epoxy groups or two or more oxetanyl groups, which is not particularly limited. However, it is preferable that the repeating unit has one to three epoxy groups and/or oxetanyl groups in total, more preferable that the repeating unit has one or two epoxy groups and/or oxetanyl groups in total, and still more preferable that the repeating unit has one of an epoxy group or an oxetanyl group.

Specific examples of a radically polymerizable monomer used to form a repeating unit having an epoxy group include glycidyl acrylate, glycidyl methacrylate, glycidyl α-ethyl acrylate, glycidyl α-n-propyl acrylate, glycidyl α-n-butyl acrylate, 3,4-epoxy butyl acrylate, 3,4-epoxy butyl methacrylate, 3,4-epoxy cyclohexyl methyl acrylate, 3,4-epoxy cyclohexyl methyl methacrylate, 3,4-epoxy cyclohexyl methyl α-ethylacrylate, o-vinylbenzyl glycidyl ether, m-vinylbenzyl glycidyl ether, p-vinylbenzyl glycidyl ether, and a compound including an alicyclic epoxy skeleton described in the paragraphs 0031 to 0035 of JP4168443B.

Specific examples of the radically polymerizable monomer used to form a repeating unit having an oxetanyl group include (meth)acrylic acid ester having an oxetanyl group described in the paragraphs 0011 to 0016 of JP2001-330953A.

Preferred specific examples of the radically polymerizable monomer used to form the repeating unit having an epoxy group and/or an oxetanyl group include a monomer including a methacrylic acid ester structure and a monomer including an acrylic acid ester structure.

Among these monomers, a compound including an alicyclic epoxy skeleton described in the paragraphs 0034 and 0035 of JP4168443B and (meth)acrylic acid ester having an oxetanyl group described in the paragraphs 0011 to 0016 of JP2001-330953A are more preferable; and (meth)acrylic acid ester having an oxetanyl group described in the paragraphs 0011 to 0016 of JP2001-330953A is particularly preferable. Among these, glycidyl methacrylate, 3,4-epoxy cyclohexyl methyl acrylate, 3,4-epoxy cyclohexyl methyl methacrylate, (3-ethyloxetan-3-yl)methyl acrylate, and (3-ethyloxetan-3-yl)methyl methacrylate are preferable; and (3-ethyloxetan-3-yl)methyl acrylate and (3-ethyloxetan-3-yl)methyl methacrylate are most preferable. These repeating units may be used alone or in combination of two or more kinds thereof.

The repeating unit having an epoxy group and/or an oxetanyl group can be referred to the description in the paragraphs 0053 to 0055 of JP2011-215590A.

Preferred specific examples of the repeating unit having an epoxy group and/or an oxetanyl group include the following repeating units. Further, R represents a hydrogen atom or a methyl group.

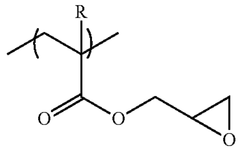

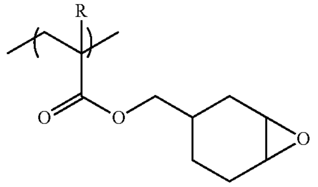

-continued

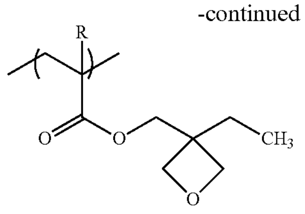

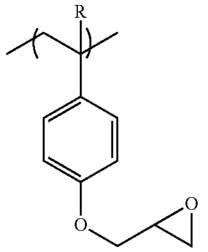

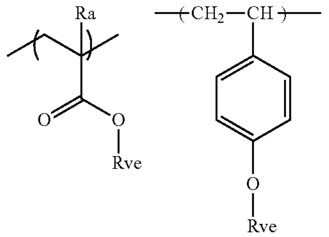

In the present invention, from the viewpoint of the sensitivity, an oxetanyl group is preferable. Among these, an alicyclic epoxy group and an oxetanyl group are preferable. As described above, as the epoxy group and/or the oxetanyl group in the present invention, an alicyclic epoxy group and an oxetanyl group are preferable and an oxetanyl group is particularly preferable.

<Repeating Unit Having —NH—$CH_2$—O—R (R Represents an Alkyl Group Having 1 to 20 Carbon Atoms)>

A repeating unit having —NH—$CH_2$—O—R (R represents an alkyl group having 1 to 20 carbon atoms) is also preferable as a copolymer used in the present invention. In this manner, a curing reaction can be caused by a moderate heat treatment and a cured film having excellent characteristics can be obtained. Here, it is preferable that R represents an alkyl group having 1 to 9 carbon atoms and more preferable that R represents an alkyl group having 1 to 4 carbon atoms. In addition, the alkyl group may be linear, branched, or cyclic, but a linear or branched alkyl group is preferable. As the repeating unit, a repeating unit having a group represented by the following Formula (1) is more preferable.

Formula (1)

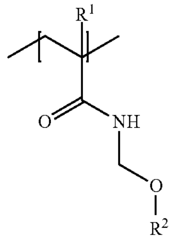

(In the formula, $R^1$ represents a hydrogen atom or a methyl group and $R^2$ represents an alkyl group having 1 to 20 carbon atoms.)

It is preferable that $R^2$ represents an alkyl group having 1 to 9 carbon atoms and more preferable that $R^2$ represents an alkyl group having 1 to 4 carbon atoms. Further, the alkyl group may be linear, branched, or cyclic, but a linear or branched alkyl group is preferable.

Specific examples of $R^2$ include a methyl group, an ethyl group, an n-butyl group, an i-butyl group, a cyclohexyl group, and an n-hexyl group. Among these, an i-butyl group, an n-butyl group, and a methyl group are preferable.

<Repeating Unit Having Vinyl Ether Group>

A repeating unit having a vinyl ether group is also preferable as the copolymer used in the present invention. Specific examples thereof include repeating units represented by the following formula.

Here, Ra represents a hydrogen atom, an alkyl group, or a —$CH_2$—O—$Ra_2$ group. In the formula, $Ra_2$ represents a hydrogen atom, an alkyl group, or an acyl group. As Ra, a hydrogen atom, a methyl group, a hydroxymethyl group, or a trifluoromethyl group is preferable, and a hydrogen atom or a methyl group is particularly preferable.

Rve represents a group having a vinyl ether group in the terminal. Specifically, a 2-(vinyloxy)alkyl group is preferable. Here, as the alkyl group, an alkyl group having 2 to 6 carbon atoms is preferable. Specifically, a 2-(vinyloxy)ethyl group is preferable.

The content of the repeating unit including a cross-linking group is preferably in a range of 3% by mole to 70% by mole and more preferably in a range of 10% by mole to 60% by mole with respect to the entirety of the repeating units of the resin (B-2a).

Next, the resin (B-2b) will be described.

The resin (B-2b) includes a repeating unit that reacts with a cross-linking agent described below to form a bond. As other such repeating units, a repeating unit represented by Formula (I), a repeating unit having a non-phenolic aromatic group represented by Formula (I), a repeating unit having a lactone structure, a repeating unit having a hydroxyl group and/or a cyano group, a repeating unit having an acid group, and a repeating unit that has an alicyclic hydrocarbon structure free from a polar group and does not exhibit acid decomposability are exemplified. These repeating units can be referred to the description of the resin (B-1) and the preferable ranges are the same as described above.

As the resin (B-3) that forms a cross-linking structure between resins using a cross-linking agent, a resin that includes a repeating unit having a benzene ring and/or a phenolic hydroxyl group is preferable.

As an example of such as resin, a resin which includes a repeating unit represented by Formula (I), a repeating unit in which Rx represents a hydrogen atom, or a repeating unit having a non-phenolic aromatic group other than the repeating unit represented by Formula (I) and in which Ar represents a phenyl group is exemplified. Further, the resin may have a repeating unit (a repeating unit having a cross-linking group, a repeating unit having an acid-decomposable group, or the like, particularly a repeating unit having an acid-decomposable group) other than those described above.

In the resin (B-3), it is preferable that the content of the repeating unit having a benzene ring and/or a phenolic hydroxyl group is in the range of 50% by mole to 100% by mole with respect to the entirety of the repeating units.

The resin (B) used in the composition of the present invention may have various repeating units, in addition to the above-described repeating units, for the purpose of adjusting the dry etching resistance, the standard developer aptitude, the adhesion to a substrate, the resist profile; and the resolving power, heat resistance, and sensitivity which are characteristics typically required for a photosensitive resin composition.

Examples of such repeating units include repeating units corresponding to the following monomers, but are not limited thereto.

In this manner, the performance particularly required for a resin used in the photosensitive resin composition of the present invention, for example, (1) solubility in a coating solvent, (2) film forming properties (glass transition temperature), (3) alkali developability, (4) reduction in film thickness (selection of a hydrophobic group, a hydrophilic group, and an alkali-soluble group), (5) adhesion of an unexposed portion to a substrate, and (6) dry etching resistance can be finely adjusted.

Examples of such monomers include compounds having one addition polymerizable unsaturated bond selected from acrylic acid esters, methacrylic acid esters, acrylamides, methacrylamides, an allyl compound, vinyl ethers, vinyl esters, styrenes, and crotonic acid esters.

In addition, an addition polymerizable unsaturated compound which is copolymerizable with monomers corresponding to the above-described various repeating units may be copolymerized.

The molar ratios of the respective repeating units to be contained in the resin (B) used in the photosensitive resin composition of the present invention are appropriately set for the purpose of adjusting the dry etching resistance, the standard developer aptitude, the adhesion to a substrate, and the resist profile of the photosensitive resin composition and the resolving power, the heat resistance, and the sensitivity which are properties typically required for a resist.

The resin (B) of the present invention may be in the form of a random type, a block type, a comb type, or a star type. The resin (B) can be synthesized by radical polymerization, cationic polymerization, or anionic polymerization of unsaturated monomers corresponding to the respective structure. A target resin can be obtained by performing a polymer reaction after polymerization using unsaturated monomers corresponding to precursors of the respective structures.

The resin (B) of the present invention can be synthesized according to a conventional method (for example, radical polymerization). Examples of a typical synthesis method include a batch polymerization method in which polymerization is performed by dissolving the monomer species and an initiator in a solvent and heating the solvent; and a dropping polymerization method in which polymerization is performed by dropping a solution of the monomer species and an initiator to be added to a heated solvent for 1 hour to 10 hours, and the dropping polymerization method is preferable. Examples of the reaction solvent include ethers such as tetrahydrofuran, 1,4-dioxane, and diisopropyl ether, ketones such as methyl ethyl ketone and methyl isobutyl ketone; an ester solvent such as ethyl acetate; an amide solvent such as dimethylformamide or dimethylacetamide; and solvents, which dissolve the composition of the present invention, such as propylene glycol monomethyl ether acetate, propylene glycol monomethyl ether, and cyclohexanone described below. More preferably, it is preferable that polymerization is performed using a solvent which is the same as the solvent used for the resin composition (I) in the present invention. In this manner, it is possible to suppress generation of particles during preservation.

It is preferable that the polymerization reaction is performed in an inert gas atmosphere such as nitrogen or argon. A commercially available radical initiator (azo initiator or peroxide) is used as the polymerization initiator to initiate polymerization. An azo initiator is preferable as the radical initiator, and an azo initiator having an ester group, a cyano group, and a carboxyl group is more preferable. Preferred examples of the initiator include azobisisobutyronitrile, azobisdimethylvaleronitrile, and dimethyl 2,2'-azobis(2-methylpropionate). An initiator is optionally added or is divided and added to be put into a solvent after the reaction is finished, and then a desired polymer is recovered according to a powder or solid recovery method. The concentration thereof in the reaction is in a range of 5% by mass to 50% by mass and preferably in a range of 10% by mass to 30% by mass. The reaction temperature is typically in a range of 10° C. to 150° C., preferably in a range of 30° C. to 120° C., and more preferably in a range of 60° C. to 100° C.

After the reaction is finished, the resultant is cooled to room temperature and purified. The purification is can be performed according to a typical method such as a liquid-liquid extraction method in which residual monomers or oligomer components are removed by washing with water or combining an appropriate solvent; a method of purification in a solution state of ultrafiltration or the like that extracts and removes only those having a specific molecular weight or less; a re-precipitation method in which residual monomers or the like are removed by adding a resin solution dropwise to a poor solvent so that the resin is solidified in the poor solvent; or a method of purification in a solid state, in which filtered resin slurry is washed with a poor solvent. For example, the resin is deposited as a solid by bringing a solvent (poor solvent) in which the resin is hardly soluble or insoluble into contact with the resin in a volume amount of 10 times or less the reaction solution and preferably 5 times to 10 times the reaction solution.

A solvent (precipitation of re-precipitation solvent) used at the time of a precipitation or re-precipitation operation from a polymer solution is not limited as long as the solvent is a poor solvent of the above-described polymer, and the solvent can be appropriately selected from among hydrocarbon, halogenated hydrocarbon, a nitro compound, ether, ketone, ester, carbonate, alcohol, carboxylic acid, water, and a mixed solvent including these solvents, according to the kind of polymer.

The amount of the precipitation or re-precipitation solvent to be used can be appropriately selected in consideration of the efficiency or the yield, but the amount thereof is typically in a range of 100 parts by mass to 10000 parts by mass, preferably in a range of 200 parts by mass to 2000 parts by mass, and still more preferably in a range of 300 parts by mass to 1000 parts by mass with respect to 100 parts by mass of the polymer solution.

The temperature at the time of precipitation or re-precipitation can be appropriately selected in consideration of the efficiency or the operability, but is typically in a range of approximately 0° C. to 50° C. and preferably around room temperature (for example, approximately in a range of approximately 20° C. to 35° C.). The precipitation or re-precipitation operation can be performed using a commonly employed mixing container such as a stirring tank according to a known method such as a batch type method or a continuous type method.

A precipitated or re-precipitated polymer is typically subjected to commonly employed solid-liquid separation such as filtration or centrifugation, dried, and then used. The filtration is performed preferably under reduced pressure using a solvent-resistant filter material. The drying is performed in a temperature range of approximately 30° C. to 100° C. and preferably in a temperature range of approximately 30° C. to 50° C. under normal pressure or reduced pressure (preferably reduced pressure).

Further, after a resin is deposited and separated once, the resin is dissolved in a solvent and may be brought into contact with a solvent in which the resin is hardly soluble or insoluble. That is, a method including a process (process a) of bringing the polymer into contact with a solvent in which the polymer is hardly soluble or insoluble and allowing the resin to be deposited after the above-described radical polymerization reaction is finished, a process (process b) of separating the resin from the solution, a process (process c) of dissolving the resin in the solvent again and preparing a resin solution A, a process (process d) of allowing a resin solid to be deposited by bringing the solvent in which the resin is hardly soluble or insoluble into contact with the resin solution A in a volume amount of less than 10 times (preferably in a volume amount of 5 times or less) the resin solution A, and a process (process e) of separating out the deposited resin may be used.

Moreover, in order to suppress aggregation of a resin after the composition is prepared, for example, as described in JP2009-037108A, a process of dissolving a synthesized resin in a solvent to obtain a solution and heating the solution in a temperature range of approximately 30° C. to 90° C. for approximately 30 minutes to 4 hours may be added.

The weight average molecular weight of the resin (B) used for the composition of the present invention is preferably in a range of 1,000 to 200,000, more preferably in a range of 2,000 to 100,000, still more preferably in a range of 3,000 to 70,000, and particularly preferably in a range of 5,000 to 50,000 in terms of polystyrene according to the GPC method. When the weight average molecular weight is adjusted to be in a range of 1,000 to 200,000, it is possible to prevent deterioration of heat resistance or dry etching resistance and to prevent deterioration of developability or deterioration of film forming properties due to the high viscosity.

The degree of dispersion (molecular weight distribution) is typically in a range of 1.0 to 3.0, preferably in a range of 1.0 to 2.6, more preferably in a range of 1.2 to 2.4, and particularly preferably in a range of 1.4 to 2.2. When the molecular weight distribution satisfies the above-described range, the resolution and the resist shape are excellent, the side wall of the resist pattern is smooth, and the roughness properties are excellent.

In an active ray-sensitive or radiation-sensitive resin composition of the present invention, the blending ratio of the resin (A) in the entire composition is preferably in a range of 30% by mass to 99% by mass and more preferably in a range of 60% by mass to 95% by mass in the total solid content.

Moreover, in the present invention, the resin (B) may be used alone or in combination of plural kinds thereof.

<Cross-Linking Agent>

The photosensitive resin composition used in the present invention may include a cross-linking agent. The cross-linking agent is not limited as long as a cross-linking reaction is caused by a heat treatment in the presence of an acid. For example, a compound having two or more epoxy groups or oxetanyl groups in a molecule, an alkoxymethyl group-containing cross-linking agent, or a compound having at least one ethylenically unsaturated double bond, which are described below, can be added.

Among these cross-linking agents, a compound having two or more epoxy groups or oxetanyl groups in a molecule is preferable and an epoxy resin is particularly preferable.

The amount of the cross-linking agent to be added to the photosensitive resin composition of the present invention is preferably in a range of 0.01 parts by weight to 50 parts by weight, more preferably in a range of 0.5 parts by weight to 30 parts by weight, and still more preferably in a range of 2 parts by weight and 10 parts by weight with respect to 100 parts by weight of the total solid content of the photosensitive resin composition. When the amount of the cross-linking agent to be added is adjusted to be in the above-described range, a cured film with excellent mechanical strength and solvent resistance can be obtained. The cross-linking agent may be used alone or in combination of two or more kinds thereof. In the case where two or more kinds of cross-linking agents are used in combination, the content thereof is calculated by summing all cross-linking agents.

<<Compound Having Two or More Epoxy Groups or Oxetanyl Groups in Molecule>>

Specific examples of the compound having two or more epoxy groups in a molecule include a bisphenol A type epoxy resin, a bisphenol F type epoxy resin, a phenol novolak type epoxy resin, a cresol novolak type epoxy resin, and an aliphatic epoxy resin.

These resins are commercially available. Examples of the bisphenol A type epoxy resin include JER827, JER828, JER834, JER1001, JER1002, JER1003, JER1055, JER1007, JER1009, JER1010 (all manufactured by Japan Epoxy Resins Co., Ltd.), EPICLON 860, EPICLON 1050, EPICLON 1051, and EPICLON 1055 (all manufactured by DIC Corporation). Examples of the bisphenol F type epoxy resin include JER806, JER807, JER4004, JER4005, JER4007, JER4010 (all manufactured by Japan Epoxy Resins Co., Ltd.), EPICLON 830, EPICLON 835 (both manufactured by DIC Corporation), LCE-21, and RE-602S (both manufactured by Nippon Kayaku Co., Ltd.). Examples of the phenol novolak type epoxy resin include JER152, JER154, JER157S70, JER157S65 (all manufactured by Japan Epoxy Resins Co., Ltd.), EPICLON N-740, EPICLON N-770, and EPICLON N-775 (all manufactured by DIC Corporation). Examples of the cresol novolak type epoxy resin include EPICLON N-660, EPICLON N-665, EPICLON N-670, EPICLON N-673, EPICLON N-680, EPICLON N-690, EPICLON N-695 (all manufactured by DIC Corporation), and EOCN-1020 (manufactured by Nippon Kayaku Co., Ltd.). Examples of the aliphatic epoxy resin include ADEKA RESIN EP-4080S, ADEKA RESIN EP-4085S, ADEKA RESIN EP-4088S (all manufactured by ADEKA CORPORATION), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Corporation).

Other examples of commercially available products include ADEKA RESIN EP-4000S, ADEKA RESIN EP-4003S, ADEKA RESIN EP-4010S, ADEKA RESIN EP-4011 S (all manufactured by ADEKA CORPORATION), NC-2000, NC-3000, NC-7300, XD-1000, EPPN-501, EPPN-502 (all manufactured by ADEKA CORPORATION), DENACOL EX-611, EX-612, EX-614, EX-614B, EX-622, EX-512, EX-521, EX-411, EX-421, EX-313, EX-314, EX-321, EX-211, EX-212, EX-810, EX-811, EX-850, EX-851, EX-821, EX-830, EX-832, EX-841, EX-911, EX-941, EX-920, EX-931, EX-212L, EX-214L, EX-216L, EX-321L, EX-850L, DLC-201, DLC-203, DLC-204, DLC-205, DLC-206, DLC-301, DLC-402 (all manufactured by Nagase ChemteX Corporation), YH-300, YH-301, YH-302, YH-315, YH-324, and YH-325 (all manufactured by NIPPON STEEL & SUMIKIN CHEMICAL CO., LTD.).

These may be used alone or in combination of two or more kinds thereof.

Among these, a bisphenol A type epoxy resin, a bisphenol F type epoxy resin, a phenol novolak type epoxy resin, and an aliphatic epoxy resin are more preferable, and a bisphenol A type epoxy resin is particularly preferable. Specific examples thereof include YX-4000H (manufactured by Mitsubishi Chemical Corporation).

Specific examples of the compound having two or more oxetanyl groups in a molecule include ARON OXETANE OXT-121, OXT-221, OX-SQ, and PNOX (all manufactured by Toagosei Company).

<<Alkoxymethyl Group-Containing Cross-Linking Agent>>

It is preferable that the alkoxymethyl group-containing cross-linking agent include a compound having two or more hydroxymethyl groups or alkoxymethyl groups in a molecule.

Preferred examples of the cross-linking agent include a hydroxymethylated or alkoxymethylated phenolic compound, an alkoxymethylated melamine compound, alkoxymethyl glycoluril compounds, and an alkoxymethylated urea compound. Among these, a hydroxymethylated or alkoxymethylated phenolic compound is more preferable because an excellent pattern shape can be obtained. Examples of the compound (C) as a particularly preferable cross-linking agent include a phenol derivative which includes 3 to 5 benzene rings in a molecule, has two or more of hydroxymethyl groups or alkoxymethyl groups in total, and has a molecular weight of 1200 or less, a melamine-formaldehyde derivative having at least two free N-alkoxymethyl groups, and an alkoxymethyl glycoluril derivative.

From the viewpoint of the pattern shape, it is more preferable that the active ray-sensitive or radiation-sensitive composition of the present invention includes at least two compound having two or more alkoxymethyl groups in a molecule as a cross-linking agent, even more preferable that the composition includes at least two phenolic compounds having two or more alkoxymethyl groups in a molecule, and particularly preferable that at least one of the at least two phenolic compounds is a phenol derivative which includes 3 to 5 benzene rings in a molecule, has two or more alkoxymethyl groups in total, and has a molecular weight of 1200 or less.

As the alkoxymethyl group, a methoxymethyl group or an ethoxymethyl group is preferable.

Among the cross-linking agents, the phenolic derivative having a hydroxymethyl group can be obtained by reacting a phenolic compound which does not have the corresponding hydroxymethyl group with formaldehyde in the presence of a base catalyst. Further, a phenolic derivative having an alkoxymethyl group can be obtained by reacting a phenolic derivative having the corresponding hydroxymethyl group with alcohol in the presence of an acid catalyst.

Between the phenolic derivatives synthesized in the above-described manner, the phenolic derivative having an alkoxymethyl group is particularly preferable in terms of the sensitivity and the preservation stability.

Other preferred examples of the cross-linking agent include alkoxymethylated melamine, alkoxymethylated benzoguanamine, alkoxymethylated glycoluril, and alkoxymethylated urea. These can be obtained by respectively converting a methylol group of methylolated melamine, methylolated benzoguanamine, methylolated glycoluril, or methylolated urea into an alkoxymethyl group.

The kind of the alkoxymethyl group is not particularly limited, and examples thereof include a methoxymethyl group, an ethoxymethyl group, a propoxymethyl group, and a butoxymethyl group. From the viewpoint of the amount of outgas to be generated, a methoxymethyl group is particularly preferable.

These alkoxymethyl group-containing cross-linking agents are commercially available, and preferred examples thereof include CYMEL 300, CYMEL 301, CYMEL 303, CYMEL 370, CYMEL 325, CYMEL 327, CYMEL 701, CYMEL 266, CYMEL 267, CYMEL 238, CYMEL 1141, CYMEL 272, CYMEL 202, CYMEL 1156, CYMEL 1158, CYMEL 1123, CYMEL 1170, CYMEL 1174, UFR65, UFR300 (all manufactured by Mitsui Cyanamid Co., Ltd.), NIKALAC MX-750, NIKALAC MX-032, NIKALAC MX-706, NIKALAC MX-708, NIKALAC MX-40, NIKALAC MX-31, NIKALAC MX-270, NIKALAC MX-280, NIKALAC MX-290, NIKALAC MS-11, NIKALAC MW-30HM, NIKALAC MW-100LM, and NIKALAC MW-390 (all manufactured by Sanwa Chemical Co., Ltd.).

Examples of such compounds include hexamethoxymethyl melamine, hexaethoxymethyl melamine, tetramethoxy methyl glycoluril, 1,3-bismethoxymethyl-4,5-bismethoxy-ethyleneurea, and bismethoxymethyl urea, and these compounds are disclosed in EP0,133,216A, German Patent No. 3,634,671, German Patent No. 3,711,264, and EP0,212,482A.

Among these cross-linking agents, particularly preferable cross-linking agents are shown below.

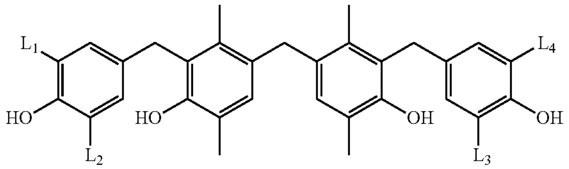

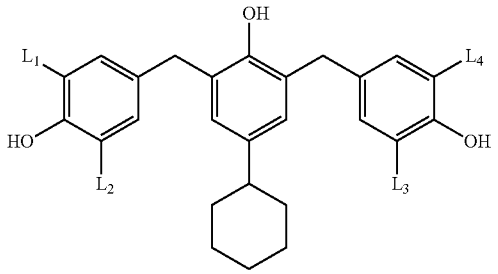

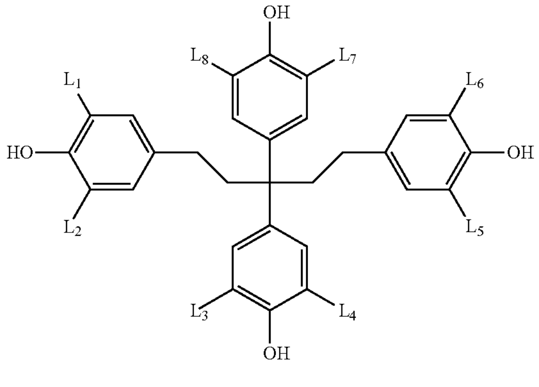

-continued

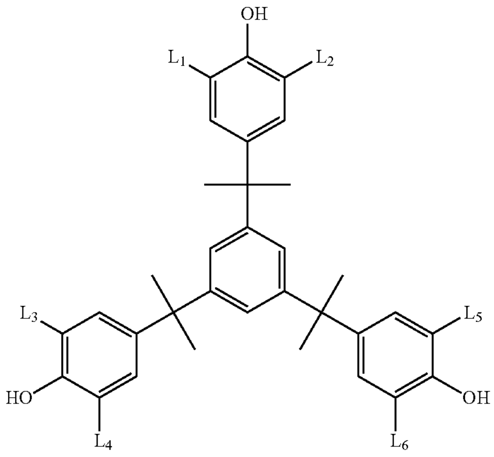

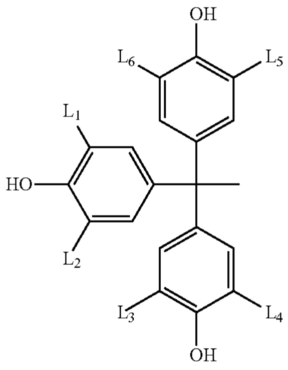

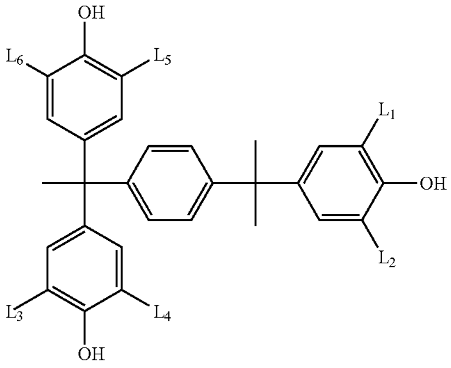

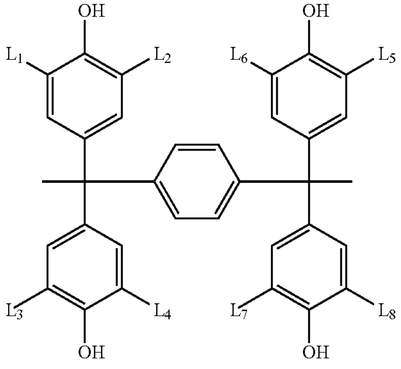

-continued

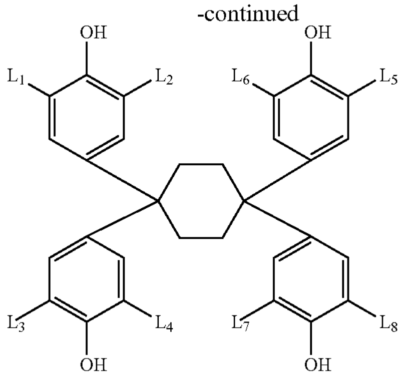

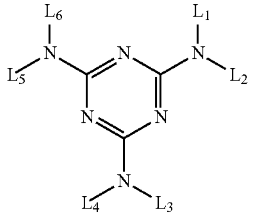

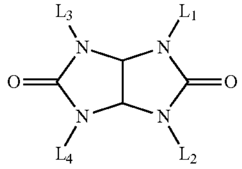

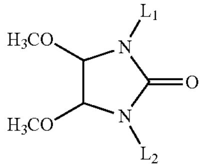

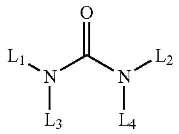

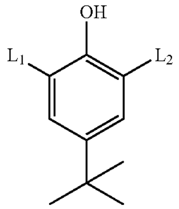

In the formulae, L1 to L8 each independently represent a hydrogen atom, a hydroxymethyl group, a methoxymethyl group, an ethoxymethyl group, or an alkyl group having 1 to 6 carbon atoms.

In the present invention, the amount of the cross-linking agent to be added to the solid content of the active ray-sensitive or radiation-sensitive composition is preferably in a range of 3% by mass to 65% by mass and more preferably in a range of 5% by mass to 50% by mass. When the amount of the cross-linking agent to be added is adjusted to be in a range of 3% by mass to 65% by mass, it is possible to prevent a decrease in the residual film rate and the resolving power and to maintain excellent stability of the resist solution during preservation.

<Sensitizing Dye>

The photosensitive resin composition used in the present invention may include a sensitizing dye for the purpose of facilitating the decomposition thereof in combination with the photoacid generator (B). Particularly in a case where at least one of a compound having a sulfonium cation, a compound having an iodonium cation, a diazodisulfone compound, or a disulfone compound is used, a sensitizing dye is preferably used.

A sensitizing dye absorbs active rays or radiation and enters an electron-excited state. A sensitizing dye in an electron-excited state is brought into contact with a photoacid generator to cause an action, for example, electron transfer, energy transfer, or heat generation. In this manner, a photoacid generator causes a chemical change to be decomposed and generates an acid.

Preferred examples of the sensitizing dye include compounds which belong to the following compounds and have an absorption wavelength of 350 nm to 450 nm.

Preferred examples of the sensitizing dye include polynuclear aromatic compounds (such as pyrene, perylene, triphenylene, anthracene, 9,10-dibutoxyanthracene, 9,10-diethoxyanthracene, 3,7-dimethoxyanthracene, and 9,10-dipropyloxyanthracene); xanthenes (such as fluorescein, eosin, erythrosine, rhodamine B, and rose Bengal); xanthones (such as xanthone, thioxanthone, dimethylthioxanthone, and diethylthioxanthone); cyanines (such as thiacarbocyanine and oxacarbocyanine); merocyanines (such as merocyanine and carbomerocyanine); rhodacyanines; oxonols; thiazines (such as thionine, methylene blue, and toluidine blue); acridines (such as acridine orange, chloroflavin, and acriflavine); acridones (such as acridone and 10-butyl-2-chloroacridone); anthraquinones (such as anthraquinone); squaryliums (such as squarylium); styryls; base styryls (such as 2-[2-[4-(dimethylamino)phenyl]ethenyl]benzoxazole); and coumarins (such as 7-diethylamino-4-methyl coumarin, 7-hydroxy 4-methyl coumarin, and 2,3,6,7-tetrahydro-9-methyl-1H,5H, 11H-[1]benzopyrano[6,7,8-ij]quinolizine-11-on).

Among these sensitizing dyes, polynuclear aromatic compounds, acridones, styryls, base styryls, and coumarins are preferable and polynuclear aromatic compounds are more preferable. Among the polynuclear aromatic compounds, an anthracene derivative is most preferable.

The sensitizing dyes may be used alone or in combination of two or more kinds thereof. In the case where two or more kinds of sensitizing dyes are used in combination, the total amount thereof is set to be in the above-described range. The blending amount of the sensitizing dye is preferably in a range of 0.1% by mass to 20% by mass and more preferably in a range of 1% by mass to 10% by mass based on the photoacid generator.

<Solvent>

It is preferable that the photosensitive resin composition of the present invention contains a solvent.

In the photosensitive resin composition of the present invention, it is preferable that a solution obtained by dissolving a specific resin and a specific photoacid generator which are essential components, and optional compositions of various additives in a solvent is prepared.

A known solvent can be used as the solvent to be used for the photosensitive resin composition of the present invention, and examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, and lactones.

Examples of the solvent to be used for the photosensitive resin composition of the present invention include (1) ethylene glycol monoalkyl ethers such as ethylene glycol monomethyl ether, ethylene glycol monoethyl ether, ethylene glycol monopropyl ether, and ethylene glycol monobutyl ether; (2) ethylene glycol dialkyl ethers such as ethylene glycol dimethyl ether, ethylene glycol diethyl ether, and ethylene glycol dipropyl ether; (3) ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; (4) propylene glycol monoalkyl ethers such as propylene glycol monomethyl ether, propylene glycol monoethyl ether, propylene glycol monopropyl ether, and propylene glycol monobutyl ether; (5) propylene glycol dialkyl ethers such as propylene glycol dimethyl ether, propylene glycol diethyl ether, diethylene glycol monomethyl ether, and diethylene glycol monoethyl ether.

(6) propylene glycol monoalkyl ether acetates such as propylene glycol monomethyl ether acetate, propylene glycol monoethyl ether acetate, propylene glycol monopropyl ether acetate, and propylene glycol monobutyl ether acetate, (7) diethylene glycol dialkyl ethers such as diethylene glycol dimethyl ether, diethylene glycol diethyl ether, and diethylene glycol ethyl methyl ether; (8) diethylene glycol monoalkyl ether acetates such as diethylene glycol monomethyl ether acetate, diethylene glycol monoethyl ether acetate, diethylene glycol monopropyl ether acetate, and diethylene glycol monobutyl ether acetate; (9) dipropylene glycol monoalkyl ethers such as dipropylene glycol monomethyl ether, dipropylene glycol monoethyl ether, dipropylene glycol monopropyl ether, and dipropylene glycol monobutyl ether; (10) dipropylene glycol dialkyl ethers such as dipropylene glycol dimethyl ether, dipropylene glycol diethyl ether, and dipropylene glycol ethyl methyl ether.

(11) dipropylene glycol monoalkyl ether acetates such as dipropylene glycol monomethyl ether acetate, dipropylene glycol monoethyl ether acetate, dipropylene glycol monopropyl ether acetate, and dipropylene glycol monobutyl ether acetate; (12) lactates such as methyl lactate, ethyl lactate, n-propyl lactate, isopropyl lactate, n-butyl lactate, isobutyl lactate, n-amyl lactate, and isoamyl lactate; (13) aliphatic carboxylates such as n-butyl acetate, isobutyl acetate, n-amyl acetate, isoamyl acetate, n-hexyl acetate, 2-ethylhexyl acetate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, and isobutyl butyrate; (14) esters such as ethyl hydroxyacetate, ethyl 2-hydroxy-2-methylpropionate, ethyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxy butyl acetate, 3-methyl-3-methoxy butyl acetate, 3-methyl-3-methoxy butyl propionate, 3-methyl-3-methoxy butyl butyrate, methyl acetoacetate, ethyl acetoacetate, methyl pyruvate, and ethyl pyruvate.

(15) ketones such as methyl ethyl ketone, methyl propyl ketone, methyl-n-butyl ketone, methyl isobutyl ketone, 2-heptanone, 3-heptanone, 4-heptanone, and cyclohexanone; (16) amides such as N-methylformamide, N,N-dimethylformamide, N-methylacetamide, N,N-dimethylacetamide, and N-methylpyrrolidone; and (17) lactones such as γ-butyrolactone.

Moreover, in addition to these solvents, solvents such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, or ethylene carbonate, and propylene carbonate can be added as needed.

Among the above-described solvents, propylene glycol monoalkyl ether acetates and/or diethylene glycol dialkyl ethers are preferable, and diethylene glycol ethyl methyl ether and/or propylene glycol monomethyl ether acetate are particularly preferable.

These solvents can be used alone or in combination of two or more kinds thereof.

In a case where the photosensitive resin composition of the present invention contains a solvent, the content of the solvent is preferably in a range of 1 part by weight to 3,000 parts by weight, more preferably in a range of 5 parts by weight to 2,000 parts by weight, and still more preferably in a range of 10 parts by weight to 1,500 parts by weight with respect to 100 parts by weight of the resin (B).

The solvent may be used alone or in combination of two or more kinds thereof. In a case where two or more kinds of solvents are used, the total amount thereof is within the above-described range.

<Basic Compound>

A basic compound can be arbitrarily selected from compounds used for chemically amplified resists and then used. Examples thereof include aliphatic amines, aromatic amines, heterocyclic amines, quaternary ammonium hydroxide, and quaternary ammonium salts of carboxylic acids.

Examples of the aliphatic amine include trimethylamine, diethylamine, triethylamine, di-n-propylamine, tri-n-propylamine, di-n-pentylamine, tri-n-pentylamine, diethanolamine, triethanolamine, dicyclohexylamine, and dicyclohexylmethylamine.

Examples of the aromatic amine include aniline, benzylamine, N,N-dimethylaniline, and diphenylamine.

Examples of the heterocyclic amine include pyridine, 2-methylpyridine, 4-methylpyridine, 2-ethylpyridine, 4-ethylpyridine, and 2-phenylpyridine. It is preferable that the 4-photosensitive resin composition of the present invention includes a basic compound (component I).

The basic compound (component I) can be arbitrarily selected from compounds used for chemically amplified resists and then used. Examples thereof include aliphatic amines, aromatic amines, heterocyclic amines, quaternary ammonium hydroxide, and quaternary ammonium salts of carboxylic acids.

Examples of the aliphatic amine include trimethylamine, diethylamine, triethylamine, di-n-propylamine, tri-n-propylamine, di-n-pentylamine, tri-n-pentylamine, diethanolamine, triethanolamine, dicyclohexylamine, and dicyclohexylmethylamine.

Examples of the aromatic amine include aniline, benzylamine, N,N-dimethylaniline, and diphenylamine.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, imidazole, benzimidazole, 4-methylimidazole, 2-phenylbenzimidazole, 2,4,5-triphenylimidazole, nicotine, nicotinic acid, nicotinic acid amide, quinoline, 8-oxyquinoline, pyrazine, pyrazole, pyridazine, purine, pyrrolidine, piperidine, cyclohexyl morpholinoethyl thiourea, piperazine, morpholine, 4-methylmorpholine, 1,5-diazabicyclo[4.3.0]-5-nonene, and 1,8-diazabicyclo[5.3.0]-7-undecene.

Examples of the quaternary ammonium hydroxide include tetramethylammonium hydroxide, tetraethylammonium hydroxide, tetra-n-butylammonium hydroxide, and tetra-n-hexylammonium hydroxide.

Examples of the quaternary ammonium salts of carboxylic acid include tetramethylammonium acetate, tetramethylammonium benzoate, tetra-n-butylammonium acetate, and tetra-n-butylammonium benzoate.

The basic compound which can be used in the present invention may be used alone or in combination of two or more kinds thereof, but a combination of two or more kinds thereof is preferable, a combination of two kinds thereof is more preferable, and a combination of two kinds of heterocyclic amine is still more preferable.

In a case where the photosensitive resin composition of the present invention contains a basic compound, the content of the basic compound is preferably in a range of 0.001 parts by weight to 1 part by weight and more preferably in a range of 0.002 parts by weight to 0.2 parts by weight with respect to 100 parts by weight of the specific resin.

<Surfactant>

It is preferable that the photosensitive resin composition used in the present invention contains a surfactant from the viewpoint of improving coating properties.

As the surfactant, any of an anionic surfactant, a cationic surfactant, a non-ionic surfactant, and an amphoteric surfactant can be used, but a preferable surfactant is a non-ionic surfactant.

Examples of the non-ionic surfactant include polyoxyethylene higher alkyl ethers, polyoxyethylene higher alkyl phenyl ethers, higher fatty acid diesters of polyoxyethylene glycol, a fluorine-based surfactant, and a silicone-based surfactant.

It is more preferable that the photosensitive resin composition of the present invention contains a fluorine-based surfactant and/or a silicone-based surfactant as a surfactant.

As the fluorine-based surfactant and the silicone-based surfactant, surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), and JP2001-330953A can be exemplified, and commercially available products can be also used.

Examples of the commercially available products which can be used include fluorine-based surfactants and silicone based surfactants such as F TOP EF301 and F TOP EF303 (both manufactured by Shin Akita Kasei Inc.), Fluorad FC430 and Fluorad FC431 (both manufactured by Sumitomo 3M Limited), Megaface F171, Megaface F173, Megaface F176, Megaface F189, and Megaface R08 (all manufactured by DIC Corporation), Surflon S-382, Surflon SC101, Surflon SC102, Surflon SC103, Surflon SC104, Surflon SC105, and Surflon SC106 (all manufactured by ASAHI GLASS CO., LTD.), and the PF-6320 PolyFox Series of and the like (manufactured by OMNOVA Solution Inc.). In addition, polysiloxane polymer KP-341 (manufactured by Shin-Etsu Chemical Co., Ltd.) can be also used as a silicone-based surfactant.

Further, as a surfactant, a copolymer which contains a constituent unit A and a constituent unit B which are represented by the following Formula (1) and whose weight average molecular weight (Mw) measured by gel permeation chromatography in terms of polystyrene is in a range of 1,000 to 10,000 in a case where tetrahydrofuran (THF) is used as a solvent is exemplified.

(1)

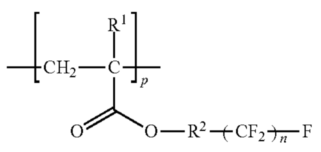

Constituent unit A

-continued

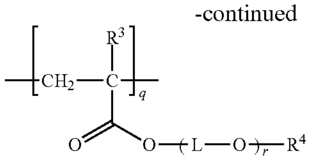

Constituent unit B (In Formula (1), $R^1$ and $R^3$ each independently represent a hydrogen atom or a methyl group; $R^2$ represents a linear alkylene group having 1 to 4 carbon atoms; $R^4$ represents a hydrogen atom or an alkyl group having 1 to 4 carbon atoms; L represents an alkylene group having 3 to 6 carbon atoms, p and q represent the weight percentages showing a weight ratio; p represents a numerical value of 10% by weight to 80% by weight; q represents a numerical value of 20% by weight to 90% by weight; r represents an integer of 1 to 18; and n represents an integer of 1 to 10.)

It is preferable that L represents a branched alkylene group represented by the following Formula (2). $R^5$ in Formula (2) represents an alkyl group having 1 to 4 carbon atoms, and an alkyl group having 1 to 3 carbon atoms is preferable and an alkyl group having 2 or 3 carbon atoms is more preferable in terms of compatibility and wettability with respect to a surface to be coated.

(2)

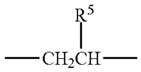

The weight average molecular weight (Mw) of the copolymer is more preferably in a range of 1,500 to 5,000.

These surfactants can be used alone or in combination of two or more kinds thereof.

In a case where the photosensitive resin composition of the present invention contains a surfactant, the amount of the surfactant to be added is preferably 10 parts by weight or less, more preferably in a range of 0.01 parts by weight to 10 parts by weight, and still more preferably in a range of 0.01 parts by weight to 1 part by weight with respect to 100 parts by weight of the specific resin.

Moreover, if necessary, known additives such as an antioxidant, a plasticizer, a thermal radical generator, a thermal acid generator, an acid proliferation agent, an ultraviolet absorber, a thickener, and an organic or inorganic precipitation inhibitor can be added to the photosensitive resin composition of the present invention. The description of paragraphs 0143 to 0148 of JP2011-209692A can be referred to for details and the contents are incorporated in the specification of the present application.

The film thickness of the resist film is preferably in a range of 100 nm to 1000 nm and more preferably in a range of 300 nm to 850 nm from a viewpoint of improving resolving power. Such a film thickness can be obtained by setting the concentration of the solid content in the photosensitive resin composition to be in an appropriate range, allowing the composition to have a suitable viscosity, and improving coating properties and film forming properties.

Hereinafter, a method of patterning an organic semiconductor film used in the present invention will be described.

<Method of Patterning Organic Semiconductor Film>

The method of patterning the organic semiconductor film of the present invention includes:

(1) a process of forming a protective film on the organic semiconductor film;

(2) a process of forming a resist film which includes a photoacid generator generating an organic acid having a pKa of −1 or less and is consisting of a photosensitive resin composition, on the protective film that is on the opposite side of the organic semiconductor film;

(3) a process of exposing the resist film;

(4) a process of performing development using a developer containing an organic solvent to prepare a mask pattern;

(5) a process of removing at least the protective film and the organic semiconductor film of a non-mask portion during a dry etching treatment; and (6) a process of dissolving the protective film using water.

<(1) Process of Forming Protective Film on Organic Semiconductor Film>

The method of patterning the organic semiconductor film of the present invention includes a process of forming a protective film on an organic semiconductor film. The present process is typically performed after the organic semiconductor film is formed on the substrate. In this case, the protective film is formed on a surface that is the opposite side to the surface on the substrate side of the organic semiconductor. The protective film is typically provided on the surface of the organic semiconductor film, but another layer may be provided within the range not departing from the scope of the present invention. Specifically, a water-soluble undercoat layer is exemplified. In addition, only one sheet or two or more sheets of protective films may be provided.

<(2) Process of Forming Resist Film which Includes Photoacid Generator Generating Organic Acid Having pKa of −1 or Less and is Consisting of Photosensitive Resin Composition, on Protective Film on Opposite Side of Organic Semiconductor Film>

After the process (1), in a process (2), a resist film consisting of a photosensitive resin composition is formed on the protective film on the opposite side to the surface of the organic semiconductor side. The resist film is preferably formed by applying the photosensitive resin composition to the surface of the protective film, but may be formed via a film such as an undercoat layer. The description of the protective film can be referred to a method of applying the photosensitive resin composition.

The concentration of the solid content of the photosensitive resin composition is normally in a range of 1.0% by mass to 20% by mass, preferably in a range of 1.5% by mass to 17% by mass, and more preferably in a range of 2.0% by mass to 15% by mass. When the concentration of the solid content is set to be in the above-described range, the water-soluble resin film can be uniformly coated with a resist solution and a resist pattern which has high resolution and a rectangular profile can be formed. The concentration of the solid content is a weight percentage showing the weight of resist components other than the solvent with respect to the total weight of the resin composition.

<(3) Process of Exposing Resist Film>

After the resist film is formed by the process (2), the resist film is exposed. Specifically, the resist film is irradiated with active rays through a mask having a predetermined pattern. The resist film may be exposed only once or multiple times.

Specifically, a substrate provided with a dried coating film of the photosensitive resin composition is irradiated with active rays having a predetermined pattern. The substrate may be exposed to light through a mask or the predetermined pattern may be directly drawn. Active rays having a wavelength of 300 nm to 450 nm and preferably a wavelength of 365 nm are preferably used. After this process, a heating process after exposure (PEB) may be performed as needed.

A low-pressure mercury lamp, a high-pressure mercury lamp, an ultra-high pressure mercury lamp, a chemical lamp, a laser generator, or an LED light source can be used for exposure using active rays.

In a case where a mercury lamp is used, active rays having a wavelength of g-line (436 nm), a wavelength of i-line (365 nm), and a wavelength of h-line (405 nm) are preferably used. A mercury lamp is preferable compared to a laser in terms of suitability for exposure of a large area.

In a case of using a laser, a solid (YAG) laser having a wavelength of 343 nm or 355 nm is preferably used, an excimer laser having a wavelength of 351 nm (XeF) is preferably used, and a semiconductor laser having a wavelength of 375 nm or 405 nm is preferably used. Among these, a wavelength of 355 nm or 405 nm is more preferable in terms of stability or costs. A coating film can be irradiated with a laser once or multiple times.

The energy density per pulse of a laser is preferably in a range of 0.1 $mJ/cm^2$ to 10,000 $mJ/cm^2$. In order for the coating film to be sufficiently cured, the energy density thereof is more preferably 0.3 $mJ/cm^2$ or greater and most preferably 0.5 $mJ/cm^2$ or greater. In order for the coating film not to be decomposed by an ablation phenomenon, the energy density is more preferably 1,000 $mJ/cm^2$ or less and most preferably 100 $mJ/cm^2$ or less.

Further, the pulse width is preferably in a range of 0.1 nsec to 30,000 nsec. In order for the colored coating film not to be decomposed by an ablation phenomenon, the pulse width is more preferably 0.5 nsec or greater and most preferably 1 nsec or greater. Further, in order to improve aligning accuracy at the time of scanning exposure, the pulse width is more preferably 1,000 nsec or less and most preferably 50 nsec or less.

In addition, the frequency of the laser is preferably in a range of 1 Hz to 50,000 Hz and more preferably in a range of 10 Hz to 1,000 Hz.

Moreover, in order to shorten the exposure treatment time, the frequency of the laser is more preferably 10 Hz or greater and most preferably 100 Hz or greater. In order to improve aligning accuracy at the time of scanning exposure, the frequency of the laser is more preferably 10,000 Hz or less and most preferably 1,000 Hz or less.

When a laser is compared to a mercury lamp, a laser is preferable in terms that a laser can be more easily focused and a mask for pattern formation during the exposure process is unnecessary and this leads to cost reduction.

An exposure device which can be used in the present invention is not particularly limited, and a CALLISTO (manufactured by V-Technology Co., Ltd.), a AEGIS (manufactured by V-Technology Co., Ltd.), or a DF2200G (manufactured by SCREEN Holdings Co., Ltd.) can be exemplified as a commercially available product. Further, devices other that those described above are suitably used.

Moreover, irradiation light can be adjusted through a spectral filter such as a long wavelength cut filter, a short wavelength cut filter, and a band-pass filter if necessary.

<(4) Process of Performing Development Using Developer Containing Organic Solvent to Prepare Mask Pattern>

After the resist film is exposed by the process (3), development is performed using a developer containing an organic solvent. The development is preferably a negative type development. The sp value of the solvent contained in the developer is preferably less than 19 $MPa^{1/2}$ and more preferably 18 $MPa^{1/2}$ or less.

As the organic solvent contained in the developer used in the present invention, a polar solvent such as a ketone-based solvent, an ester-based solvent, or an amide-based solvent and a hydrocarbon-based solvent can be used.

Examples of the ketone-based solvent include 1-octanone, 2-octanone, 1-nonanone, 2-nonanone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, methyl formate, ethyl formate, butyl formate, propyl formate, ethyl lactate, butyl lactate, and propyl lactate.

Examples of the amide-based solvent include N-methyl-2-pyrrolidone, N,N-dimethylacetamide, N,N-dimethylformamide, hexamethyl phosphoric triamide, and 1,3-dimethyl-2-imidazolidinone.

Examples of the hydrocarbon-based solvent include an aromatic hydrocarbon-based solvent such as toluene or xylene and an aliphatic hydrocarbon-based solvent such as pentane, hexane, octane, or decane.

The above-described solvents may be used alone or in combination of two or more kinds thereof. In addition, the solvents may be used by being mixed with solvents other than the solvents described above. In this case; for the purpose of sufficiently exhibiting the effects of the present invention, it is preferable that the moisture content in a whole developer is less than 10% by mass and more preferable that substantially no moisture is contained. The term "substantially" here means that the moisture content in a whole developer is 3% by mass or less and more preferably below the measurement limit.

That is, the amount of the organic solvent used with respect to an organic developer is preferable in a range of 90% by mass to 100% by mass and preferably in a range of 95% by mass to 100% by mass with respect to the total amount of the developer.

Particularly, it is preferable that the organic developer is a developer containing at least one organic solvent selected from the group consisting of a ketone-based solvent, an ester-based solvent, and an amide-based solvent.

In addition, the organic developer may contain an appropriate amount of a basic compound as needed. Examples of the basic compound are the same as those described above in the section of the basic compound.

The vapor pressure of the organic developer at 20° C. is preferably 5 kPa or less, more preferably 3 kPa or less, and particularly preferably 2 kPa or less. When the vapor pressure of the organic developer is set to 5 kPa or less, evaporation on a substrate of the developer or in a developing cup is suppressed, temperature uniformity in a wafer surface is improved, and thus dimensional uniformity in the wafer surface is improved.

Specific examples of an organic developer having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, or methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, butyl formate, propyl formate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as toluene or xylene; and an aliphatic hydrocarbon-based solvent such as octane or decane.

Specific examples of an organic developer having a vapor pressure of 2 kPa or less which is the particularly preferred range include a ketone-based solvent such as 1-octanone, 2-octanone, 1-nonanone, 2-nonanone, 4-heptanone, 2-hexanone, diisobutyl ketone, cyclohexanone, methyl cyclohexanone, or phenyl acetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxy butyl acetate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as xylene; and an aliphatic hydrocarbon-based solvent such as octane or decane.

An appropriate amount of a surfactant can be added to the developer as needed.

The surfactants described in the section of the water-soluble resin composition are preferably used as the surfactants although not particularly limited.

In a case where a surfactant is mixed with the developer, the content is normally in a range of 0.001% by mass to 5% by mass, preferably in a range of 0.005% by mass to 2% by mass, and still more preferably in a range of 0.01% by mass to 0.5% by mass with respect to the total amount of the developer.

As a developing method, a method of immersing a substrate in a bath filled with a developer for a certain period of time (dip method); a method of performing development by raising a developer onto the surface of a substrate using the surface tension and allowing the developer to stand still for a certain period of time (paddle method); a method of spraying a developer on the surface of a substrate (spray method); and a method of discharging a developer while a developer discharge nozzle is scanned at a constant rate on a substrate that rotates at a constant rate (dynamic dispense method) can be used.

In a case where the various developing methods include a method of discharging a developer to a resist film from a development nozzle of a developing device, the discharge pressure (the flow rate per unit area of the developer to be discharged) of the developer to be discharged is preferably in a range of 2 $mL/sec/mm^2$ or less, more preferably 1.5 $mL/sec/mm^2$ or less, and still more preferably 1 $mL/sec/mm^2$ or less. The lower limit of the flow rate is not particularly limited, but is preferably 0.2 $mL/sec/mm^2$ or greater when throughput is considered.

When the discharge pressure of the developer to be discharged is set to be in the above-described range, defects in a pattern derived from resist residues after development can be significantly reduced.

The details of this mechanism is not clear, but it is considered that the defects can be reduced because the pressure of the developer being applied to the resist film is decreased and thus unexpected scraping or collapsing of the resist film and the resist pattern is suppressed by setting the discharge pressure to be in the above-described range.

In addition, the discharge pressure ($mL/sec/mm^2$) of the developer is a value in a developing nozzle outlet in the developing device.

Examples of a method of adjusting the discharge pressure of the developer include a method of adjusting the discharge pressure using a pump or the like and a method of adjusting and changing the discharge pressure with a supply from a pressure tank.

Further, after the process of performing development using the developer containing an organic solvent, a process of stopping development may be carried out while the organic solvent is replaced by another solvent.

<(5) Process of Removing at Least Protective Film and Organic Semiconductor of Non-Mask Portion During Dry Etching Treatment>

For example, the resist film is developed and a mask pattern is prepared, and then the water-soluble resin film and the organic semiconductor of at least a non-mask portion are removed during the etching treatment. The non-mask portion indicates a portion which is not exposed to light due to a mask when a mask pattern is prepared by exposing the resist film to light.

Specifically, during the dry etching treatment, the resist pattern is used as an etching mask and at least the protective film and the organic semiconductor are dry-etched. Typical examples of the dry etching include methods described in JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), and JP1986-41102A (JP-S61-41102A).

It is preferable that the dry etching is performed by following an aspect described below from viewpoints of forming a pattern section to have a shape close to a rectangular shape and further reducing damage to the organic semiconductor.

An aspect which includes a first step of etching that performs etching up to a region (depth) to which the organic semiconductor is not exposed using a mixed gas of fluorine-based gas and oxygen gas ($O_2$), a second step of etching that performs etching preferably close to a region (depth) to which the organic semiconductor is exposed using mixed gas of nitrogen gas ($N_2$) and oxygen gas ($O_2$) after the first step of etching, and overetching performed after the organic semiconductor is exposed is preferable. Hereinafter, a specific method of the dry etching, the first step of etching, the second step of etching and the overetching will be described.

The dry etching is performed by acquiring etching conditions in advance using the following method.

(1) An etching rate (nm/min) in the first step of etching and an etching rate (nm/min) in the second step of etching are respectively calculated. (2) The etching time over which a desired thickness is obtained by the first step of etching and the etching time over which a desired thickness is obtained by the second step of etching are respectively calculated. (3)

The first step of etching is performed according to the etching time calculated in the process (2) described above. (4) The second step of etching is performed according to the etching time calculated in the process (2) described above. Alternatively, the etching time is determined by end point detection and then the second step of etching may be performed according to the determined etching time. (5) The overetching time with respect to the total time of (3) and (4) described above is calculated and the overetching is performed.

It is preferable that the mixed gas used in the first step of the etching process contains fluorine-based gas and oxygen gas ($O_2$) from a viewpoint of processing an organic material, which is a film to be etched, to have a rectangular shape. Moreover, in the first step of the etching process, damage to the organic semiconductor can be avoided by performing etching up to a region to which the organic semiconductor is not exposed. In addition, it is preferable that the etching treatment is performed using a mixed gas of nitrogen gas and oxygen gas in the second step of the etching process and the overetching process from a viewpoint that the etching is performed up to the region to which the organic semiconductor is not exposed using a mixed gas of fluorine-based gas and oxygen gas during the first step of the etching process and thus damage to the organic semiconductor is avoided.

It is important that the ratio of the etching amount during the first step of the etching process to the etching amount during the second step of the etching process is determined such that the rectangular properties due to the etching treatment during the first step of the etching process are not degraded. In addition, the ratio of the etching amount in the second step of the etching process to the total etching amount (the total amount of the etching amount in the first step of the etching process and the etching amount in the second step of the etching process) is preferably greater than 0% and equal to or less than 50% and more preferably in a range of 10% to 20%. The etching amount indicates the amount calculated from a difference between the film thickness of a remaining film to be etched and the film thickness before etching.

In addition, it is preferable that the etching includes the overetching process. It is preferable that the overetching treatment is performed by setting an overetching ratio. Further, it is preferable that the overetching ratio is calculated from the time for the etching treatment which is carried out for the first time. The overetching ratio can be arbitrarily set, but the overetching ratio is preferably 30% or less, more preferably 5% to 25%, and particularly preferably 10% to 15% of the etching treatment time in this etching process from a viewpoint of maintaining etching resistance of a photoresist and rectangular properties of a pattern to be etched.

<(6) Process of Dissolving Protective Film in Water to be Removed>>

After the etching, the protective film is removed using a solvent or water. In a case of a water-soluble resin, water is preferable.

As a method of removing the water-soluble resin film using water, a method of spraying cleaning water to the resist pattern from a spray type or shower type spray nozzle and removing the protective film is exemplified. As the cleaning water, pure water can be preferably used. Further, as the spray nozzle, a spray nozzle in which the entire support is included in the spray range or a spray nozzle which is a movable spray nozzle and in which the entire support is included in the movable range can be exemplified. In a case where the spray nozzle is a movable type nozzle, the resist pattern can be more effectively removed by moving the spray nozzle from the center portion of the support to the end portion of the support two or more times during the process of removing the water-soluble resin film and spraying cleaning water.

It is preferable that a process of drying or the like is performed after water is removed. The drying temperature is preferably in a range of 80° C. to 120° C.

<Industrial Applicability>

The present invention can be used for production of an electronic device using an organic semiconductor. Here, the electronic device means a device that includes a semiconductor and two or more electrodes and controls a current flowing between the electrodes and a voltage to be generated using electricity, light, magnetism, and chemical substances or a device that generates light, an electric field, or a magnetic field using applied voltage or a current. Examples thereof include an organic photoelectric conversion element, an organic field effect transistor, an organic electroluminescence light emitting device, a gas sensor, an organic rectifying element, an organic inverter, and an information recording element. The organic photoelectric conversion element can be used for a light sensor and energy conversion (solar cell). Among these, an organic field effect transistor, an organic photoelectric conversion element, or an organic electroluminescence light emitting device is preferable, an organic field effect transistor or an organic photoelectric conversion element is more preferable, and an organic field effect transistor is particularly preferable.

EXAMPLES

Hereinafter, the present invention will be more specifically described with reference to examples, but the present invention is not limited to the examples described below within the range not departing from the scope of the present invention. Further, "%" and "parts" are on a mass basis unless otherwise noted.

Abbreviations of respective compounds respectively indicate the following compounds.

THPMA: 2-tetrahydropyranyl methacrylate (synthetic product)

V-601: dimethyl 2,2-azobis(2-methylpropionate) (manufactured by Wako Pure Chemical Industries, Ltd.)

PGMEA: methoxypropyl acetate (manufactured by Daicel Corporation)

Synthesis Example 4: Synthesis of THPMA 50.33 g (0.585 mol) of methacrylic acid and 0.27 g (0.2% by mole) of camphorsulfonic acid were mixed with each other in a three-necked flask and then the mixture was cooled to 15° C. 49.21 g (0.585 mol) of 3,4-dihydrofuran was added dropwise to the solution. A saturated sodium bicarbonate aqueous solution (500 mL) was added dropwise to the reaction solution, and the resultant was extracted with ethyl acetate (500 mL) and dried over magnesium sulfate. The insoluble matter was concentrated at 40° C. or lower under a reduced pressure after filtration and a colorless oil residue was distilled off under reduced pressure, thereby obtaining 68.64 g of THPMA.

Synthesis Example: Synthesis of Resin B1

PGMEA (24.16 g) was added to a three-necked flask and the temperature was increased to 86° C. under a nitrogen atmosphere. THPMA (11.60 g), norbornane lactone methacrylate (9.18 g), cyclohexyl methacrylate (3.38 g), and V-601 (0.895 g, 2.59% by mole with respect to monomers) were dissolved in a mixed solution of PGMEA (16.10 g) and γ-butyllactone (8.05 g) and the mixed solution was added dropwise to the above-described solution for 3 hours. After dropwise addition, the solution was stirred for 4 hours and the reaction finished. White powder generated by re-precipitating the reaction solution in 2 L of methanol was recovered through filtration, thereby obtaining a resin B1. The weight average molecular weight was 21,000.

Synthesis Examples: Synthesis of Resins B2 to B10

Resins B2 to B10 were obtained in the same manner as in the synthesis example of the resin B1 except that a used monomer was changed.

Synthesis Example: Synthesis of Photoacid Generator A1

Aluminum chloride (10.6 g) and 2-chloropropionyl chloride (10.1 g) were added to a suspension of 2-naphthol (10 g) and chlorobenzene (30 mL) and the mixed solution was heated to 40° C. and reacted for 2 hours. Under ice-cold conditions, a 4N-HCl aqueous solution (60 mL) was added dropwise to the reaction solution and ethyl acetate (50 mL) was added to the solution for liquid separation. Potassium carbonate (19.2 g) was added to an organic layer, the mixture was reacted at 40° C. for 1 hour, a 2N-HCl aqueous solution (60 mL) was added for liquid separation, the organic layer was concentrated, and crystals were reslurried with diisopropyl ether (10 mL), filtered off, and dried, thereby obtaining a ketone compound (6.5 g).

Acetic acid (7.3 g) and a 50 mass % hydroxylamine aqueous solution (8.0 g) were added to a suspension of the obtained ketone compound (3.0 g) and methanol (30 mL), and the solution was heated and refluxed. After the solution was cooled, water (50 mL) was added thereto, and deposited crystals were filtered off and then washed with cold methanol and dried, thereby obtaining an oxime compound (2.4 g).

The obtained oxime compound (1.8 g) was dissolved in acetone (20 mL), triethylamine (1.5 g) and 2,4,6-triisopropyl phenyl sulfonyl chloride (3.8 g) were added thereto under ice-cold conditions, the temperature was increased to room temperature, and the solution was reacted for 1 hour. Water (50 mL) was added to the reaction solution and the deposited crystals were filtered off, reslurried with methanol (20 mL), filtered off, and dried, thereby obtaining a photoacid generator A1 (2.3 g).

Synthesis Example: Synthesis of Photoacid Generator A2

N-hydroxy-1,8-naphthalimide (10.65 g) was dissolved in DMF (100 mL), triethylamine (1.5 g) and 2,4,6-triisopropyl phenyl sulfonyl chloride (16.0 g) were added thereto under ice-cold conditions, the temperature was increased to room temperature, and the solution was reacted for 1 hour. Water (500 mL) was added to the reaction solution and the deposited crystals were filtered off, reslurried with methanol (20 mL), filtered off, and dried, thereby obtaining a photoacid generator A2 (19.7 g).

Synthesis Example: Synthesis of Photoacid Generator A6

4-(phenylthio)phenyl diphenyl iodonium chloride (20.6 g) obtained by adding ammonia water (28% solution, 3.3 g) to 100 mL of methanol in which 2,4,6-triisopropylphenyl sulfonyl chloride (16.0 g) was dissolved and stirring the solution was dissolved in 100 mL of methanol, and 2,4,6-triisopropyl phenyl sulfonic acid ammonium salt adjusted in the above-described manner was added thereto for salt exchange. The solvent was removed under reduced pressure using an evaporator, and the resultant was washed with a mixed solution of water and acetone (8:2) and then recrystallized, thereby obtaining a photoacid generator A6 (23.5 g).

Synthesis Example: Synthesis of Photoacid Generator A7

A photoacid generator A7 (25.7 g) was obtained in the same manner as the synthesis of the photoacid generator A6 except that 2,4,6-triisopropylhexylphenyl sulfonyl chloride (16.0 g) was changed into 2,4,6-tricyclohexyl phenyl sulfonyl chloride (23 g).

Synthesis Example: Synthesis of Photoacid Generator A8

20 g of bromomethyl cyclohexane and 1-naphthol (12.5 g) were dissolved in 300 g of NMP in a three-necked flask, potassium carbonate (12 g) and potassium iodide (14 g) were added thereto, and the solution was heated at 120° C. for 8 hours. 300 g of water was added to the reaction solution, the solution was extracted with 100 g of hexane three times, the obtained organic layer was combined therewith for further extraction once with 100 g of a 1 N sodium hydroxide aqueous solution and extraction once with 100 g of water, and the resultant was washed once with 100 g of Brine and then concentrated, thereby obtaining 13 g of cyclohexyl methyl naphthyl ether.

After 13.1 g of cyclohexyl methyl naphthyl ether was dissolved in 65 g of an Eaton reagent in a three-necked flask, 5.7 g of tetramethylene sulfoxide was added dropwise thereto while the solution was stirred, and the solution was further stirred for 3 hours. The reaction solution was poured into 240 g of water, and 2,4,6-tricylcohexyl phenyl sulfonyl chloride (23 g) and 50 g of chloroform were added thereto. An organic layer was separated out, and extraction was further carried out two times using 50 g of chloroform from the aqueous layer. The obtained organic layer was combined and the resultant was concentrated after being washed with water two times. The obtained composition was recrystallized using 20 g of ethyl acetate, thereby obtaining 22 g of a photoacid generator A8.

Synthesis Example: Synthesis of Photoacid Generator A10

After nonafluoropropyl-1,3-disulfonyl fluoride (7.5 g) was dissolved in THF (100 mL), and 1,3,5-tricyclohexyl phenyl (6.8 g) was added thereto. Triethylamine (4.4 g) was added dropwise thereto at room temperature for 1 hour and the solution was stirred at room temperature for 6 hours. Next, trifluoromethanesulfonamide (3.0 g) was added thereto, and the reaction solution was heated to 80° C. for 1 hour and then stirred for 6 hours. The reaction solution was cooled to room temperature, ethyl acetate (300 mL) was added thereto, and the generated precipitate was removed by filtration. The reaction solution was washed with deionized water, isopropanol (30 mL) and 1 N hydrochloric acid (10 mL) were added thereto, and the solution was heated at 60° C. for 3 hours, cooled to room temperature, and crystallized using 1 L of distilled water.

Obtained crystals were dissolved in a mixed solution of THF (100 mL) and IPA (30 mL) and a THF solution of di(4-t-butylphenyl)iodonium bromide (3.5 g) was added to the mixed solution for salt exchange. The solution was extracted with methylene chloride (100 mL) two times, washed with distilled water (100 mL) five times, and concentrated. 50 mL of cyclohexyl methyl ether was added to the obtained oily crude product, the mixture was stirred, and deposited crystals were filtered, thereby obtaining a photoacid generator A10 (3.9 g).

(1) Preparation of Composition for Forming Protective Film and Photosensitive Resin Composition Respective components listed in the following table were mixed into a solvent F1 (PGMEA) to obtain a uniform solution, the solution was filtered using a polytetrafluoroethylene filter having a pore size of 0.1 μm, and then compositions for forming a protective film and photosensitive resin compositions of Examples 1 to 21 and Comparative Examples 1 to 12 were respectively prepared. The concentration of the solid content was 15% by mass.

TABLE 1

| | Protective film composition | | | | | | Photosensitive resin composition | | | | | | | | | | | |
|---|---|---|---|---|---|---|---|---|---|---|---|---|---|---|---|---|---|---|
| | Resin | | Surfactant | | Solvent | | Photoacid generator (A) | | Resin (B) | | Basic compound | | Additive | | Surfactant | | Solvent | |
| | Type | Part | Type | Part | Type | Part | Type | Part | Type | Part | Type | Part | Type | Part | Type | Part | Type | Part |
| Example 1 | X1 | 9.9 | Y1 | 0.1 | Water | 90 | A1 | 0.16 | B1 | 14.75 | C | 0.05 | | | E1 | 0.04 | F1 | 85 |
| Example 2 | X1 | 9.9 | Y1 | 0.1 | Water | 90 | A2 | 0.16 | B1 | 14.75 | C | 0.05 | | | E1 | 0.04 | F1 | 85 |
| Example 3 | X1 | 9.9 | Y1 | 0.1 | Water | 90 | A3 | 0.16 | B1 | 14.75 | C | 0.05 | | | E1 | 0.04 | F1 | 85 |
| Example 4 | X1 | 9.9 | Y1 | 0.1 | Water | 90 | A4 | 0.16 | B1 | 14.25 | C | 0.05 | G1 | 0.05 | E1 | 0.04 | F1 | 85 |
| Example 5 | X1 | 9.9 | Y1 | 0.1 | Water | 90 | A5 | 0.16 | B1 | 14.25 | C | 0.05 | G1 | 0.05 | E1 | 0.04 | F1 | 85 |
| Example 6 | X1 | 9.9 | Y1 | 0.1 | Water | 90 | A6 | 0.16 | B1 | 14.75 | C | 0.05 | | | E1 | 0.04 | F1 | 85 |
| Example 7 | X1 | 9.9 | Y1 | 0.1 | Water | 90 | A7 | 0.16 | B1 | 14.75 | C | 0.05 | | | E1 | 0.04 | F1 | 85 |
| Example 8 | X1 | 9.9 | Y1 | 0.1 | Water | 90 | A8 | 0.16 | B1 | 14.25 | C | 0.05 | G1 | 0.05 | E1 | 0.04 | F1 | 85 |
| Example 9 | X1 | 9.9 | Y1 | 0.1 | Water | 90 | A9 | 0.16 | B1 | 14.25 | C | 0.05 | G1 | 0.05 | E1 | 0.04 | F1 | 85 |
| Example 10 | X1 | 9.9 | Y1 | 0.1 | Water | 90 | A10 | 0.16 | B1 | 14.25 | C | 0.05 | G1 | 0.05 | E1 | 0.04 | F1 | 85 |
| Example 11 | X1 | 9.9 | Y1 | 0.1 | Water | 90 | A1 | 0.16 | B2 | 14.75 | C | 0.05 | | | E1 | 0.04 | F1 | 85 |
| Example 12 | X1 | 9.9 | Y1 | 0.1 | Water | 90 | A1 | 0.16 | B3 | 14.75 | C | 0.05 | | | E1 | 0.04 | F1 | 85 |
| Example 13 | X1 | 9.9 | Y1 | 0.1 | Water | 90 | A1 | 0.16 | B4 | 14.75 | C | 0.05 | | | E1 | 0.04 | F1 | 85 |
| Example 14 | X1 | 9.9 | Y1 | 0.1 | Water | 90 | A1 | 0.16 | B5 | 14.75 | C | 0.05 | | | E1 | 0.04 | F1 | 85 |
| Example 15 | X2 | 9.9 | Y1 | 0.1 | Water | 90 | A1 | 0.16 | B6 | 14.75 | C | 0.05 | | | E1 | 0.04 | F1 | 85 |
| Example 16 | X1 | 9.9 | Y1 | 0.1 | Water | 90 | A1 | 0.16 | B7 | 14.75 | C | 0.05 | | | E1 | 0.04 | F1 | 85 |
| Example 17 | X3 | 9.9 | Y1 | 0.1 | Water | 90 | A1 | 0.16 | B1 | 14.75 | C | 0.05 | | | E1 | 0.04 | F1 | 85 |
| Example 18 | X4 | 9.9 | Y1 | 0.1 | Water | 90 | A1 | 0.16 | B1 | 14.75 | C | 0.05 | | | E1 | 0.04 | F1 | 85 |
| Example 19 | X1 | 9.9 | Y1 | 0.1 | Water | 90 | A1 | 0.16 | B8 | 14.75 | C | 0.05 | | | E1 | 0.04 | F1 | 85 |
| Example 20 | X1 | 9.9 | Y1 | 0.1 | Water | 90 | A1 | 0.16 | B9 | 14.25 | C | 0.05 | D1 | 3.75 | E1 | 0.04 | F1 | 85 |
| Example 21 | X1 | 9.9 | Y1 | 0.1 | Water | 90 | A1 | 0.16 | B10 | 14.25 | C | 0.05 | D1 | 3.75 | E1 | 0.04 | F1 | 85 |
| Example 22 | X1 | 9.9 | Y1 | 0.1 | Water | 90 | A1 | 0.16 | B11 | 11 | C | 0.05 | D1 | 3.75 | E1 | 0.04 | F1 | 85 |
| Example 24 | X1 | 9.9 | Y1 | 0.1 | Water | 90 | A1 | 0.16 | B11 | 11 | C | 0.05 | D2 | 3.75 | E1 | 0.04 | F1 | 85 |
| Example 25 | X1 | 9.9 | Y1 | 0.1 | Water | 90 | A1 | 0.16 | B11 | 11 | C | 0.05 | D3 | 3.75 | E1 | 0.04 | F1 | 85 |
| Example 26 | X1 | 9.9 | Y1 | 0.1 | Water | 90 | A1 | 0.16 | B11 | 11 | C | 0.05 | D4 | 3.75 | E1 | 0.04 | F1 | 85 |
| Comparative Example 1 | X1 | 9.9 | Y1 | 0.1 | Water | 90 | AC1 | 0.16 | B1 | 14.25 | C | 0.05 | G1 | 0.05 | E1 | 0.04 | F1 | 85 |
| Comparative Example 2 | X1 | 9.9 | Y1 | 0.1 | Water | 90 | AC2 | 0.16 | B1 | 14.25 | C | 0.05 | G1 | 0.05 | E1 | 0.04 | F1 | 85 |
| Comparative Example 3 | X1 | 9.9 | Y1 | 0.1 | Water | 90 | AC3 | 0.16 | B1 | 14.75 | C | 0.05 | | | E1 | 0.04 | F1 | 85 |

Abbreviations in Table 1 are as follows.

X1: polyvinyl pyrrolidone (PITTS CALL K-30, manufactured by DKS Co., Ltd.)

X2: polyvinyl alcohol (PXP-05, manufactured by JAPAN VAM & POVAL CO., LTD.)

X3: pullulan (manufactured by Hayashibara Co., Ltd.)

X4: methyl cellulose (METOLOSE SM-4, manufactured by Shin-Etsu Chemical Co., Ltd.)

Y1: SURFYNOL 440 (manufactured by Nissin Chemical Co., Ltd.)

A1: (the following structure, synthetic product), pKa-2 of generated acid

A2: (the following structure, synthetic product), pKa-2 of generated acid

A3: (the following structure, manufactured by Midori Kagaku Co., Ltd.), pKa-1 of generated acid A4: (the following structure, manufactured by Wako Pure Chemical Industries, Ltd.), pKa-2 of generated acid A5: (the following structure, manufactured by Midori Kagaku Co., Ltd.), pKa-2 of generated acid A6: (the following structure, synthetic product), pKa-2 of generated acid A7: (the following structure, synthetic product), pKa-2 of generated acid A8: (the following structure, synthetic product), pKa-2 of generated acid A9: (the following structure, synthetic product), pKa-2 of generated acid A10: (the following structure, synthetic product)

AC1: (the following structure), pKa-7 of generated acid (inorganic acid)

AC2: (the following structure), pKa-8 of generated acid (inorganic acid)

AC3: (the following structure), pKa-0.25 of generated acid

The pKa of the generated acid was measured in conformity with D. H. Ripin, D. A. Evans pKa Table pKa Data Compiled by R. Williams.

B1: (the following structure, synthetic product)

B2: (the following structure, synthetic product)

B3: (the following structure, synthetic product)

B4: (the following structure, synthetic product)

B5: (the following structure, synthetic product)

B6: (the following structure, synthetic product)

B7: (the following structure, synthetic product)

B8: (the following structure, synthetic product)

B9: (the following structure, synthetic product)

B10: (the following structure, synthetic product)

B11: (the following structure, manufactured by Nippon Soda Co., Ltd.)

C: cyclohexyl morpholino ethyl thiourea (the following structure, manufactured by Inabata & Co., Ltd.)

D1: NIKALAC MX-270 (the following structure, manufactured by Sanwa Chemical Co., Ltd.)

D2: NIKALAC MX-100LM (the following structure, manufactured by Sanwa Chemical Co., Ltd.)

D3: CELLOXIDE 2021P (the following structure, manufactured by DAICEL CORPORATION)

D4: YX-4000H (the following structure, manufactured by Mitsubishi Chemical Corporation)

G1: 9,10-dibutoxyanthracene (manufactured by Sigma-Aldrich Corporation)

E1: PF-6320 (manufactured by OMNOVA Solutions Inc.)

F1: PGMEA methoxypropyl acetate (manufactured by DAICEL CORPORATION)

A1

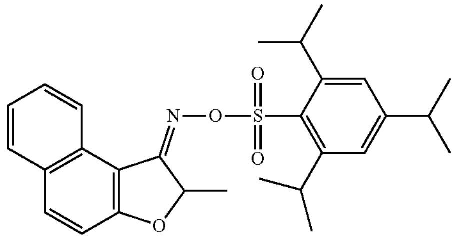

A2

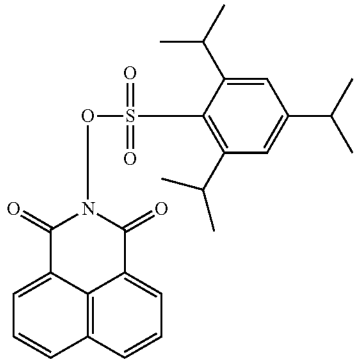

A3

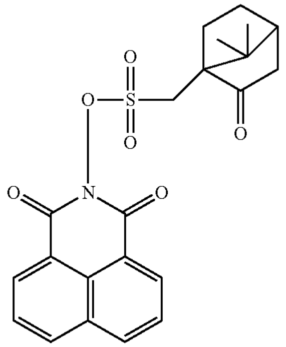

A4

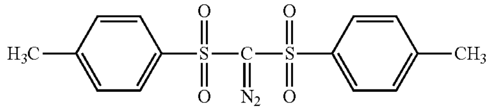

A5

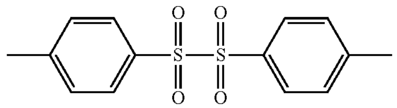

A6

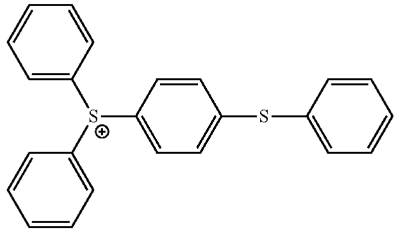

-continued
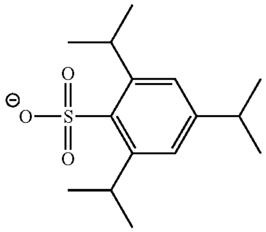
A7
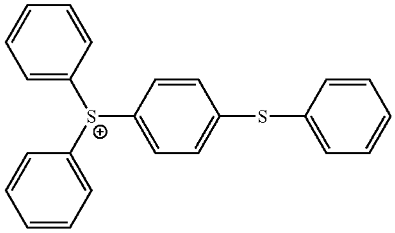
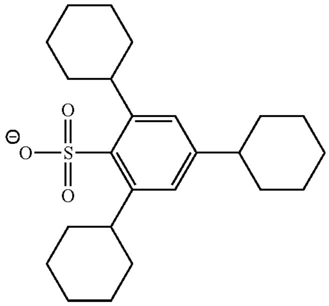
A8
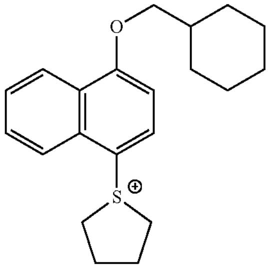
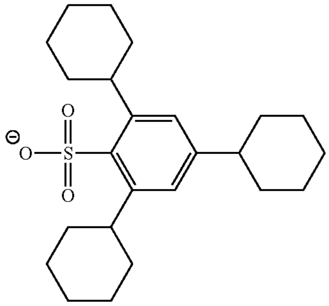
A9
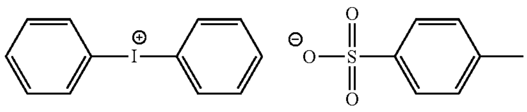
A10
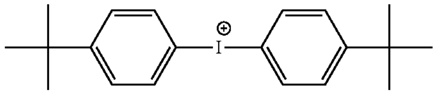
-continued
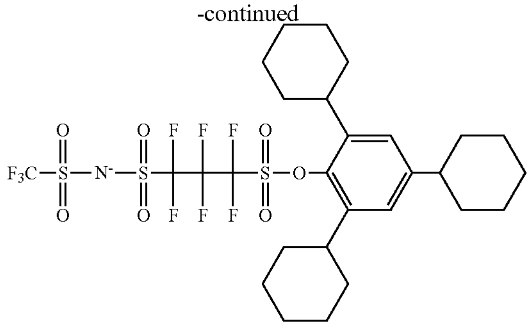
AC1
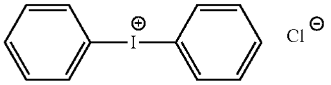
AC2
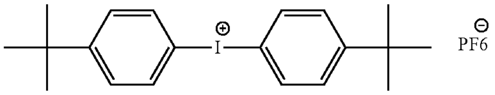
AC3
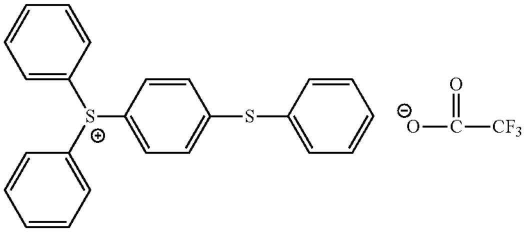
B1
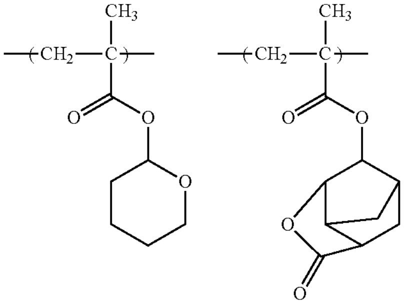
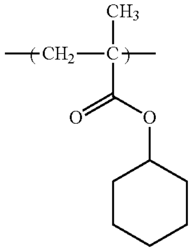
Monomer unit weight ratio (48/38/14), Mw: 21000
B2
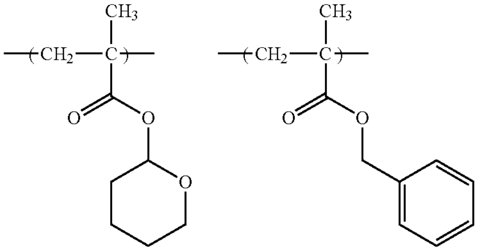

-continued
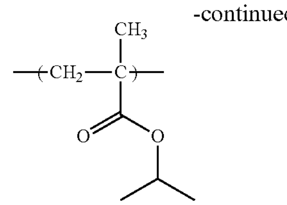
Monomer unit weight ratio
(48/40/12), Mw: 24000
B3
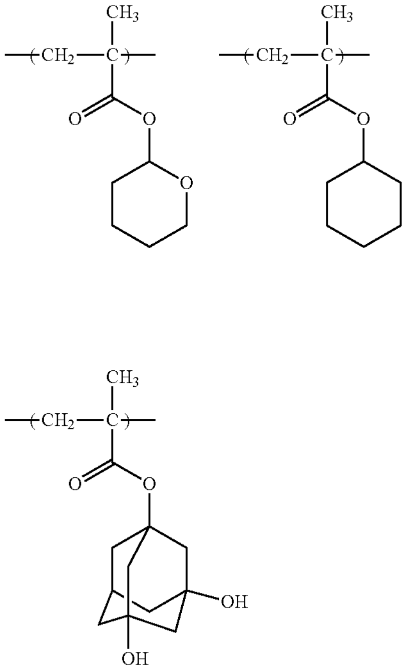
Monomer unit weight ratio
(48/42/10), Mw: 15000
B4
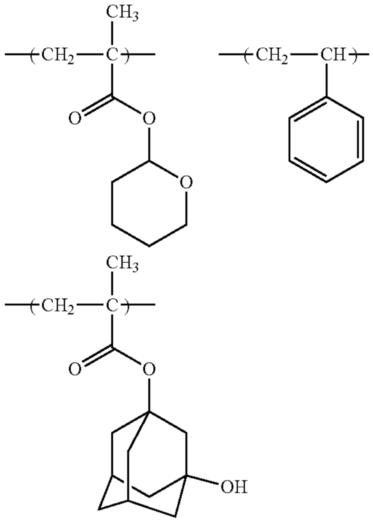
Monomer unit weight ratio
(42/43/15), Mw: 25000
-continued
B5
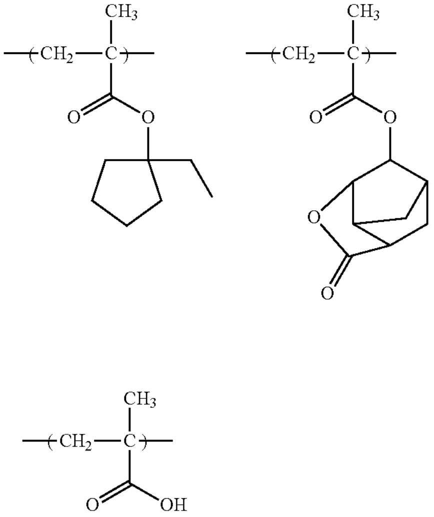
Monomer unit weight ratio
(50/40/10), Mw: 19000
B6
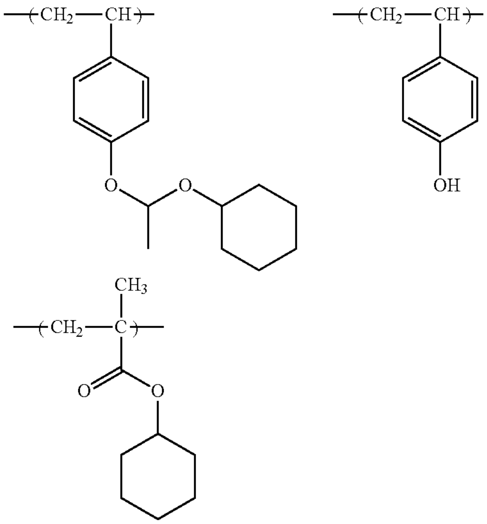
Monomer unit weight ratio
(60/20/20), Mw: 19000
B7
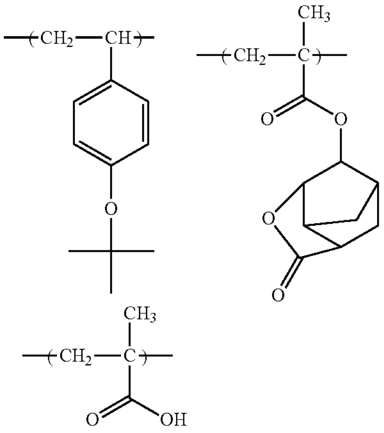
Monomer unit weight ratio
(60/30/10), Mw: 24000

-continued

B8

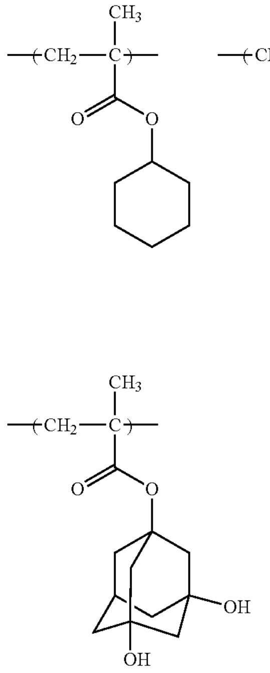

Monomer unit weight ratio (30/60/10), Mw: 10000

B9

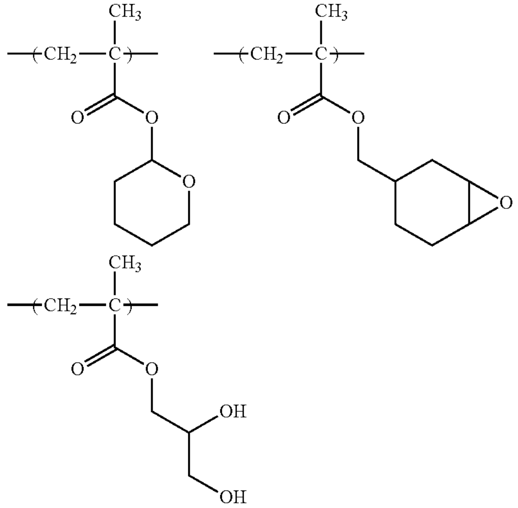

Monomer unit weight ratio (40/50/10), Mw: 11000

B10

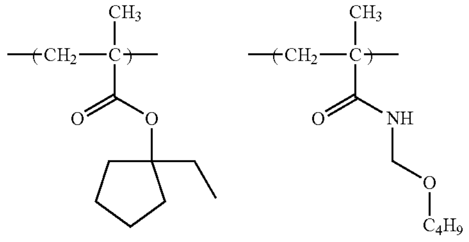

-continued

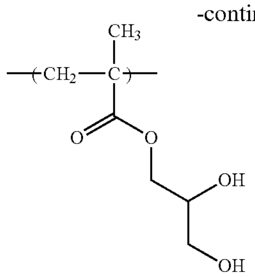

Monomer unit weight ratio (50/35/15), Mw: 11000

B11

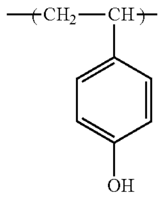

Mw: 3000

D1

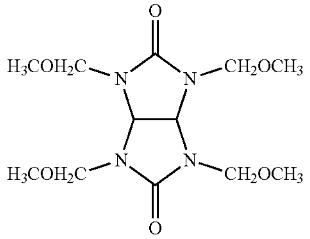

D2

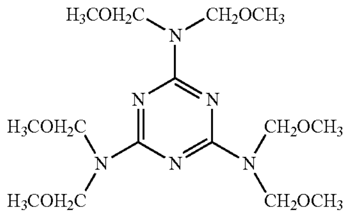

D3

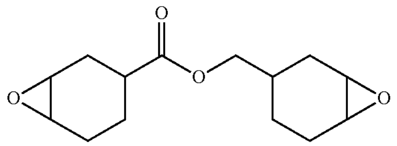

D4

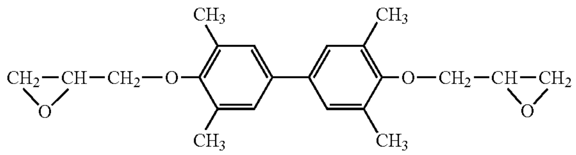

<Formation of Protective Film on Organic Semiconductor Film>

As an organic semiconductor, 10 mL of a P3HT (manufactured by Merck KGaA) chlorobenzene solution having a concentration of 20 g/L and 10 mL of a [60] PCBM (manufactured by Solenne BV) chlorobenzene solution having a concentration of 14 g/L were mixed with each other, and a 4-inch bare silicon substrate was coated with the mixture using a spin coater (1200 rpm, 30 seconds) and dried using a hot plate at 140° C. for 15 minutes, thereby forming an organic semiconductor film having a film thickness of 100 nm. A wafer obtained by forming the organic semiconductor film on the substrate was set as a wafer 1. The wafer 1 was coated with the composition for forming a protective film listed in Table 1 using a spin coater (1200 rpm, 30 seconds) and baked at 100° C. for 60 seconds, and a wafer 2 in which a protective film having a film thickness of 700 nm was provided on the organic semiconductor film was formed.

<Pattern Formation Using Photosensitive Resin Composition and Shape Evaluation>

The above-described 4-inch wafer 2 was coated with the photosensitive resin composition listed in Table 1 using a spin coater (1200 rpm, 30 seconds) and baked at 110° C. for 60 seconds, and a wafer 3 in which a resist film having a film thickness of 500 nm was formed on the wafer 2 was formed.

Next, the wafer 3 was exposed (exposure amount: 120 mJ/cm$^2$) under the optical conditions of Na of 0.57 and a of 0.60 using an i-ray projection exposure apparatus NSR2005i9C (manufactured by Nikon Corporation), and the exposure was carried out via a binary mask with a 1:1 line and space pattern having a line width of 10 μm. Thereafter, the wafer was heated at 110° C. for 60 seconds, developed with butyl acetate for 15 seconds, and spin-dried, thereby obtaining a 1:1 line and space resist pattern having a line width of 10 μm. The pattern shape of the photosensitive resin composition and residues on the substrate (non-pattern portion) were evaluated by observing the section using a scanning electron microscope.

A: An undercut was not found on the bottom portion of the photosensitive resin composition and the taper angle of the pattern was in a range of 85° to 95°.

B: An undercut with a size of 0.5 μm or less was found on the bottom portion of the photosensitive resin composition and the taper angle of the pattern was in a range of 85° to 95°.

C: An undercut with a size of 0.5 μm or less was found on the bottom portion of the photosensitive resin composition and the taper angle of the pattern was in a range of 95° to 105° (reverse taper).

D: The pattern was poorly formed or the pattern was not formed.

<Removing Protective Film and Organic Semiconductor of Non-Mask Portion by Performing Dry Etching>

A protective film 2 of a non-mask pattern portion and an organic semiconductor 1 of the non-mask pattern portion were removed by performing dry etching on the substrate under the following conditions.

Gas: $CF_4$ (flow rate: 200 mL/min), Ar (flow rate: 800 mL/min), $O_2$ (flow rate: 50 mL/min)

Source power: 800 W

Wafer bias: 600 W

Antenna bias: 100 W

ESC voltage: 400 V

Time: 60 sec

<Dissolving and Removing Remaining Protective Film Resin>

The obtained substrate was washed with water, a pattern formed of the protective film was removed, the substrate was heated at 100° C. for 10 minutes, moisture remaining on the organic semiconductor 1 was removed, and the film was dried so that the damage during the process was repaired, thereby obtaining a substrate on which the organic semiconductor film was patterned.

<Evaluation of Organic Semiconductor Film Pattern>

The line width of the organic semiconductor was evaluated by performing observation on the pattern of the organic semiconductor, after dry etching was performed and the protective film was removed, using a scanning electron microscope.

A: The line width of the organic semiconductor in the 10 μm L/S pattern of the photosensitive resin composition was in a range of 9 μm 10 μm.

B: The line width of the organic semiconductor in the 10 μm L/S pattern of the photosensitive resin composition was 8 μm to less than 9 μm.

C: The line width of the organic semiconductor in the 10 μm L/S pattern of the photosensitive resin composition was less than 8 μm.

TABLE 2

| | Evaluation of pattern shape of photosensitive composition | Residues on substrate (non-pattern portion) | Evaluation of line width after processing of organic semiconductor pattern |
|---|---|---|---|
| Example 1 | B | No residues | B |
| Example 2 | B | No residues | B |
| Example 3 | B | No residues | B |
| Example 4 | B | No residues | B |
| Example 5 | B | No residues | C |
| Example 6 | B | No residues | B |
| Example 7 | B | No residues | B |
| Example 8 | B | No residues | B |
| Example 9 | C | No residues | C |
| Example 10 | B | No residues | B |
| Example 11 | B | No residues | B |
| Example 12 | B | No residues | B |
| Example 13 | B | No residues | B |
| Example 14 | B | No residues | B |
| Example 15 | C | No residues | C |
| Example 16 | C | No residues | C |
| Example 17 | B | No residues | B |
| Example 18 | B | No residues | B |
| Example 19 | C | No residues | C |
| Example 20 | A | No residues | A |
| Example 21 | A | No residues | A |
| Example 22 | B | No residues | B |
| Example 24 | B | No residues | B |
| Example 25 | B | No residues | B |
| Example 26 | B | No residues | B |
| Comparative Example 1 | D | No residues | D |
| Comparative Example 2 | D | Residues found | D |
| Comparative Example 3 | D | No residues | D |

From the results of the table described above, it was found that the laminate of the present invention has an excellent resist pattern shape and is a technique useful for formation of a fine pattern of an organic semiconductor.

Further, in the evaluation of the line width after the organic semiconductor pattern was processed, it was confirmed that the same tendency is obtained even when the kind of dry etching gas is changed into chlorine or Ar.

A display device shown in FIG. 2 of JP2012-216501A can be easily produced by means of using the invention of the present application.

What is claimed is:

1. A laminate comprising:

an organic semiconductor film;

a protective film on the organic semiconductor film; and a resist film on the protective film, wherein the resist film is formed of a photosensitive resin composition that contains a photoacid generator (A) which generates an organic acid of which a pKa of the generated acid is −1 or less and a resin (B) which reacts with an acid generated by the photoacid generator so that the rate of dissolution in a developer containing an organic solvent is decreased.

2. The laminate according to claim 1, wherein the photoacid generator (A) includes at least one selected from sulfonic acid, trialkyl sulfonyl methide acid, and dialkyl sulfonylimide acid.

3. The laminate according to claim 1, wherein the photoacid generator (A) includes a compound having an oxime sulfonate group and/or an imide sulfonate group.

4. The laminate according to claim 1, wherein the photoacid generator (A) includes a compound having a sulfonium cation and/or an iodonium cation.

5. The laminate according to claim 1, wherein the photoacid generator (A) includes a diazodisulfone compound and/or a disulfone compound.

6. The laminate according to claim 1, wherein the protective film includes a water-soluble resin.

7. The laminate according to claim 1, wherein the polarity of the photosensitive resin composition is changed due to a generated acid that is generated by the photoacid generator (A) so that the rate of dissolution in a developer containing an organic solvent is decreased.

8. The laminate according to claim 1, wherein a cross-linking reaction occurs in the resin (B) of the photosensitive resin composition due to a generated acid that is generated by the photoacid generator (A) so that the rate of dissolution in the developer containing an organic solvent is decreased.

9. The laminate according to claim 1, wherein the photosensitive resin composition includes a sensitizing dye which spectrally sensitizes the photoacid generator (A).

* * * * *